United States Patent
Bang et al.

(10) Patent No.: US 12,069,929 B2
(45) Date of Patent: Aug. 20, 2024

(54) ELECTRONIC DEVICE COMPRISING DISPLAY PANEL

(71) Applicant: SAMSUNG DISPLAY CO., LTD., Yongin-si (KR)

(72) Inventors: Gyeongnam Bang, Seoul (KR); Deokjung Kim, Cheonan-si (KR); Eunyoung Kim, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/447,297

(22) Filed: Aug. 9, 2023

(65) Prior Publication Data

US 2023/0389390 A1 Nov. 30, 2023

Related U.S. Application Data

(63) Continuation of application No. 17/660,755, filed on Apr. 26, 2022, now Pat. No. 11,758,789.

(30) Foreign Application Priority Data

Jul. 20, 2021 (KR) .................. 10-2021-0094662

(51) Int. Cl.
 *H10K 59/40* (2023.01)
 *G06F 3/044* (2006.01)
 *H10K 59/131* (2023.01)

(52) U.S. Cl.
 CPC .......... *H10K 59/40* (2023.02); *G06F 3/0446* (2019.05); *H10K 59/131* (2023.02); *G06F 2203/04112* (2013.01)

(58) Field of Classification Search
 CPC . H01L 27/323; H01L 27/3276; G06F 3/0446; G06F 2203/04112
 See application file for complete search history.

(56) References Cited

U.S. PATENT DOCUMENTS

| | | | |
|---|---|---|---|
| 9,519,174 B2 | 12/2016 | Kim et al. | |
| 9,971,467 B2 | 5/2018 | Park et al. | |
| 10,402,026 B2 | 9/2019 | Hsu | |
| 2020/0295092 A1 | 9/2020 | Moon et al. | |
| 2022/0069027 A1* | 3/2022 | Wang | H10K 50/822 |
| 2023/0022014 A1 | 1/2023 | Bang et al. | |

FOREIGN PATENT DOCUMENTS

| | | |
|---|---|---|
| KR | 10-2018-0000040 | 1/2018 |
| KR | 10-2009880 | 8/2019 |

\* cited by examiner

*Primary Examiner* — Deeprose Subedi
(74) *Attorney, Agent, or Firm* — F. CHAU & ASSOCIATES, LLC

(57) ABSTRACT

An electronic device includes a display panel that includes a plurality of light emitting elements, and an input sensor disposed on the display panel and that includes a plurality of mesh patterns. The mesh patterns include a plurality of openings formed therein and spaced apart from each other in a first direction and a second direction that crosses the first direction. The mesh patterns include a plurality of conductive patterns spaced apart from each other in a direction that cross the first and second directions, where a center opening of the plurality of openings is disposed therebetween, and a plurality of mesh lines disposed along an edge of the center opening and connected to the conductive patterns. Each of the conductive patterns includes at least one cut-away portion opened toward one of the openings.

30 Claims, 33 Drawing Sheets

ELECTRONIC DEVICE COMPRISING DISPLAY PANEL

CROSS-REFERENCE TO RELATED APPLICATION

This U.S. non-provisional patent application is a continuation of U.S. patent application Ser. No. 17/660,755, filed on Apr. 26, 2022 in the U.S. Patent and Trademark Office, which claims priority under 35 U.S.C. § 119 from Korean Patent Application No. 10-2021-0094662, filed on Jul. 20, 2021 in the Korean Intellectual Property Office, the contents of both of which are herein incorporated by reference in their entireties.

TECHNICAL FIELD

Embodiments of the present disclosure are directed to an electronic device. More particularly, embodiments of the present disclosure are directed to an electronic device that includes an input sensor.

DISCUSSION OF THE RELATED ART

An electronic device includes an active area that is activated in response to an electrical signal. The electronic device senses an external input applied thereto through the active area and displays various images through the active area to provide a user with information. An electronic device can be provided to the user in various forms, such as a television, a mobile phone, or a tablet computer.

SUMMARY

Embodiments of the present disclosure provide an electronic device that prevents an input sensor from being viewed without increasing resistance of the input sensor.

Embodiments of the inventive concept provide an electronic device that includes a display panel that includes a plurality of light emitting elements, and an input sensor disposed on the display panel. The input sensor includes a plurality of mesh patterns. The mesh patterns include a plurality of openings formed therein and that are spaced apart from each other in a first direction and a second direction that crosses the first direction, a plurality of conductive patterns that are spaced apart from each other in a direction that crosses the first and second directions, where a center opening among the openings is disposed therebetween, and a plurality of mesh lines disposed along an edge of the center opening and connected to the conductive patterns. Each of the conductive patterns includes a cut-away portion that opens toward one of the openings.

The conductive patterns include first and second conductive patterns spaced apart from each other in a third direction that crosses the first and second directions, where the center opening is disposed therebetween, and third and fourth conductive patterns spaced apart from each other in a fourth direction substantially perpendicular to the third direction, where the center opening is disposed therebetween. The mesh lines include first mesh lines and second mesh lines. The first mesh lines extend in the first direction and connect the first conductive pattern to the third conductive pattern or connect the second conductive pattern to the fourth conductive pattern. The second mesh lines extend in the second direction and connect the first conductive pattern to the fourth conductive pattern or connect the second conductive pattern to the third conductive pattern.

Each of the first conductive pattern and the second conductive pattern includes the cut-away portion that opens toward the center opening.

At least one of the cut-away portion of the third conductive pattern or the cut-away portion of the fourth conductive pattern opens toward the center opening.

The cut-away portion of the third conductive pattern and the cut-away portion of the fourth conductive pattern open toward different openings.

The cut-away of portion of the first conductive pattern and the cut-away portion of the second conductive pattern open toward different openings.

The center opening overlaps one of the light emitting elements, and a shortest separation distance between the one light emitting element and the conductive patterns is equal to a shortest separation distance between the one light emitting element and the mesh lines when viewed in a plan view.

Each of the conductive patterns includes one cut-away portion.

At least one of the conductive patterns includes a plurality of cut-away portions that open toward different openings.

The conductive patterns include at least one first line that extends in a third direction that crosses the first and second directions and at least one second line and at least one third line that are substantially parallel to the first line and spaced apart from each other where the cut-away portion is formed therebetween in the third direction.

The openings have a same size as each other when viewed in a plan view.

The openings include two or more openings that have different sizes when viewed in a plan view.

The openings include first and second openings spaced apart from each other in the first direction where the center opening is disposed therebetween, and third and fourth openings spaced apart from each other in the second direction where the center opening is disposed therebetween. Each of the center opening, the first opening, the second opening, the third opening, and the fourth opening overlaps the light emitting elements, respectively.

A light emitting element that overlaps the center opening emits light that has a color that differs from those of light emitting elements that overlap the first to fourth openings.

A light emitting element that overlaps the first opening and a light emitting element that overlaps the second opening emit a same color light as each other.

Cut-away portions of the first to fourth conductive patterns open toward the first opening or the second opening, and a light emitting element that overlaps the center opening emits light having a wavelength shorter than a wavelength of light emitted from a light emitting element that overlaps the first opening.

The light emitting elements that overlap the third and fourth openings, respectively, emit light that has colors that differ from those of light emitted from the light emitting elements that overlap the first and second openings, respectively.

Cut-away portions of the first to fourth conductive patterns open toward the first opening or the second opening, and the center opening has a size smaller than a size of the first opening and a size of the second opening when viewed in a plan view.

Each of a size of the third opening and a size of the fourth opening is greater than the size of the first opening.

Embodiments of the inventive concept provide an electronic device that includes a display panel. The input sensor includes a plurality of mesh patterns connected to each other, a plurality of mesh openings, and a plurality of cross openings, where each of the plurality of cross openings is disposed between the mesh openings and includes a first side that extends in a first direction and a second side that extends in a second direction that crosses the first direction. Each of the cross openings is alternately arranged with the mesh openings in the first direction and the second direction, and the mesh patterns include a cut-away portion that connects at least one of the cross openings and at least one of the mesh openings.

Embodiments of the inventive concept provide an electronic device that includes a display panel that includes a plurality of light emitting elements; and an input sensor disposed on the display panel and that includes a plurality of mesh patterns. The mesh patterns include a plurality of openings formed therein and that are spaced apart from each other in a first direction and a second direction that crosses the first direction; and a plurality of conductive patterns that are spaced apart from each other in a direction crossing the first and second directions wherein a center opening of the openings is disposed therebetween. The conductive patterns include at least one first line that extends in an extending direction that crosses the first and second directions; and at least one second line and at least one third line that are substantially parallel to the first line and spaced apart from each other wherein a cut-away portion that opens toward one of the openings is formed therebetween in the extending direction.

The conductive patterns include first and second conductive patterns spaced apart from each other in a third direction that crosses the first and second directions wherein the center opening is disposed therebetween; and third and fourth conductive patterns spaced apart from each other in a fourth direction substantially perpendicular to the third direction wherein the center opening is disposed therebetween.

The mesh patterns further includes a plurality of mesh lines disposed along an edge of the center opening and connected to the conductive patterns. The mesh lines include first mesh lines that extend in the first direction and connect the first conductive pattern to the third conductive pattern or connect the second conductive pattern to the fourth conductive pattern; and second mesh lines that extend in the second direction and connect the first conductive pattern to the fourth conductive pattern or connect the second conductive pattern to the third conductive pattern.

The openings include first and second openings that are spaced apart from each other in the first direction wherein the center opening is disposed therebetween; and third and fourth openings that are spaced apart from each other in the second direction wherein the center opening is disposed therebetween, wherein each of the center opening, the first opening, the second opening, the third opening, and the fourth opening overlaps the light emitting elements, respectively.

According to the above, the input sensor can prevent the pattern of the input sensor from being viewed without increasing a resistance of the input sensor. In addition, a white angle difference according to a viewing angle is reduced.

DETAILED DESCRIPTION

Figure 1:
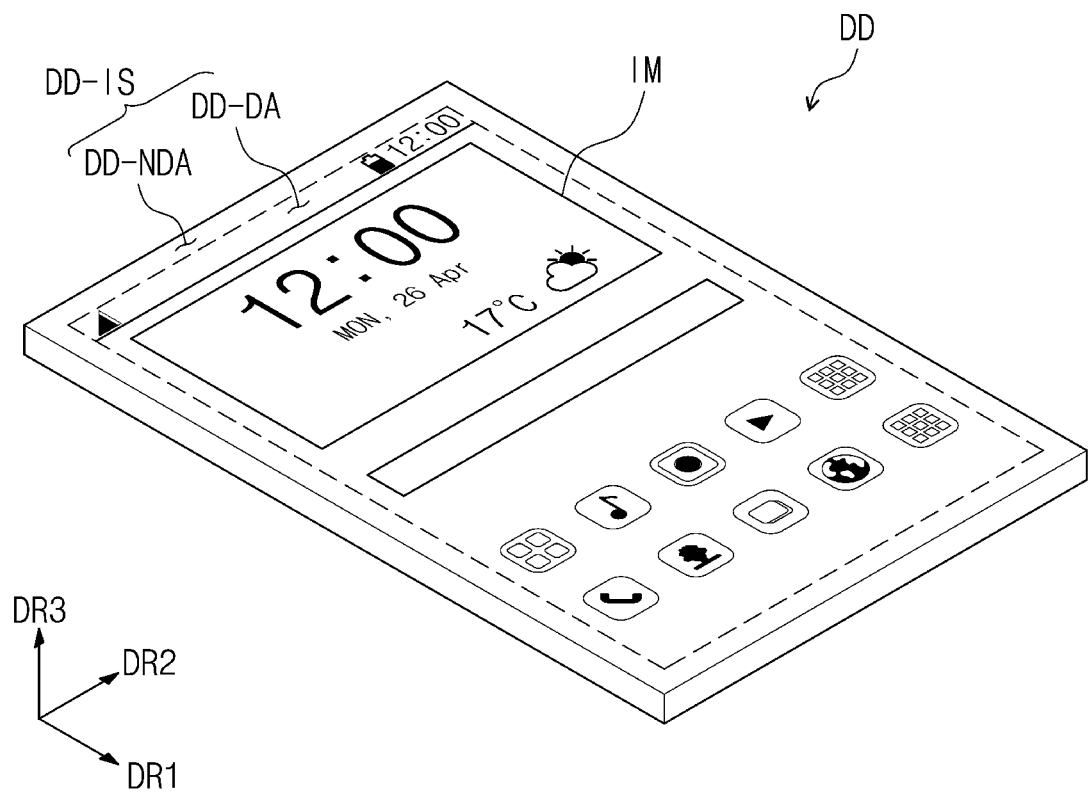
FIG. 1 is a perspective view of an electronic device according to an embodiment of the present disclosure.

Embodiments of the present disclosure may be variously modified and realized in many different forms, and thus specific embodiments will be shown in the drawings and described in detail hereinbelow. However, embodiments of the present disclosure should not be limited to the specific disclosed forms, and should be construed to include all modifications, equivalents, or replacements included in the spirit and scope of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout.

Hereinafter, embodiments of the present disclosure will be described with reference to accompanying drawings.

Figure 2A:
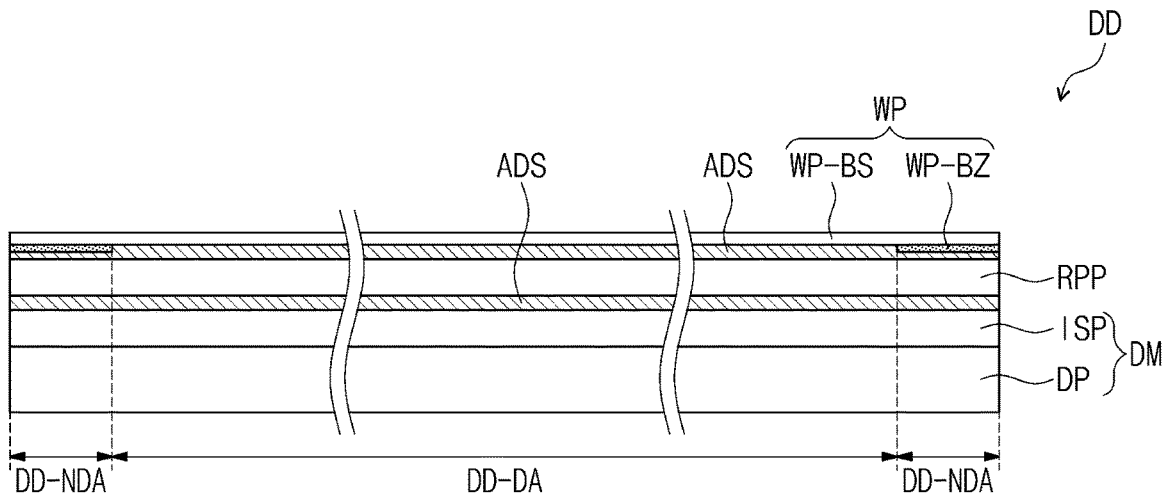
FIGS. 2A, 2B, and 2C are cross-sectional views of an electronic device according to an embodiment of the present disclosure.
Figure 2A:
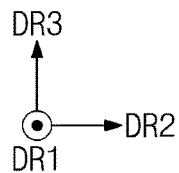
Figure 2B:
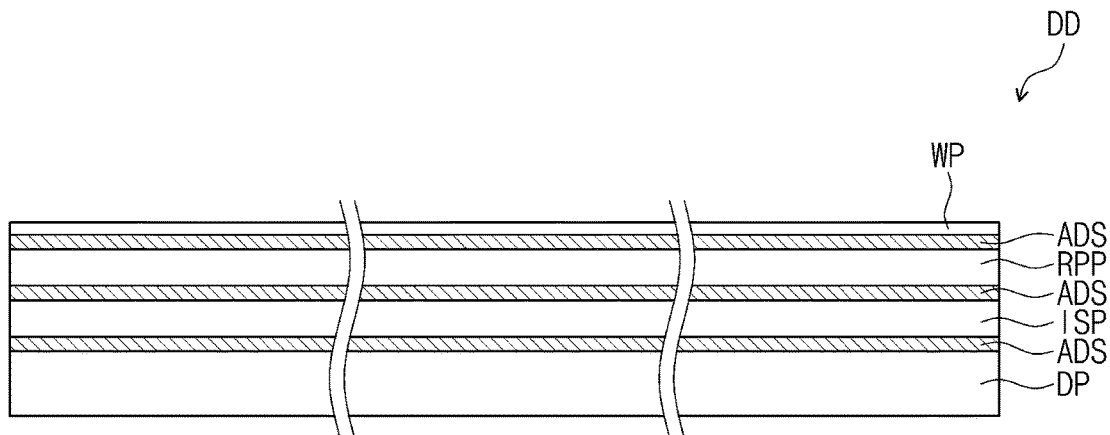
Figure 2B:
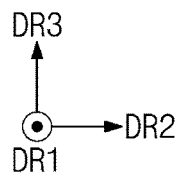
Figure 2C:
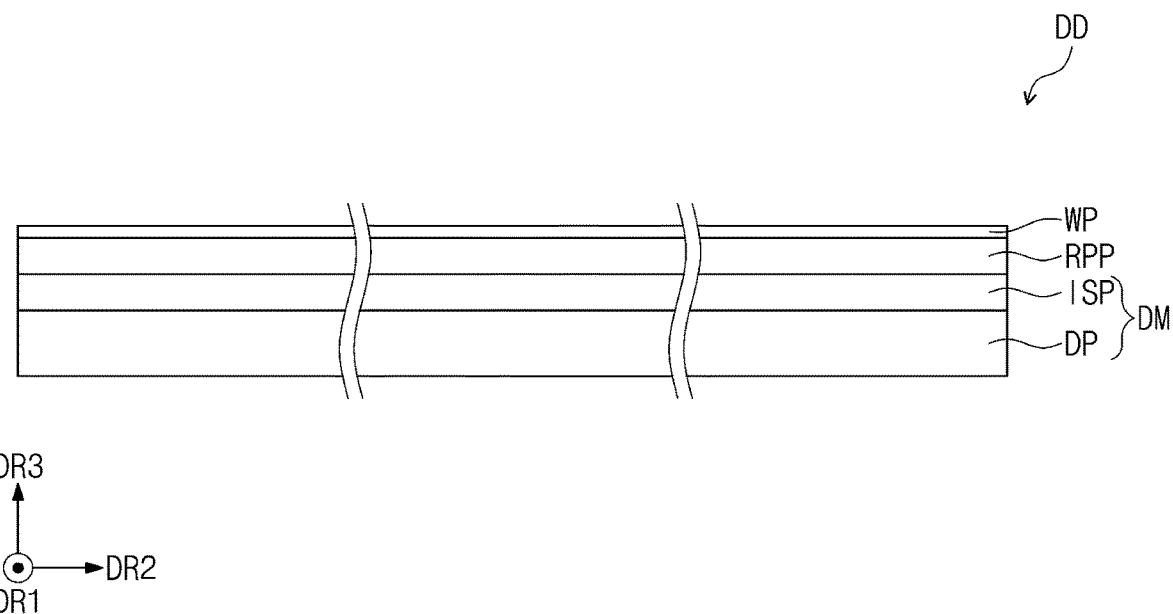

FIG. 1 is a perspective view of an electronic device DD according to an embodiment of the present disclosure. FIGS. 2A to 2C are cross-sectional views of electronic devices DD according to embodiments of the present disclosure.

According to embodiments, the electronic device DD is activated in response to electrical signals. The electronic device DD can be incorporated into various embodiments. For example, the electronic device DD can be incorporated into a large-sized electronic item, such as a television set, an outdoor billboard, etc., or a small or medium-sized electronic item, such as a mobile phone, a tablet computer, a car navigation unit, a game unit, etc. However, these are merely examples, and the electronic device DD can be incorporated into any other electronic device as long as it does not depart from concepts of the present disclosure. In a present embodiment, a mobile phone is shown as an example of the electronic device DD.

Referring to FIG. 1, according to an embodiment, the electronic device DD displays an image IM through a display surface DD-IS. The display surface DD-IS is substantially parallel to a plane defined by a first direction DR1 and a second direction DR2 that crosses the first direction DR1. In an embodiment, the second direction DR2 is perpendicular to the first direction DR1. A normal line direction of the display surface DD-IS is substantially parallel to a third direction DR3, and the third direction DR3 corresponds to a thickness direction of the electronic device DD.

In a present embodiment, front (or upper) and rear (or lower) surfaces of each member or each unit can be distinguished from each other with respect to a direction in which the image IM is displayed. However, directions indicated by the first, second, and third directions DR1, DR2, and DR3 are relative to each other and may be changed in other directions.

The electronic device DD includes a flat display surface DD-IS, however, embodiments are not limited thereto. In other embodiments, the electronic device DD includes a curved display surface or a three-dimensional display surface. A three-dimensional display surface includes a plurality of display areas that display images toward different directions from each other. For example, a three-dimensional display surface has a polygonal column-shaped display surface.

The electronic device DD is a rigid electronic device, however, embodiments are not limited thereto. In other embodiments, the electronic device DD is a flexible electronic device DD. A flexible electronic device DD may be a foldable electronic device or a bendable electronic device of which a portion thereof is bent.

The display surface DD-IS includes a transmissive area DD-DA through which the image IM is displayed and a bezel area DD-NDA through which no image IM is displayed. FIG. 1 shows application icons and a clock widget as representative examples of the image IM.

As shown in FIG. 1, in an embodiment, the transmissive area DD-DA has a substantially rectangular shape. The expression "substantially rectangular shape" refers not only to a rectangular shape as mathematically defined, but also a rectangular shape with rounded corners in which a vertex or corner area is rounded with a curved line boundary instead of a right-angled corner.

The bezel area DD-NDA is adjacent to the transmissive area DD-DA. For example, the bezel area DD-NDA surrounds the transmissive area DD-DA, however, embodiments are not limited thereto. The shape of the transmissive area DD-DA and the shape of the bezel area DD-NDA may be designed in various other ways in other embodiments. For example, in some embodiments, the bezel area DD-NDA is formed only at one side of the transmissive area DD-DA or is omitted. According to an embodiment, the bezel area DD-NDA is not exposed to the outside, depending on a combination of the display surface DD-IS and other components of the electronic device DD.

FIGS. 2A to 2C show electronic devices DD when viewed in a cross-section defined by the second direction DR2 and the third direction DR3. Referring to FIGS. 2A to 2C, in an embodiment, the electronic device DD may include a display panel DP, an input sensor ISP, an anti-reflective member RPP, and a window WP.

At least some components of the display panel DP, the input sensor ISP, the anti-reflective member RPP, and the window WP are formed through successive processes or can be attached to each other by an adhesive member ADS. FIGS. 2A to 2C schematically show various embodiments of a stack structure of components of the electronic device DD, however, these are merely examples of embodiments, and the stack structure of the components of the electronic device DD should not be limited thereto.

In embodiments of the present disclosure, when a component is formed by successive processes without using an adhesive layer or adhesive member, it can be expressed as "being directly disposed". For example, the expression "component B is disposed directly on component A" means that the component "B" is formed on a base surface provided by the component "A" through successive processes after the component "A" is formed.

The adhesive member ADS is disposed between the components of the electronic device DD to attach the components to each other. The adhesive member ADS may be a transparent adhesive, such as a pressure sensitive adhesive (PSA) film, an optically clear adhesive (OCA) film, or an optically clear resin (OCR).

Some components of the electronic device DD are formed through successive processes and other components of the electronic device DD are attached to each other by the adhesive member ADS. Referring to FIG. 2A, in an embodiment, the input sensor ISP is disposed directly on the display panel DP to form a display module DM. The anti-reflective member RPP is disposed on the display module DM with the adhesive member ADS interposed therebetween. The window WP is disposed on the anti-reflective member RPP with the adhesive member ADS interposed therebetween.

Referring to FIG. 2B, according to an embodiment, components of the electronic device DD are coupled to each other by adhesive members ADS. That is, each of the display panel DP, the input sensor ISP, the anti-reflective member RPP, and the window WP is coupled to each other by the adhesive member ADS disposed therebetween.

Referring to FIG. 2C, according to an embodiment, components of the electronic device DD are formed through successive processes. The display panel DP, the input sensor ISP, the anti-reflective member RPP, and the window WP are sequentially stacked in the third direction DR3 through successive processes. That is, the input sensor ISP is disposed directly on the display panel DP, the anti-reflective member RPP is disposed directly on the input sensor ISP, and the window WP is disposed directly on the anti-reflective member RPP.

The display panel DP according to an embodiment is a light emitting type display panel, however, embodiments are not limited thereto. For example, the display panel DP may be an organic light emitting display panel or a quantum dot light emitting display panel. A light emitting layer of an organic light emitting display panel includes an organic light emitting material. A light emitting layer of a quantum dot light emitting display panel includes a quantum dot and/or a quantum rod. Hereinafter, an organic light emitting display panel will be described as a representative example of the display panel DP.

The input sensor ISP is disposed on the display panel DP and senses an external input applied thereto. The input sensor ISP obtains coordinate information of the external input. The external input may be a user input. The user input may include a variety of types of external inputs, such as contact with a part of user's body, light, heat, pen, or pressure.

The anti-reflective member RPP is disposed on the input sensor ISP. FIGS. 2A to 2C show embodiments in which the input sensor ISP is disposed closer to the display panel DP in the third direction DR3 than the anti-reflective member RPP, however, embodiments are not limited thereto. According to an embodiment, the stack order of the input sensor ISP and the anti-reflective member RPP may be changed. For example, the anti-reflective member RPP may be disposed on the display panel DP, and the input sensor ISP may be disposed on the anti-reflective member RPP.

The anti-reflective member RPP reduces reflectance of external light incident thereto from above the window WP. The anti-reflective member RPP includes at least one of a retarder or a polarizer. The retarder may be a film type or a liquid crystal coating type and may include a λ/2 retarder and/or a λ/4 retarder. The polarizer may be a film type or a liquid crystal coating type. The film type polarizer includes a stretching type synthetic resin film, and the liquid crystal coating type polarizer includes liquid crystals arranged in a predetermined arrangement.

According to an embodiment, the anti-reflective member RPP includes color filters. The color filters are arranged by taking into account the arrangement and the colors emitted by the pixels in the display panel DP. The anti-reflective member RPP may further include a black matrix disposed adjacent to and in between the color filters.

According to an embodiment, the anti-reflective member RPP includes a destructive interference structure. For example, the destructive interference structure includes a first reflection layer and a second reflection layer that are disposed on different layers from each other. A first reflection light and a second reflection light that are reflected by the first reflection layer and the second reflection layer, respectively, destructively interfere with each other, and thus, the reflectance of the external light is reduced.

The window WP forms an exterior of the electronic device DD. The window WP transmits images received from the display panel DP, and a user can view the images through the window WP. The window WP protects inner components of the electronic device DD from external impacts. For example, the window WP protects the display panel DP, the input sensor ISP, and the anti-reflective member RPP that are disposed thereunder.

Referring to FIG. 2A, in an embodiment, the window WP includes a base layer WP-BS and a light blocking pattern WP-BZ. On the other hand, in FIGS. 2B and 2C, the window WP is schematically shown without distinguishing the base layer WP-BS from the light blocking pattern WP-BZ.

The base layer WP-BS includes an optically transparent material. The base layer WP-BS includes at least one of a glass substrate or a synthetic resin film. The base layer WP-BS may have a single-layer or a multi-layer structure.

For example, a multi-layer base layer WP-BS includes two or more synthetic resin films coupled to each other by adhesive members.

The light blocking pattern WP-BZ is disposed on a surface of the base layer WP-BS. The light blocking pattern WP-BZ overlaps a portion of the base layer WP-BS. An area in which the light blocking pattern WP-BZ is disposed corresponds to the bezel area DD-NDA of the electronic device DD. An area in which the light blocking pattern WP-BZ is not disposed corresponds to the transmissive area DD-DA of the electronic device DD.

The light blocking pattern WP-BZ may have a single-layer or multi-layer structure. A multi-layer light blocking pattern WP-BZ includes a chromatic color layer and an achromatic color light blocking layer, in particular, a black light blocking layer. The chromatic color layer and the achromatic color light blocking layer are formed on the base layer WP-BS through a depositing, printing, or coating process.

In addition, the window WP further includes a functional coating layer disposed on a front surface of the base layer WP-BS. The functional coating layer includes at least one of an anti-fingerprint layer, an anti-reflective layer, or a hard coating layer.

Figure 3:
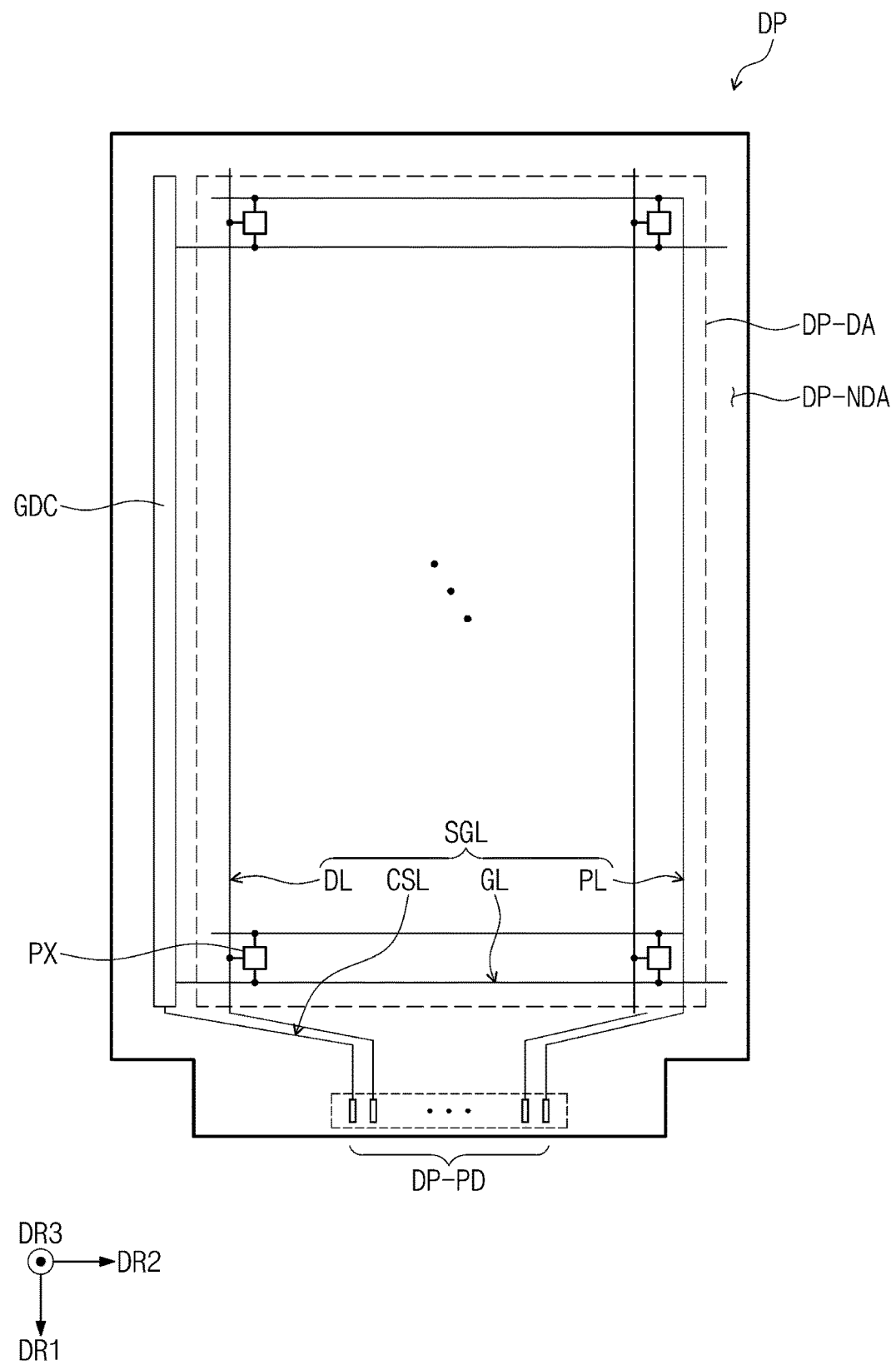
FIG. 3 is a plan view of a display panel according to an embodiment of the present disclosure.
Figure 4A:
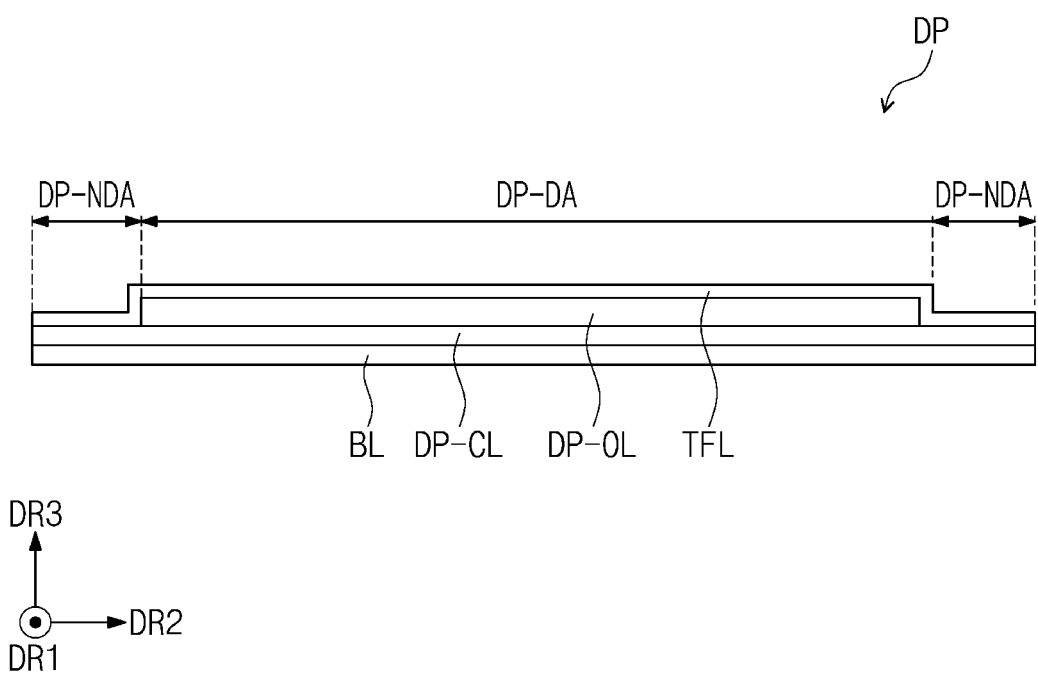
FIGS. 4A and 4B are cross-sectional views of a display panel according to an embodiment of the present disclosure.
Figure 4B:
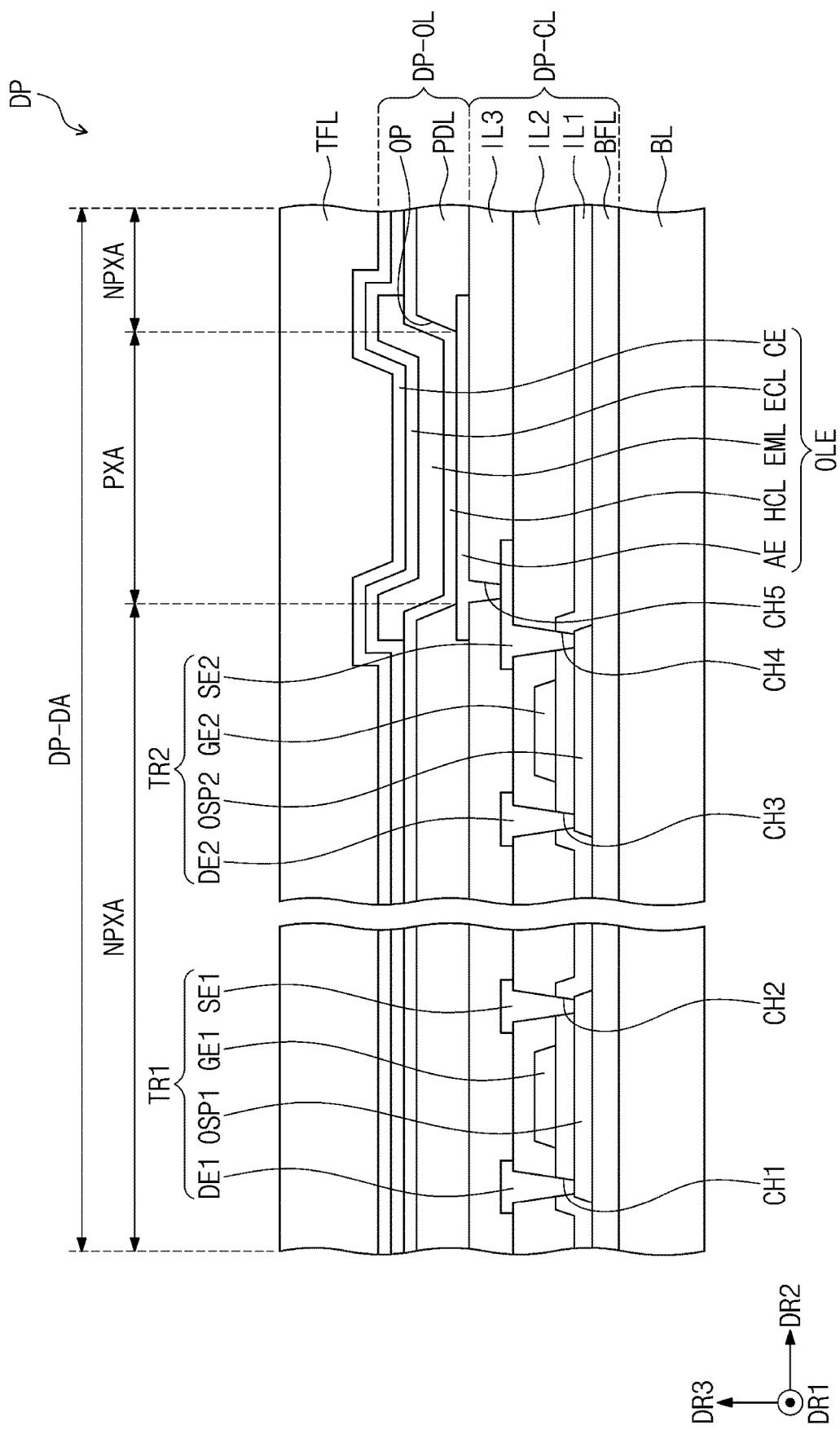
Figure 5:
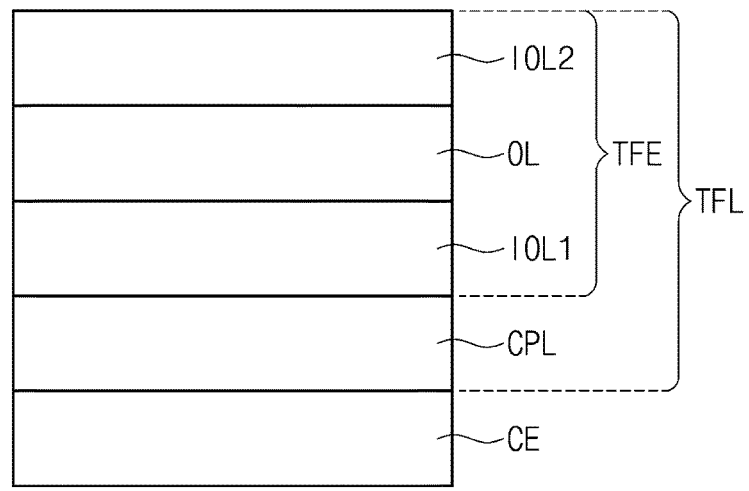
FIG. 5 is an enlarged cross-sectional view of an upper insulating layer according to an embodiment of the present disclosure.

FIG. 3 is a plan view of the display panel DP according to an embodiment of the present disclosure. FIGS. 4A and 4B are cross-sectional views of the display panel DP according to an embodiment of the present disclosure. FIG. 5 is an enlarged cross-sectional view of an upper insulating layer TFL according to an embodiment of the present disclosure.

Referring to FIG. 3, in an embodiment, the display panel DP includes a display area DP-DA and a non-display area DP-NDA. The display area DP-DA corresponds to the transmissive area DD-DA of FIG. 1, and the non-display area DP-NDA corresponds to the bezel area DD-NDA of FIG. 1. In the following descriptions, the expression "an area/portion corresponds to another area/portion" means that "an area/portion overlaps another area/portion", but the expression should not be limited to "an area/portion has the same area and/or the same shape as another area/portion".

The display panel DP includes a driving circuit GDC, signal lines SGL, signal pads DP-PD, and pixels PX.

The pixels PX are disposed in the display area DP-DA. Each of the pixels PX includes a light emitting element and a plurality of transistors, e.g., a switching transistor, a driving transistor, etc., that are connected to the light emitting element. The pixels PX emit a light in response to an electrical signal applied thereto.

The signal lines SGL include scan lines GL, data lines DL, a power line PL, and a control signal line CSL. Each of the scan lines GL is connected to a corresponding one of the pixels PX. Each of the data lines DL is connected to a corresponding one of the pixels PX. The power line PL is connected to the pixels PX and transmits a power source voltage to the pixels PX. The control signal line CSL transmits control signals to a scan driving circuit.

The driving circuit GDC is disposed in the non-display area DP-NDA. The driving circuit GDC includes the scan driving circuit. The scan driving circuit generates scan signals and sequentially outputs the scan signals to the scan lines GL. The scan driving circuit further outputs another control signal to the driving circuit of the pixels PX.

The scan driving circuit includes a plurality of thin film transistors that are formed through a same process as the driving circuit of the pixels PX, for example, a low temperature polycrystalline silicon (LTPS) process or a low temperature polycrystalline oxide (LTPO) process.

The signal pads DP-PD are disposed in the non-display area DP-NDA. The signal pads DP-PD are electrically connected to the signal lines SGL, such as the data lines DL and the power line PL. The signal pads DP-PD are integrally formed with the signal lines SGL, however, embodiments are not limited thereto. According to an embodiment, the signal pads DP-PD are disposed on a different layer from that on which the signal lines SGL are disposed and are connected to ends of the signal lines SGL via contact holes formed through an insulating layer.

FIG. 4A schematically shows a cross-section of the display panel DP. Referring to FIG. 4A, in an embodiment, the display panel DP includes a base substrate BL, a circuit element layer DP-CL, a display element layer DP-OL, and an upper insulating layer TFL.

The base substrate BL includes at least one of a glass substrate, a metal substrate, or an organic/inorganic composite material substrate. The base substrate BL may include at least one synthetic resin film.

The circuit element layer DP-CL is disposed on the base substrate BL. The circuit element layer DP-CL includes at least one insulating layer and a circuit element. The driving circuit GDC, the signal lines SGL, and the signal pads DP-PD of FIG. 3 are included in the circuit element layer DP-CL.

The display element layer DP-OL is disposed on the circuit element layer DP-CL. The display element layer DP-OL includes a plurality of light emitting elements that overlap the display area DP-DA. The display element layer DP-OL further includes an organic layer such as a pixel definition layer.

The upper insulating layer TFL includes a plurality of thin films. Some thin films improve an optical efficiency of the light emitting elements, and some thin films protect the light emitting elements.

FIG. 4B shows a cross-section that corresponds to first and second transistors TR1 and TR2 and one light emitting element OLE of the display panel DP. Details of the components of the display panel DP described above also apply to components of the display panel DP shown in FIG. 4B.

The circuit element layer DP-CL is formed by coating and deposition processes that form an insulating layer, a semiconductor layer, and a conductive layer, and a photolithography process that patterns the insulating layer, the semiconductor layer, and the conductive layer. According to an embodiment, the circuit element layer DP-CL includes a buffer layer BFL, first, second, and third insulating layers IL1, IL2, and IL3 and a plurality of transistors TR1 and TR2.

The buffer layer BFL and the first to third insulating layers IL1 to IL3 include at least one of an organic layer and an inorganic layer. For example, each of the buffer layer BFL, the first insulating layer IL1 and the second insulating layer IL2 includes at least one inorganic layer, and the third insulating layer IL3 includes the organic layer, however, embodiments of the present disclosure are not limited thereto.

FIG. 4B shows an arrangement relationship of a first semiconductor pattern OSP1, a first control electrode GE1, a first input electrode DE1, and a first output electrode SE1, that form the first transistor TR1, and a second semiconductor pattern OSP2, a second control electrode GE2, a second input electrode DE2, and a second output electrode SE2, that form the second transistor TR2, as a representative example.

The first semiconductor pattern OSP1 and the second semiconductor pattern OSP2 are disposed on the buffer layer BFL. The buffer layer BFL increases a coupling force between the base substrate BL and the first semiconductor pattern OSP1 and between the base substrate BL and the second semiconductor pattern OSP2.

The first insulating layer IL1 is disposed on the buffer layer BFL and the first semiconductor pattern OSP1 and the second semiconductor pattern OSP2. The first control electrode GE1 and the second control electrode GE2 are disposed on the first insulating layer IL1. The first control electrode GE1 and the second control electrode GE2 overlap a portion of the first semiconductor pattern OSP1 and a portion of the second semiconductor pattern OSP2, respectively.

The second insulating layer IL2 is disposed on first insulating layer IL1 and the first control electrode GE1 and the second control electrode GE2. The first input electrode DE1 and the first output electrode SE1 are disposed on the second insulating layer IL2 and are connected to the first semiconductor pattern OSP1 respectively through first and second through holes CH1 and CH2 formed through the first and second insulating layers IL1 and IL2. The second input electrode DE2 and the second output electrode SE2 are disposed on the second insulating layer IL2 and are connected to the second semiconductor pattern OSP2 respectively through third and fourth through holes CH3 and CH4 formed through the first and second insulating layers IL1 and IL2.

The third insulating layer IL3 is disposed on second insulating layer IL2 and on the first input electrode DE1, the first output electrode SE1, the second input electrode DE2 and the second output electrode SE2.

The display element layer DP-OL is disposed on the circuit element layer DP-CL. For example, the display element layer DP-OL is disposed on an insulating layer disposed at an uppermost position of the insulating layers of the circuit element layer DP-CL, such as the third insulating layer IL3 of FIG. 4B.

The display element layer DP-OL includes the light emitting element OLE and a pixel definition layer PDL. The light emitting element OLE includes a first electrode AE, a hole control layer HCL, a light emitting layer EML, an electron control layer ECL, and a second electrode CE that are sequentially stacked.

The first electrode AE is disposed on the third insulating layer IL3 of the circuit element layer DP-CL. The first electrode AE is connected to the second output electrode SE2 of the second transistor TR2 via a fifth through hole CH5 formed through the third insulating layer IL3.

The pixel definition layer PDL is provided with a light emitting opening OP formed therethrough. The opening OP through the pixel definition layer PDL may be referred to as the "light emitting opening" to distinguish it from other openings, which will be described below. At least a portion of the first electrode AE is exposed through the light emitting opening OP of the pixel definition layer PDL.

As shown in FIG. 4B, in an embodiment, the display area DP-DA includes a light emitting area PXA and a non-light-emitting area NPXA adjacent to the light emitting area PXA. The non-light-emitting area NPXA surrounds the light emitting area PXA.

In a present embodiment, the light emitting area PXA corresponds to the portion of the first electrode AE exposed through the light emitting opening OP. When viewed in a plan view, a size of the light emitting area PXA corresponds to a size of the exposed portion of the first electrode AE. In the present disclosure, the expression "when viewed in a plan view" refers to a state of being viewed from the third direction DR3. The light emitting area PXA includes a plurality of areas separated from each other by the pixel definition layer PDL. The non-light-emitting area NPXA corresponds to the pixel definition layer PDL that surrounds the light emitting areas PXA.

The hole control layer HCL is disposed on the first electrode AE. The hole control layer HCL is commonly disposed in the light emitting area PXA and the non-light-emitting area NPXA. The hole control layer HCL includes a hole transport layer and may further include a hole injection layer.

The light emitting layer EML is disposed on the hole control layer HCL. The light emitting layer EML is disposed in an area that corresponds to the light emitting opening OP. For example, the light emitting layer EML is formed in light emitting patterns separated from each other to correspond to each of the pixels PX, however, embodiments are not limited thereto. For example, the light emitting layer EML may be commonly disposed over the pixels PX. For example, the light emitting layer EML may be commonly disposed in the light emitting area PXA and the non-light-emitting area NPXA. The light emitting layer EML includes an organic material and/or an inorganic material. The light emitting layer EML emits light having a predetermined color.

The electron control layer ECL is disposed on the light emitting layer EML. The electron control layer ECL is commonly disposed in the light emitting area PXA and the non-light-emitting area NPXA. The electron control layer ECL includes an electron transport layer and may further include an electron injection layer.

The second electrode CE is disposed on the electron control layer ECL. The second electrode CE has an integral shape and is commonly disposed over the pixels PX. For example, the second electrode CE is commonly disposed in the light emitting area PXA and the non-light-emitting area NPXA. A common voltage is transmitted to the second electrode CE.

The upper insulating layer TFL is disposed on the second electrode CE of the display element layer DP-OL. The upper insulating layer TFL includes a plurality of thin films. Referring to FIG. 5, in an embodiment, the upper insulating layer TFL includes a capping layer CPL and a thin film encapsulation layer TFE. The thin film encapsulation layer TFE includes a first inorganic layer IOL1, an organic layer OL, and a second inorganic layer IOL2.

The capping layer CPL is disposed on the second electrode CE and is in contact with the second electrode CE. The capping layer CPL includes an organic material. The capping layer CPL has a refractive index greater than that of the first inorganic layer IOL1, which is disposed on the capping layer CPL. The capping layer CPL protects the second electrode CE from the following processes, such as a sputtering process.

The capping layer CPL increases a light emitting efficiency of the light emitting element OLE. The capping layer CPL further includes an inorganic layer that increases the light emitting efficiency of the light emitting element OLE. For example, the inorganic layer of the capping layer CPL is disposed under the first inorganic layer IOL1 and includes LiF.

The first inorganic layer IOL1 is disposed on the capping layer CPL. The first inorganic layer IOL1 is in contact with the capping layer CPL. The organic layer OL is disposed on the first inorganic layer IOL1 and is in contact with the first inorganic layer IOL1. The second inorganic layer IOL2 is disposed on the organic layer OL and is in contact with the organic layer OL.

The first inorganic layer IOL1 and the second inorganic layer IOL2 protect the display element layer DP-OL from moisture and/or oxygen, and the organic layer OL protects the display element layer DP-OL from foreign substances, such as dust particles. The first inorganic layer IOL1 and the second inorganic layer IOL2 each include at least one of a titanium oxide layer, an aluminum oxide layer, a silicon nitride layer, a silicon oxynitride layer, or a silicon oxide layer, however, the first and second inorganic layers IOL1 and IOL2 are not limited thereto. The organic layer OL includes an acrylic-based organic layer, however, embodiments are not limited thereto.

Figure 6:
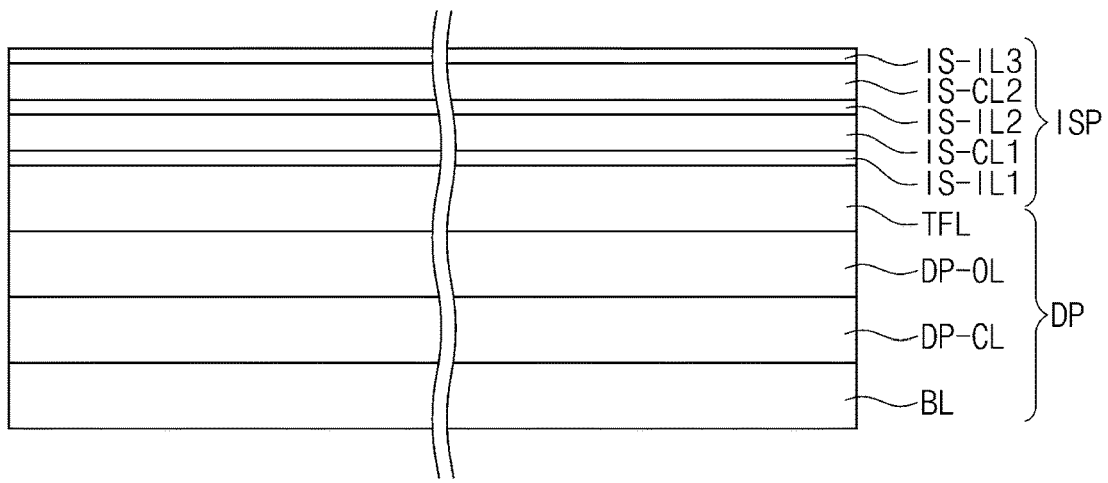
FIG. 6 is a cross-sectional view of a display module according to an embodiment of the present disclosure.

FIG. 6 is a cross-sectional view of a display module according to an embodiment of the present disclosure. The display module include a display panel DP and an input sensor ISP. Details of the display panel DP described above also apply to the display panel DP of FIG. 6, and descriptions will be focused on the input sensor ISP.

In an embodiment, the input sensor ISP includes a first insulating layer IS-IL1, a first conductive layer IS-CL1, a second insulating layer IS-IL2, a second conductive layer IS-CL2, and a third insulating layer IS-IL3, that are sequentially stacked. The first insulating layer IS-IL1 of the input sensor ISP is disposed directly on the upper insulating layer TFL. However, according to an embodiment, the first insulating layer IS-IL1 of the input sensor ISP is omitted.

Each of the first conductive layer IS-CL1 and the second conductive layer IS-CL2 may have a single-layer structure or a multi-layer structure. A multi-layered conductive layer includes two or more layers of a transparent conductive layer and/or a metal layer. The multi-layered conductive layer includes metal layers that contain different metals from each other.

The first and second conductive layers IS-CL1 and IS-CL2 include at least one of indium tin oxide (ITO), indium zinc oxide (IZO), zinc oxide (ZnO), indium tin zinc oxide (ITZO), PEDOT, metal nanowire, or graphene as the transparent conductive layer. The first and second conductive layers IS-CL1 and IS-CL2 include molybdenum, silver, titanium, copper, aluminum, or alloys thereof as the metal layer. For example, each of the first and second conductive layers IS-CL1 and IS-CL2 has a three-layer structure of titanium/aluminum/titanium. Durable metals with a low reflectance can be used as an outer layer of the conductive layer, and electrically conductive metals can be used as an inner layer of the conductive layer.

The first conductive layer IS-CL1 and the second conductive layer IS-CL2 include sensing patterns. The sensing patterns include components of sensing electrodes and signal lines that are connected to the components of the sensing electrodes. Hereinafter, the first conductive layer IS-CL1 will be described as including first sensing patterns, and the second conductive layer IS-CL2 will be described as including second sensing patterns.

Each of the first, second, and third insulating layers IS-IL1, IS-IL2, and IS-IL3 includes an inorganic layer or an organic layer. According to an embodiment, each of the first and second insulating layers IS-IL1 and IS-IL2 includes the inorganic layer. The inorganic layer includes at least one of aluminum oxide, titanium oxide, silicon oxide, silicon oxynitride, zirconium oxide, or hafnium oxide. According to an embodiment, the third insulating layer IS-IL3 includes the organic layer. The organic layer includes at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

The second insulating layer IS-IL2 covers a sensing area IS-DA described below with reference to FIG. 7A. For example, the second insulating layer IS-IL2 entirely overlaps the sensing area IS-DA. The second insulating layer IS-IL2 includes a plurality of insulating patterns. The insulating patterns insulate first electrode groups EG1 from second electrode groups EG2 of FIG. 7A.

Figure 7A:
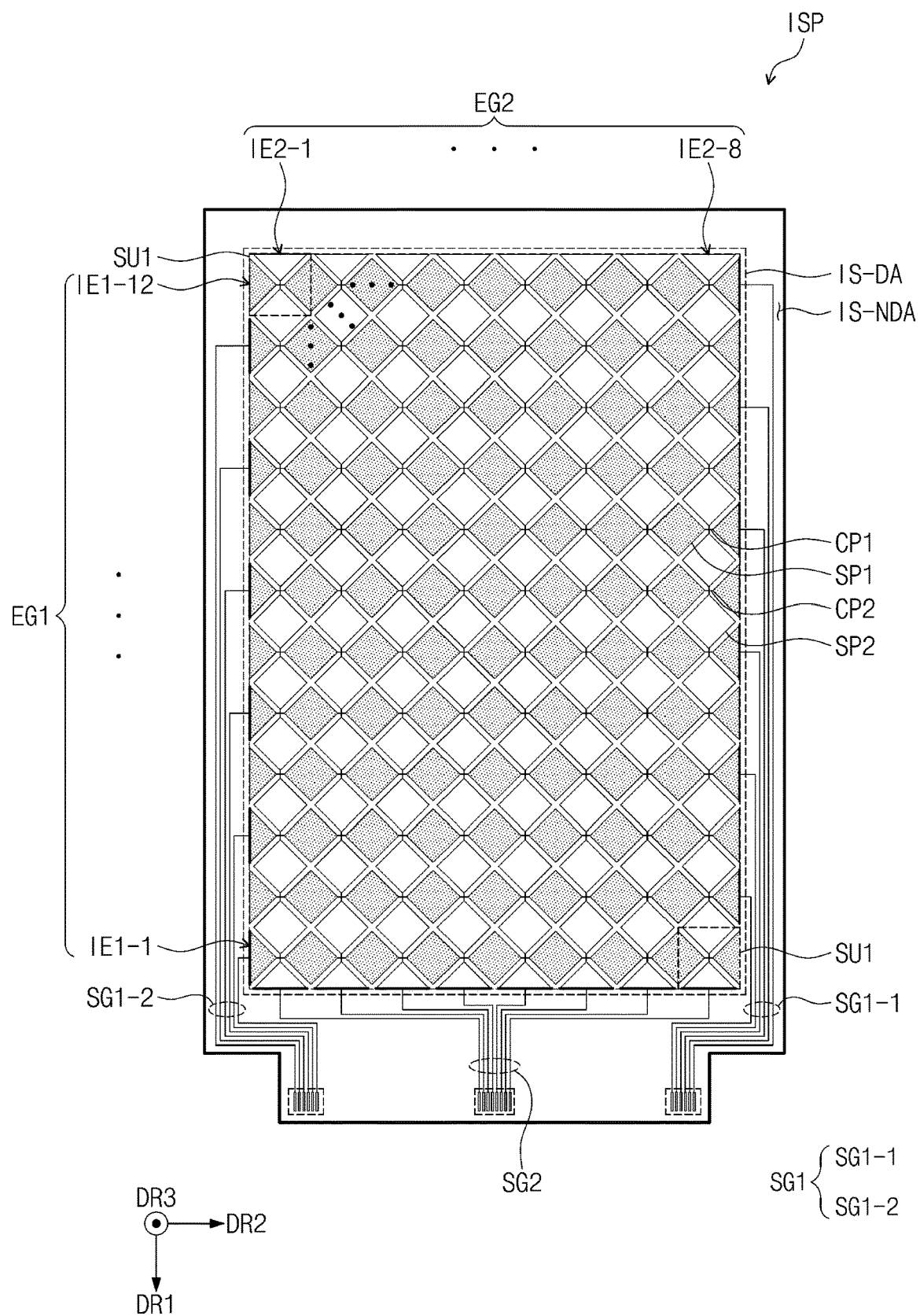
FIGS. 7A and 7B are plan views of an input sensor according to an embodiment of the present disclosure.
Figure 7B:
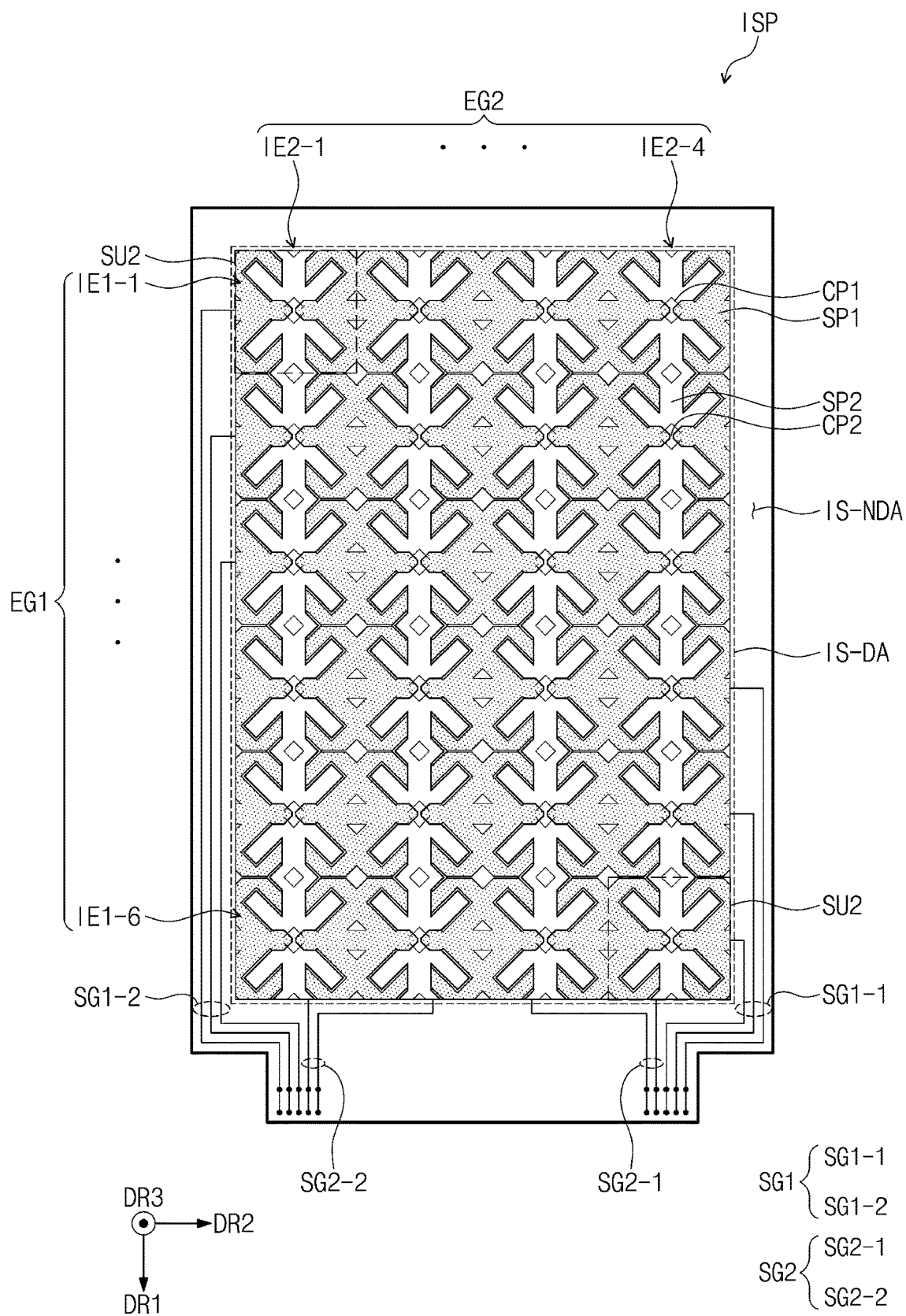

FIGS. 7A and 7B are plan views of the input sensor ISP according to an embodiment of the present disclosure. The input sensor ISP includes the electrode groups EG1 and EG2, and the first and second electrode groups EG1 and EG2 may have various shapes. FIGS. 7A and 7B show the first and second electrode groups EG1 and EG2 with different shapes.

Referring to FIG. 7A, in an embodiment, the input sensor ISP includes the first electrode group EG1, the second electrode group EG2, and signal line groups SG1 and SG2 connected to the first and second electrode groups EG1 and EG2, respectively. In a present embodiment, the input sensor ISP that includes two signal line groups SG1 and SG2 is shown as a representative example, but embodiments are not limited thereto.

The input sensor ISP includes the sensing area IS-DA and a line area IS-NDA, which respectively correspond to the display area DP-DA and the non-display area DP-NDA of the display panel DP. The first electrode group EG1 and the second electrode group EG2 are disposed in the sensing area IS-DA. The first signal line group SG1 and the second signal line group SG2 are disposed in the line area IS-NDA.

In a present embodiment, the input sensor ISP may be, but is not limited to, a capacitive type touch sensor. The input sensor ISP obtains information about an external input based on a capacitance variation between the first electrode group EG1 and the second electrode group EG2.

One of the first electrode group EG1 and the second electrode group EG2 receives a driving signal, and the other of the first electrode group EG1 and the second electrode group EG2 outputs the capacitance variation between the first electrode group EG1 and the second electrode group EG2 as a sensing signal. According to an embodiment, a driving period is divided into first and second driving periods, the input sensor ISP is driven in the above-described manner during the first driving period, and the input sensor ISP is driven in manner opposite to the above-described manner during the second driving period.

The first electrode group EG1 includes a plurality of first sensing electrodes IE1-1 to IE1-12. FIG. 7A shows the first electrode group EG1 as including twelve first sensing electrodes IE1-1 to IE1-12 as a representative example, but embodiments are not limited to that number of first sensing electrodes. Each of the first sensing electrodes IE1-1 to IE1-12 extends in the second direction DR2. The first sensing electrodes IE1-1 to IE1-12 are spaced apart in the first direction DR1.

The second electrode group EG2 includes a plurality of second sensing electrodes IE2-1 to IE2-8. FIG. 7A shows the second electrode group EG2 as including eight second sensing electrodes IE2-1 to IE2-8 as a representative example, but embodiments are not limited to that number of second sensing electrodes. Each of the second sensing electrodes IE2-1 to IE2-8 extends in the first direction DR1. The second sensing electrodes IE2-1 to IE2-8 are spaced apart in the second direction DR2.

The first sensing electrodes IE1-1 to IE1-12 and the second sensing electrodes IE2-1 to IE2-8 have a length and area that are determined by an arrangement of the sensing electrodes and a size of the sensing area IS-DA.

The first signal line group SG1 includes the same number of first signal lines as the number of the first sensing electrodes IE1-1 to IE1-12. The signal lines of the first signal line group SG1 are connected to one end of each of the first sensing electrodes IE1-1 to IE1-12, however, embodiments are not limited thereto. According to an embodiment, the signal lines of the first signal line group SG1 are connected to both ends of the first sensing electrodes IE1-1 to IE1-12.

The second signal line group SG2 includes the same number of second signal lines as the number of the second sensing electrodes IE2-1 to IE2-8. The signal lines of the second signal line group SG2 are connected to one end of each of the second sensing electrodes IE2-1 to IE2-8, however, embodiments are not limited thereto. According to an embodiment, the signal lines of the second signal line group SG2 are connected to both ends of the second sensing electrodes IE2-1 to IE2-8. Referring to FIG. 7A, the signal lines of the second signal line group SG2 are respectively connected to lower ends of the second sensing electrodes IE2-1 to IE2-8.

The first signal line group SG1 is divided into two groups. One of the two groups is a disposed at one side of the input sensor ISP, hereinafter, referred to as a first side first signal line group SG1-1, and the other of the two groups is disposed at the other side of the input sensor ISP, hereinafter, referred to as a second side first signal line group SG1-2.

The first side first signal line group SG1-1 is connected to right sides of some of the first sensing electrodes IE1-1 to IE1-12, and the second side first signal line group SG1-2 are connected to left sides of the other sensing electrodes IE1-1 to IE1-12. The first side first signal line group SG1-1 and the second side first signal line group SG1-2 are spaced apart from each other in the second direction DR2 with the sensing area IS-DA interposed therebetween. As the first signal lines are divided into two groups that are disposed at opposite sides, a width of the line area IS-NDA can be reduced.

The first side first signal line group SG1-1 is electrically connected to odd-numbered sensing electrodes or even-numbered sensing electrodes of the first sensing electrodes IE1-1 to IE1-12. The second side first signal line group SG1-2 is connected to those first sensing electrodes that are not connected to the first side first signal line group SG1-1. FIG. 7A shows the first side first signal line group SG1-1 as being connected to the odd-numbered first sensing electrodes and the second side first signal line group SG1-2 as being connected to the even-numbered first sensing electrodes as a representative example.

However, embodiments of the present disclosure are not limited thereto, and in other embodiment, all the first signal lines of the first signal line group SG1 are connected to the first sensing electrodes IE1-1 to IE1-12 in the same direction. For example, all the first signal lines are connected to left or right ends of the first sensing electrodes IE1-1 to IE1-12.

Each of the first sensing electrodes IE1-1 to IE1-12 includes first sensor portions SP1 and first connection portions CP1. The first sensor portions SP1 are arranged in the second direction DR2. Each of the first connection portions CP1 connects two adjacent first sensor portions SP1.

Each of the second sensing electrodes IE2-1 to IE2-8 includes second sensor portions SP2 and second connection portions CP2. The second sensor portions SP2 are arranged in the first direction DR1. Each of the second connection portions CP2 connects two adjacent second sensor portions SP2.

The first and second connection portions CP1 and CP2 cross each other when viewed in a plan view, however, embodiment are not limited thereto. According to an embodiment, each of the first connection portions CP1 has a turned V shape, such as a ∧ shape, or a V shape, when viewed in a plan view such that the first connection portions CP1 do not overlap the second connection portions CP2. The turned V shaped or the V shaped first connection portions CP1 overlap the second sensor portions SP2 when viewed in a plan view.

Referring to FIG. 7A, in an embodiment, the sensing area IS-DA includes sensing units SU1. The sensing units SU1 have substantially the same size as each other. According to an embodiment, each of the sensing units SU1 includes a half of one first sensor portion SP1 and a half of another first sensor portion SP1 that are disposed with a first connection portion CP1 interposed therebetween, and a half of one second sensor portion SP2 and a half of another second sensor portion SP2 that are disposed with a second connection portion CP2 interposed therebetween.

Each of the sensing units SU1 includes a corresponding crossing area of the first sensing electrodes IE1-1 to IE1-12 and the second sensing electrodes IE2-1 to IE2-8. In this case, the crossing area is an area in which a bridge pattern is disposed. The bridge pattern electrically connects the sensing electrodes that are disposed on the same layer and are spaced apart from each other. According to an embodiment, the first connection portions CP1 correspond to the bridge pattern, however, embodiments are not limited thereto. According to an embodiment, the second connection portions CP2 correspond to the bridge pattern.

Referring to FIG. 7B, in an embodiment, the input sensor ISP includes first and second electrode groups EG1 and EG2 that have different shapes from those of the first and second electrode groups EG1 and EG2 of FIG. 7A. The input sensor ISP of FIG. 7B includes substantially the same configurations as those of the input sensor ISP of FIG. 7A, and hereinafter, different features will be mainly described.

FIG. 7B shows the first electrode group EG1 as including six first sensing electrodes IE1-1 to IE1-6 and the second electrode group EG2 as including four second sensing electrodes IE2-1 to IE2-4.

The first sensing electrodes IE1-1 to IE1-6 extend in the second direction DR2 and are spaced apart in the first direction DR1. The second sensing electrodes IE2-1 to IE2-4 extend in the first direction DR1 and are spaced apart in the second direction DR2. The first sensing electrodes IE1-1 to IE1-6 surround the second sensing electrodes IE2-1 to IE2-4.

The first signal line group SG1 includes the same number of first signal lines as the number of the first sensing electrodes IE1-1 to IE1-6. The first signal lines are connected to one end of each of the first sensing electrodes IE1-1 to IE1-6 as shown in FIG. 7B, however, embodiments are should not limited thereto. In an embodiment, the first signal lines are connected to both ends of each of the first sensing electrodes IE1-1 to IE1-6.

The second signal line group SG2 includes the same number of second signal lines as the number of the second sensing electrodes IE2-1 to IE2-4. The second signal lines are connected to one end of each of the second sensing electrodes IE2-1 to IE2-4 as shown in FIG. 7B, however, embodiments are should not limited thereto. In an embodiment, the second signal lines are connected to both ends of each of the second sensing electrodes IE2-1 to IE2-4

The first signal line group SG1 is divided into two groups. One group is a first side first signal line group SG1-1, and the other group is a second side first signal line group SG1-2.

The first side first signal line group SG1-1 is connected to right sides of some of the first sensing electrodes IE1-1 to IE1-6, and the second side first signal line group SG1-2 is connected to left sides of the other first sensing electrodes IE1-1 to IE1-6. The first side first signal line group SG1-1 and the second side first signal line group SG1-2 are spaced apart from each other in the second direction DR2 with the sensing area IS-DA interposed therebetween.

The first side first signal line group SG1-1 are electrically connected to those first sensing electrodes IE1-1 to IE1-6 that are disposed closer to an upper or lower side of the input sensor ISP. The second side first signal line group SG1-2 are connected to those first sensing electrodes that are not connected to the first side first signal line group SG1-1. FIG. 7B shows the first side first signal line group SG1-1 as connected to three of the first sensing electrodes IEE-1 to IE1-6 that are disposed closest to the lower side.

The second signal line group SG2 is divided into two groups. One second signal line group SG2-1 is disposed adjacent to the first side first signal line group SG1-1, and the other second signal line group SG2-2 is disposed adjacent to the second side first signal line group SG1-2. The two second signal line groups SG2-1 and SG2-2 are spaced apart from each other in the second direction DR2 with the line area IS-NDA interposed therebetween.

However, the arrangement of the first and second signal line groups SG1 and SG2 is not limited to those shown in FIGS. 7A and 7B, and in other embodiments is changed depending on a size and a shape of the line area IS-NDA.

Each of the first sensing electrodes IEE-1 to IE1-6 includes first sensor portions SP1 and first connection portions CP1. The first sensor portions SP1 are arranged in the second direction DR2. Each of the first connection portions CP1 electrically connects two adjacent first sensor portions SP1. The first connection portions CP1 of FIG. 7B correspond to a bridge pattern disposed on a different layer from that on which the first sensor portions SP1 are disposed.

Each of the second sensing electrodes IE2-1 to IE2-4 include second sensor portions SP2 and second connection portions CP2. The second sensor portions SP2 are arranged in the first direction DR1. Each of the second connection portions CP2 electrically connects two adjacent second sensor portions SP2. The second connection portions CP2 are disposed on the same layer as the second sensor portions SP2 and are integrally connected to the second sensor portions SP2. The second connection portions CP2 correspond to portions of the second sensing electrodes IE2-1 to IE2-4 that cross the first sensing electrodes IE1-1 to IE1-6.

Referring to FIG. 7B, in an embodiment, the sensing area IS-DA is divided into sensing units SU2 that have the same area as each other. Each of the sensing units SU2 of FIG. 7B includes a half of one first sensor portion SP1 and a half of another first sensor portion SP1 that are disposed with a first connection portion CP1 interposed therebetween, and a half of one second sensor portion SP2 and a half of another second sensor portion SP2 that are disposed with a second connection portion CP2 interposed therebetween.

Each of the sensing units SU2 includes a corresponding crossing area of the first sensing electrodes IE1-1 to IE1-6 and the second sensing electrodes IE2-1 to IE2-4. For example, the sensing units SU2 are repeatedly arranged with respect to the first connection portions CP1 that form the bridge pattern in the sensing area IS-DA.

Although FIG. 7B shows the sensing units SU2 as having the same shape, embodiments are not limited thereto. For example, in other embodiments, the input sensor ISP may include two or more sensing units that have different sizes from each other, or may include two or more sensing units having different numbers of floating patterns from each other.

Each of the first sensing electrodes IE1-1 to IE1-12 and the second sensing electrodes IE2-1 to IE2-8 of FIG. 7A, or each of the first sensing electrodes IE1-1 to IE1-6 and the second sensing electrodes IE2-1 to IE2-4 of FIG. 7B includes mesh patterns. The mesh patterns are formed by lines for the sensing electrode, and the lines of the mesh patterns are connected to each other and cross each other to form openings. In this regard, it will be described below in detail based on an embodiment shown in FIG. 7B.

Although the mesh patterns will be described based on an embodiment shown in FIG. 7B, embodiments are not limited thereto. The descriptions of the mesh patterns also apply to an embodiment shown in FIG. 7A. In addition, the mesh patterns are not limited to the above-described sensing electrode and also apply to sensing electrodes that have a variety of shapes.

Figure 8:
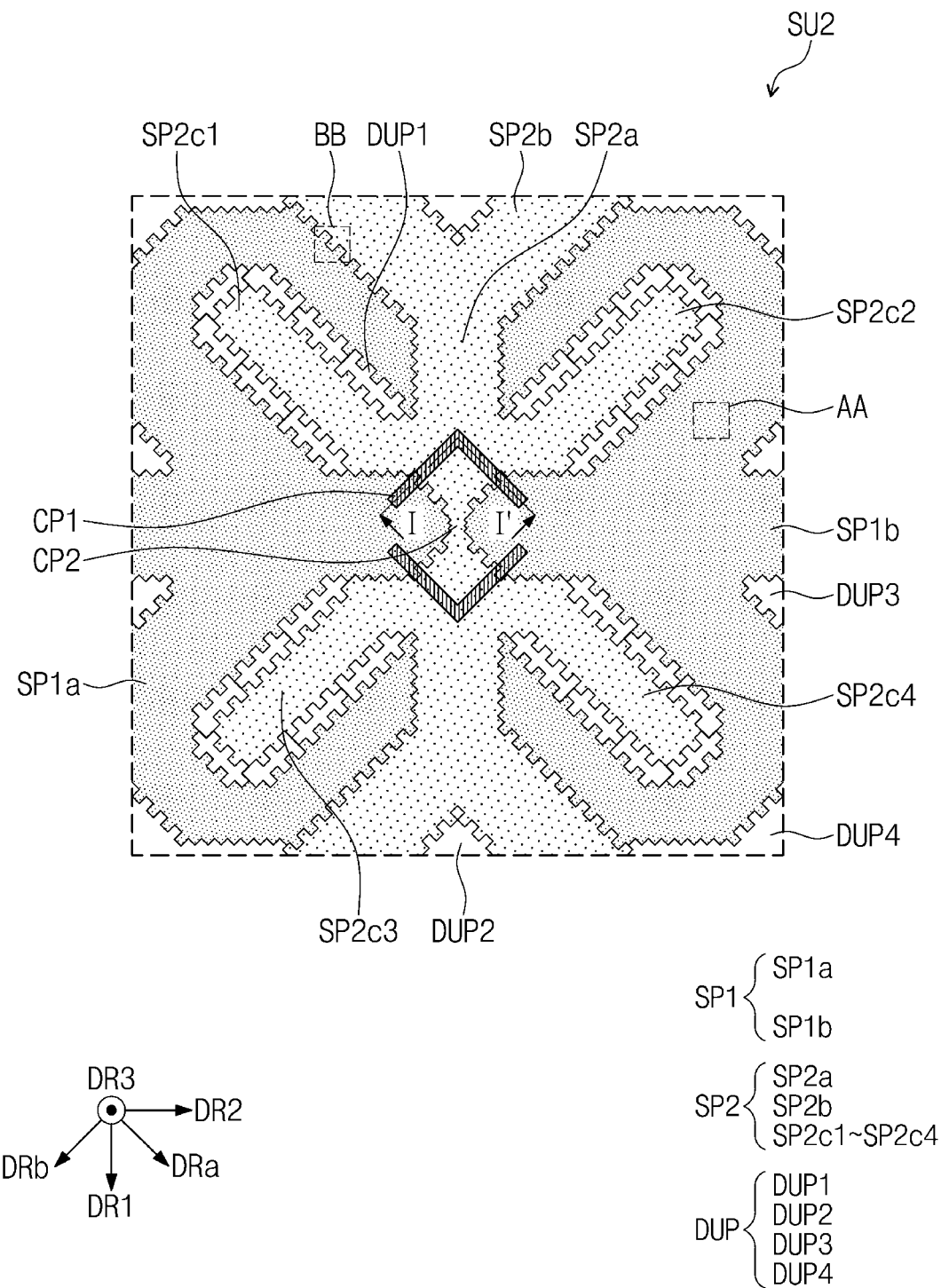
FIG. 8 is a plan view of an input sensor that corresponds to a sensor unit shown in FIG. 7B.

FIG. 8 is a plan view of an input sensor that corresponds to a sensing unit SU2 shown in FIG. 7B. Referring to FIG. 8, the sensing unit SU2 includes portions of the first sensor portions SP1 that include the first connection portion CP1 interposed therebetween, and portions of the second sensor portions SP2 that are integrally connected to each other and include the second connection portion CP2 interposed therebetween. However, according to an embodiment, the sensing unit SU2 further includes dummy patterns DUP as shown in FIG. 8.

In an embodiment, a first cross direction DRa or a fourth direction and a second cross direction DRb or a fifth direction are additionally shown in FIG. 8 and the following drawings. The first cross direction DRa is a direction that crosses each of the first direction DR1 and the second direction DR2. The second cross direction DRb is a direction that crosses each of the first direction DR1 and the second direction DR2 and is substantially perpendicular to the first cross direction DRa. Each of the first cross direction DRa and the second cross direction DRb corresponds to a diagonal direction between the first direction DR1 and the second direction DR2 on a plane surface defined by the first direction DR1 and the second direction DR2.

Referring to FIG. 8, in an embodiment, each of the second sensor portions SP2 includes extension portions SP2$a$ and SP2$b$ and branch portions SP2$c$1, SP2$c$2, SP2$c$3 and SP2$c$4. The extension portions SP2$a$ and SP2$b$ includes a first extension portion SP2$a$ that extends in the first direction DR1 and second extension portions SP2$b$ that is bent and extends from the first extension portion SP2$a$ in the first cross direction DRa and the second cross direction DRb such that a dummy pattern DUP is disposed therebetween, however, embodiments are not limited thereto. According to an embodiment, the dummy pattern DUP is not disposed between the second extension portions SP2$b$, and the second extension portion SP2$b$ extend in a direction substantially diagonal to the first extension portion SP2$a$.

The branch portions SP2$c$1 to SP2$c$4 extend in the first cross direction DRa and the second cross direction DRb away from the second connection portion CP2 that is interposed therebetween. The branch portions SP2$c$1 to SP2$c$4 include first, second, third, and fourth branch portions SP2$c$1, SP2$c$2, SP2$c$3, and SP2$c$4. The first branch portion SP2$c$1 and the fourth branch portion SP2$c$4 extend in the first cross direction DRa, and the second branch portion SP2$c$2 and the third branch portion SP2$c$3 extend in the second cross direction DRb.

The first to fourth branch portions SP2$c$1 to SP2$c$4 extend away from each other in opposite directions. For example, the first branch portion SP2$c$1 extends away in the second direction DR2 from the second branch portion SP2$c$2 and extends away in the first direction DR1 from the third branch portion SP2$c$3. The first branch portion SP2$c$1 and the fourth branch portion SP2$c$4 extend away from each other in the first cross direction DRa with the second connection portion CP2 interposed therebetween, and the second branch portion SP2$c$2 and the third branch portion SP2$c$3 extend away from each other in the second cross direction DRb with the second connection portion CP2 interposed therebetween.

The second connection portion CP2 is disposed between portions of the first sensor portions SP1 that protrude toward each other in the second direction DR2. The second connection portion CP2 connects the first extension portions SP2$a$ of the second sensor portions SP2. The second connection portion CP2 are disposed on the same layer as the first extension portions SP2$a$ and are integrally formed with the first extension portions SP2$a$.

Each of the first sensor portions SP1 includes a first portion SP1$b$ that extends in the second direction DR2 and a second portion SP1$a$ that extends from the first portion SP1$b$ and surrounds a portion of the second sensor portions SP2. The second portion SP1$a$ of the first sensor portions SP1 surrounds the adjacent branch portions SP2$c$1 to SP2$c$4 of the second sensor portion SP2. Referring to FIG. 8, the second portion SP1$a$ of the first sensor portion SP1 disposed at a left side of the sensing unit SU2 surrounds the first and third branch portions SP2$c$1 and SP2$c$3, and the second portion SP1$a$ of the first sensor portion SP1 disposed at a right side of the sensing unit SU2 surrounds the second and fourth branch portions SP2$c$2 and SP2$c$4.

The first portions SP1$b$ of the first sensor portions SP1 are spaced apart from each other in the second direction DR2 with the second connection portion CP2 interposed therebetween. The first connection portion CP1 electrically connects the spaced apart first sensor portions SP1. FIG. 8 shows two first connection portions CP1 disposed in the sensing unit SU2. However, embodiments are not limited thereto, and in other embodiments, the number of the first connection portions CP1 disposed in the sensing unit SU2 may be less than or greater than two.

As shown in FIG. 8, in an embodiment, the first connection portions CP1 have a turned V shape or a V shape when viewed in a plan view. The turned V shaped or V shaped first connection portions CP1 overlap the second sensor portions SP2, however, embodiments are not limited thereto. According to an embodiment, the first connection portions CP1 has a straight line shape that extends in the second direction DR2 and overlaps the second connection portion CP2 when viewed in a plan view.

The dummy patterns DUP are electrically floated. The dummy patterns DUP are insulated from the first and second electrode groups EG1 and EG2. The dummy patterns DUP include first, second, third, and fourth dummy patterns DUP1, DUP2, DUP3, and DUP4, according to their positions.

The first dummy patterns DUP1 are disposed between the first sensing electrodes IE1-1 to IE1-6 and the second sensing electrodes IE2-1 to IE2-4. In detail, the first dummy patterns DUP1 are disposed between the first sensor portions SP1 and the second sensor portions SP2. For example, the first dummy patterns DUP1 are disposed between the second portions SP1*a* of the first sensor portions SP1 and the branch portions SP2*c*1 to SP2*c*4 of the second sensor portions SP2 and surround the branch portions SP2*c*1 to SP2*c*4, as shown in FIG. 8.

Since the first dummy patterns DUP1 are disposed between the first sensor portions SP1 and the second sensor portions SP2, a mutual capacitance between the first sensor portions SP1 and the second sensor portions SP2 is reduced. However, although the first dummy patterns DUP1 are disposed between the first sensor portions SP1 and the second sensor portions SP2, an amount of the variation in mutual capacitance caused by occurrence of a touch event might not be significantly reduced. Accordingly, a value obtained by dividing the variation amount of the mutual capacitance by the mutual capacitance may increase due to the first dummy patterns DUP1.

Accordingly, a ghost touch phenomenon that occurs in a specific environment is reduced due to the first dummy patterns DUP1. A ghost touch phenomenon is a phenomenon in which a noise signal rather than a signal generated by an actual touch event is amplified and recognized as a touch. For example, when a temperature of a portion of the sensing area rises due to an operation such as a touch event in a low temperature state and the entire portion of the sensing area is turned on, an area within the sensing area in which no touch event is generated operates as if the touch occurs. However, the ghost touch phenomenon is reduced by the first dummy patterns DUP1, and a reliability of the input sensor ISP is increased.

A distance between the first sensor portions SP1 and the second sensor portions SP2 is increased by the first dummy patterns DUP1, and a possibility that the first sensor portions SP1 and the second sensor portions SP2 are shorted is reduced. For example, if no first dummy patterns DUP1 are disposed, the distance between the first sensor portions SP1 and the second sensor portions SP2 is on a scale from about 4 μm to about 5 μm, and when the first dummy patterns DUP1 are disposed, the distance between the first sensor portions SP1 and the second sensor portions SP2 increases on a scale of about 70 μm or more. Accordingly, the first sensor portions SP1 and the second sensor portions SP2 can be short-circuited only when a foreign substance or residue of size about 70 μm or more occurs in the area of the first dummy patterns DUP1.

The first dummy patterns DUP1 include a plurality of patterns electrically insulated from each other. A size of each of the patterns may change for each sensing unit SU2 by taking into account the mutual capacitance and the visibility. However, the first dummy patterns DUP1 are not limited thereto.

The second dummy patterns DUP2 are surrounded by the second extension portion SP2*b* of the second sensor portion SP2. The third dummy patterns DUP3 are surrounded by the first sensor portion SP1. The fourth dummy patterns DUP4 are disposed between the first sensing electrodes IE1-1 to IE1-6 arranged in the first direction DR1. However, according to embodiments, at least a portion of the first to fourth dummy patterns DUP1 to DUP4 may be omitted.

Figure 9:
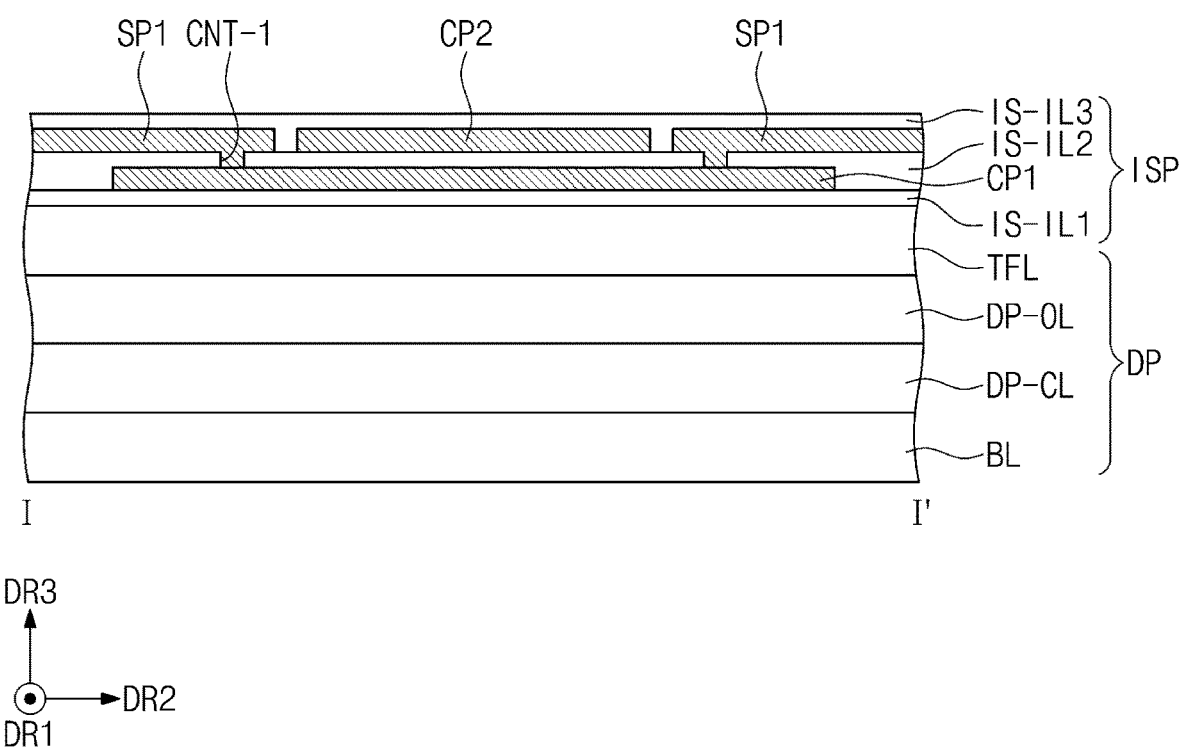
FIG. 9 is a cross-sectional view taken along a line I-I' of FIG. 8 and shows a display panel and an input sensor according to an embodiment of the present disclosure.

FIG. 9 is a cross-sectional view taken along a line I-I' of FIG. 8 and shows the display panel DP and the input sensor ISP according to an embodiment of the present disclosure. The cross-section shown in FIG. 9 corresponds to an area that overlaps one first connection portion CPL. In a present embodiment, the first connection portion CP1 is the bridge pattern. Details of the display panel DP and the input sensor ISP described earlier are applicable to the display panel DP and the input sensor ISP of FIG. 9.

The first connection portion CP1 is disposed on a different layer from that on which the first sensor portion SP1, the second sensor portion SP2, and the second connection portion CP2 are disposed. Referring to FIGS. 6 and 9, in an embodiment, the first connection portion CP1 is formed from the first conductive layer IS-CL1, and the first sensor portion SP1, the second sensor portion SP2, and the second connection portion CP2 are formed from the second conductive layer IS-CL2 disposed on the first conductive layer IS-CL1. The first sensor portion SP1, the second sensor portion SP2, and the second connection portion CP2 are disposed on the second insulating layer IS-IL2, and the first sensor portions SP1 are electrically connected to the first connection portion CP1 via a contact hole CNT-I formed through the second insulating layer IS-IL2.

However, according to an embodiment, the first sensor portion SP1, the second sensor portion SP2, and the second connection portion CP2 can be formed from the first conductive layer IS-CL1, and the first connection portion CP1 can be formed from the second conductive layer IS-CL2. According to an embodiment, the second connection portion CP2 is the bridge pattern and is disposed on a different layer different from that on which the first sensor portion SP1 and the second sensor portion SP2 are disposed, and the first connection portion CP1 is disposed on the same layer as the first sensor portion SP1 and the second sensor portion SP2.

In addition, the signal lines of the first signal line group SG1 and the second signal line group SG2 are formed from the second conductive layer IS-CL2, however, embodiments are not limited thereto. In an embodiment, the signal lines of the first signal line group SG1 and the second signal line group SG2 further include a portion formed from the first conductive layer IS-CL1, and have a two-layer structure. In this case, a portion of the signal lines formed from the second conductive layer IS-CL2 and a portion of the signal lines formed from the first conductive layer IS-CL1 are connected to each other via a contact hole formed through the second insulating layer IS-IL2. The two-layer signal lines have a low resistance.

Each of the first sensing electrodes IE1-1 to IE1-6 and the second sensing electrodes IE2-1 to IE2-4 includes mesh patterns that are described below. Hereinafter, descriptions will be focused on those mesh patterns that correspond to inner areas of the first sensing electrodes IE1-1 to IE1-6 with reference to drawings, and the descriptions are applicable to the second sensing electrodes IE2-1 to IE2-4.

Figure 10A:
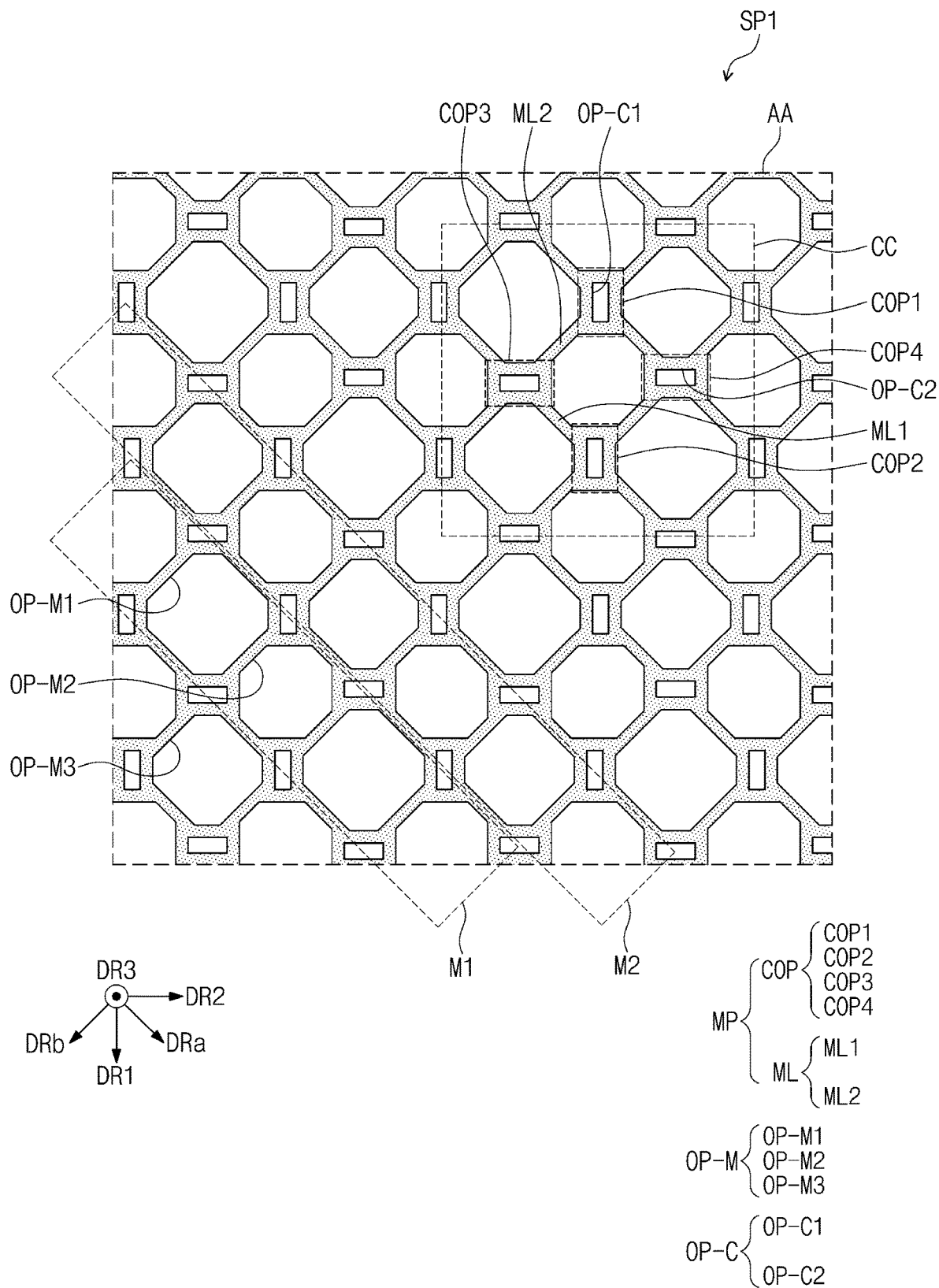
FIGS. 10A, 10B, and 10C are enlarged plan views of a sensor portion that corresponds to an area AA of FIG. 8 according to an embodiment of the present disclosure.
Figure 10B:
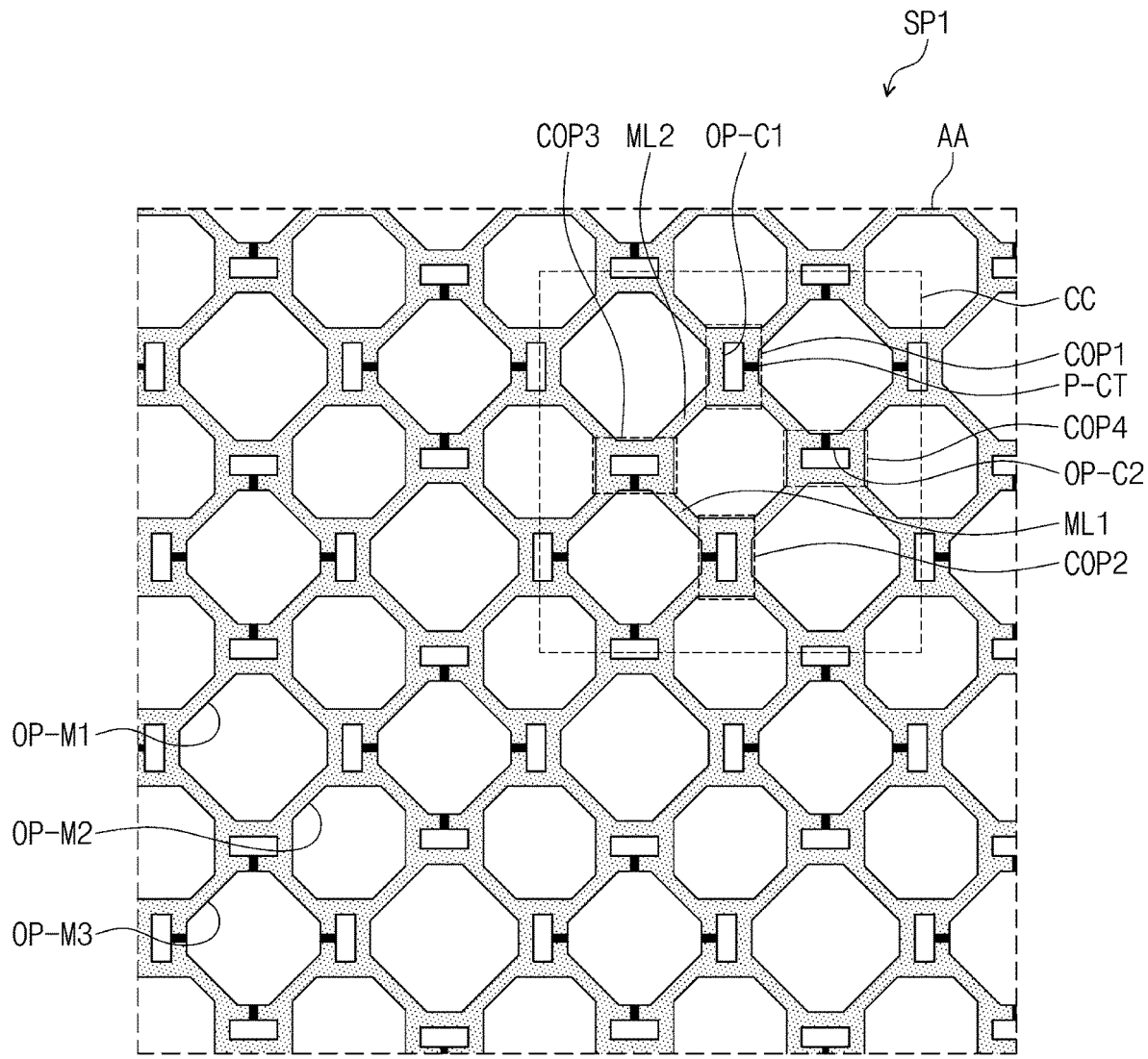
Figure 10B:
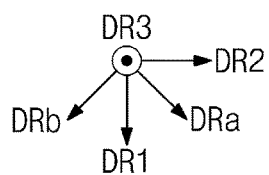
Figure 10C:
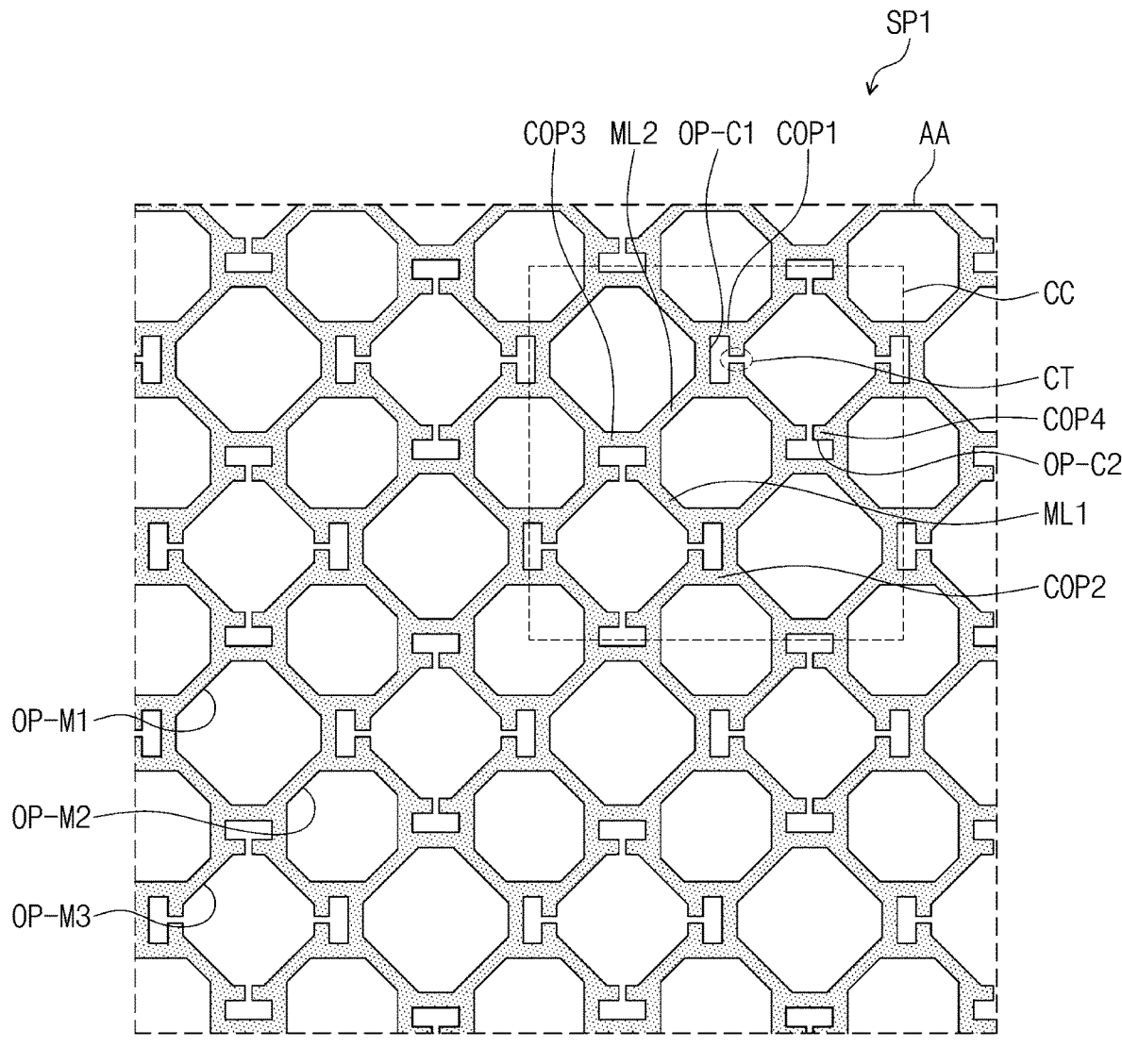

FIGS. 10A to 10C are enlarged plan views of a sensor part that corresponding to an area AA of FIG. 8 according to an embodiment of the present disclosure. FIG. 10A is a plan view of a mesh pattern MP in which a cut-away portion CT of FIG. 10C is not formed. FIG. 10B is a plan view of the mesh pattern MP in which a cutting portion P-CT is formed that forms the cut-away portion CT. FIG. 10C is a plan view of the mesh pattern MP in which the cut-away portion CT is formed by cutting the cutting portion P-CT of FIG. 10B.

Referring to FIG. 10A, in an embodiment, the mesh pattern MP includes a plurality of conductive patterns COP and a plurality of mesh lines ML. The mesh pattern MP includes a plurality of openings formed therethrough. The openings include a plurality of mesh openings OP-M and a plurality of cross openings OP-C.

The mesh openings OP-M include two or more openings that have different sizes, when viewed in a plan view. As shown in FIG. 10A, the mesh openings OP-M include a first mesh opening OP-M1, a second mesh opening OP-M2, and a third mesh opening OP-M3 that have different sizes from each other. Of the mesh openings OP-M, the first mesh opening OP-M1 have the largest size, and the second mesh opening OP-M2 have the smallest size.

In an embodiment, the mesh openings OP-M include two or more openings that have different shapes from each other when viewed in a plan view. In an embodiment, the mesh openings OP-M have the same shape as each other, and different sizes from each other. For example, the shape of the first mesh opening OP-M1 is the same as the shape of the third mesh opening OP-M3, however, the size of the first mesh opening OP-M1 differs from the size of the third mesh opening OP-M3.

However, the size and the shape of the mesh openings OP-M are not limited to an embodiment shown in FIG. 10A, and in an embodiment described below, the mesh openings OP-M have the same size and the same shape.

The mesh openings OP-M are arranged in the first cross direction DRa and the second cross direction DRb. The mesh openings OP-M arranged in the first cross direction DRa are defined as mesh opening rows M1 and M2. A plurality of mesh opening rows M1 and M2 are provided and are arranged in the second cross direction DRb.

Referring to FIG. 10A, in an embodiment, the mesh opening rows M1 and M2 include a first row M1 and a second row M2. In the first row M1, the first mesh opening OP-M1 and the second mesh opening OP-M2 alternate with each other along the first cross direction DRa. In the second row M2, the second mesh opening OP-M2 and the third mesh opening OP-M3 alternate with each other along the first cross direction DRa. The first row M1 and the second row M2 alternate with each other in the second cross direction DRb. The second mesh opening OP-M2 in the first row M1 has a shape obtained by rotating the second mesh opening OP-M2 in the second row M2 by about 90 degrees.

Before the cut-away portion CT, shown in FIG. 10C, is formed, each of the conductive patterns COP includes the cross opening OP-C formed therethrough and spaced apart from the mesh opening OP-M. The cross openings OP-C are arranged in the first direction DR1 and the second direction DR2. The cross openings OP-C are alternately arranged with the mesh openings OP-M in the first direction DR1 and the second direction DR2.

Each of the cross openings OP-C includes a first side extending in the first direction DR1 and a second side extending in the second direction DR2. The cross openings OP-C have the same shape and the same size when viewed in a plan view, however, embodiments are not limited thereto.

The first side and the second side of each of the cross openings OP-C have different lengths from each other. Referring to FIG. 10A, a first side of each of first cross openings OP-C1 is longer than a second side thereof. A first side of each of second cross openings OP-C2 is shorter than a second side thereof. However, embodiments are not limited thereto, and in an embodiment, the first side and the second side of the cross openings OP-C have the same length as each other.

The cross openings OP-C include two or more openings whose first sides have different lengths. Referring to FIG. 10A, the cross openings OP-C include the first cross opening OP-C1 and the second cross opening OP-C2, and the length of the first side of the first cross opening OP-C1 differs from the length of the first side of the second cross opening OP-C2. The length of the first side of the first cross opening OP-C1 is greater than the length of the first side of the second cross opening OP-C2. For example, each of the first cross openings OP-C1 and the second cross openings OP-C2 has a rectangular shape, where the first cross openings OP-C1 extend lengthwise in the first direction DR1, and the second cross opening OP-C2 extend lengthwise in the second direction DR2. However, embodiments are not limited thereto and according to an embodiment, the cross openings OP-C have the same length with respect to the first side.

Although FIG. 10A shows each of the conductive patterns COP as including one cross opening OP-C formed therethrough before the cut-away portion CT, shown in FIG. 10C, is formed, however, in an embodiment, each of the conductive patterns COP includes a plurality of cross openings OP-C defined therethrough.

The conductive patterns COP are arranged in the first direction DR1 and the second direction DR2. The conductive patterns COP arranged in the second direction DR2 are defined as a conductive pattern row. A plurality of conductive pattern rows are provided, and the conductive pattern rows are arranged in the first direction DR1.

The conductive patterns COP that form a first conductive pattern row and the conductive patterns COP that form a second conductive pattern row are connected to each other by the mesh lines ML that extend in the first cross direction DRa or the second cross direction DRb. Accordingly, the conductive patterns COP that form the first conductive pattern row and the conductive patterns COP that form the second conductive pattern row are displaced from each other with respect to the first cross direction DRa and the second cross direction DRb.

The mesh lines ML include first mesh lines ML1 that extend in the first cross direction DRa and second mesh lines MU that extend in the second cross direction DRb. Each of the mesh lines ML connect the conductive patterns COP disposed at each end of the mesh line.

Before the cut-away portion CT, shown in FIG. 10C, is formed, the conductive patterns COP include a plurality of lines that form a closed line when viewed in a plan view. Each of the lines in the conductive patterns COP extends in a direction that crosses a direction in which the mesh lines ML extend. Referring to FIGS. 10A-C, the conductive patterns COP include lines each of which extends in the first direction DR1 or the second direction DR2 and which are connected to each other. FIG. 10A shows the conductive patterns COP as having a rectangular ring shape as a representative example. The cut-away portion CT, shown in FIG. 10C and described below, are formed in the conductive pattern COP by cutting at least one of the lines in the conductive patterns COP.

The conductive patterns COP and the mesh lines ML surround one of the mesh openings OP-M. In a present embodiment, the one opening surrounded by the conductive patterns COP and the mesh lines ML is defined as a center opening. For convenience of description, one of the second mesh openings OP-M2 will be described as a representative example of the center opening in FIG. 10A, and reference numerals of components are indicated based on the center opening.

The conductive patterns COP include first, second, third, and fourth conductive patterns COP1, COP2, COP3, and COP4 with the center opening interposed therebetween. The first conductive pattern COP1 and the second conductive pattern COP2 are separated in the first direction DR1 with the center opening interposed therebetween. The third conductive pattern COP3 and the fourth conductive pattern COP4 are separated in the second direction DR2 with the center opening interposed therebetween. The first mesh lines ML1 and the second mesh lines MU are disposed along an edge of the center opening.

The first conductive pattern COP1 and the third conductive pattern COP3 are connected to each other such that one second mesh line MU that extends in the second cross direction DRb is disposed therebetween. The second conductive pattern COP2 and the third conductive pattern COP3 are connected to each other such that one first mesh line ML1 that extends in the first cross direction DRa is disposed therebetween. The first conductive pattern COP1 and the fourth conductive pattern COP4 are connected to each other such that another first mesh line ML1 is disposed therebetween. The second conductive pattern COP2 and the fourth conductive pattern COP4 are connected to each other such that another second mesh line ML2 is disposed therebetween. Accordingly, the connected first to fourth conductive patterns COP1 to COP4 and the first and second mesh lines ML1 and ML2 form a center opening.

The conductive patterns COP and the mesh lines ML include the same conductive material. The conductive patterns COP and the mesh lines ML are integrally formed with each other. For example, the conductive patterns COP and the mesh lines ML are formed by patterning the same conductive layer.

Referring to FIG. 10B, in an embodiment, each of the conductive patterns COP includes the cutting portion P-CT. The cutting portion P-CT is a portion of the conductive patterns COP that is to be cut. In detail, the cutting portion P-CT is defined in at least one of the lines in the conductive patterns COP that is to be cut. After the cutting portion P-CT is cut, the cut portion of the conductive patterns COP forms the cut-away portion CT described below.

Referring to one conductive pattern COP, the cutting portion P-CT is defined such that at least one of the lines in the conductive pattern COP is integrally connected to the mesh lines ML and at least one line is cut to form end portions spaced apart from each other. Both ends of the line in the conductive pattern COP in which the cutting portion P-CT is not defined are connected to the first mesh line ML1 or the second mesh line ML2. One end of the line in the conductive pattern COP in which the cutting portion P-CT is defined is connected to the first mesh line ML1 or the second mesh line ML2 after being cut, and the other end of the line in the conductive pattern COP in which the cutting portion P-CT is defined is spaced apart from the mesh lines ML after being cut.

The cutting portion P-CT is defined in a longer line along the extension direction of the lines in the conductive patterns COP. Accordingly, a resistance of the conductive patterns COP is prevented from increasing, however, embodiments are not limited thereto.

The cutting portion P-CT is defined in the conductive pattern COP such that the cut-away portion CT formed by cutting the cutting portion P-CT opens toward one of the mesh openings. In the present disclosure, the expression "cut-away portion opens toward the mesh opening" means that "a separation space formed by cutting a portion of the conductive pattern defined by the cut-away portion is connected to an empty space where the mesh open forms an integral empty space".

The cutting portion P-CT is defined such that some cut-away portions of the cut-away portions CT of the conductive patterns COP open toward the same opening, however, embodiments are not limited thereto. In an embodiment, the cutting portion P-CT is defined such that the cut-away portions CT of the conductive patterns COP opens toward different openings from each other. This will be described in detail with reference to drawings below.

FIG. 10C is a plan view of the conductive patterns COP in which the cut-away portion CT is formed by cutting the cutting portion P-CT of FIG. 10B. Referring to FIG. 10C, in an embodiment, each of the conductive patterns COP includes at least one cut-away portion CT formed therein. Since the cut-away portion CT is formed in each conductive pattern COP, the conductive patterns COP include lines spaced apart from each other with the cut-away portion CT interposed therebetween.

The cut-away portion CT opens toward one of the mesh openings. The cut-away portions CT of the conductive patterns COP, which include one center opening interposed therebetween, open toward the same center opening, however, embodiments are not limited thereto. According to an embodiment, some cut-away portions of the cut-away portions CT open toward the same center opening, and others of the cut-away portions of the cut-away portions CT open toward a different mesh opening from the center opening.

The cut-away portion CT connects the cross opening OP-C in the conductive pattern COP to the mesh opening OP-M adjacent to the conductive pattern COP. In a present embodiment, the expression "connect", as used herein, means that the empty space in the cross opening OP-C and the empty space in the mesh opening OP-M are connected as an integral empty space with the empty space of the cut-away portion CT interposed therebetween.

Figure 11A:
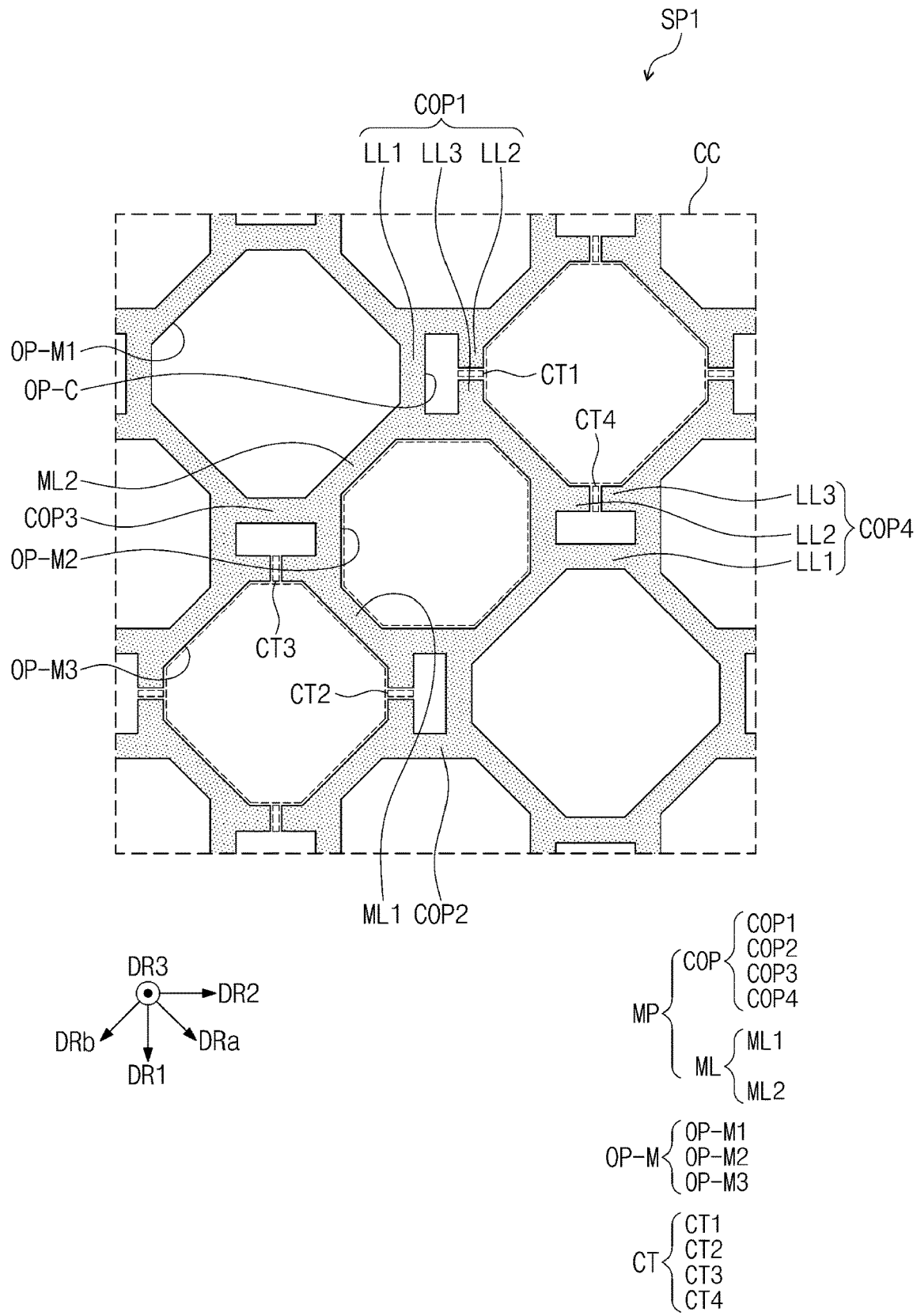
FIGS. 11A, 11B, and 11C are enlarged plan views of a sensor portion that corresponds to an area CC of FIG. 10C according to an embodiment of the present disclosure.
Figure 11B:
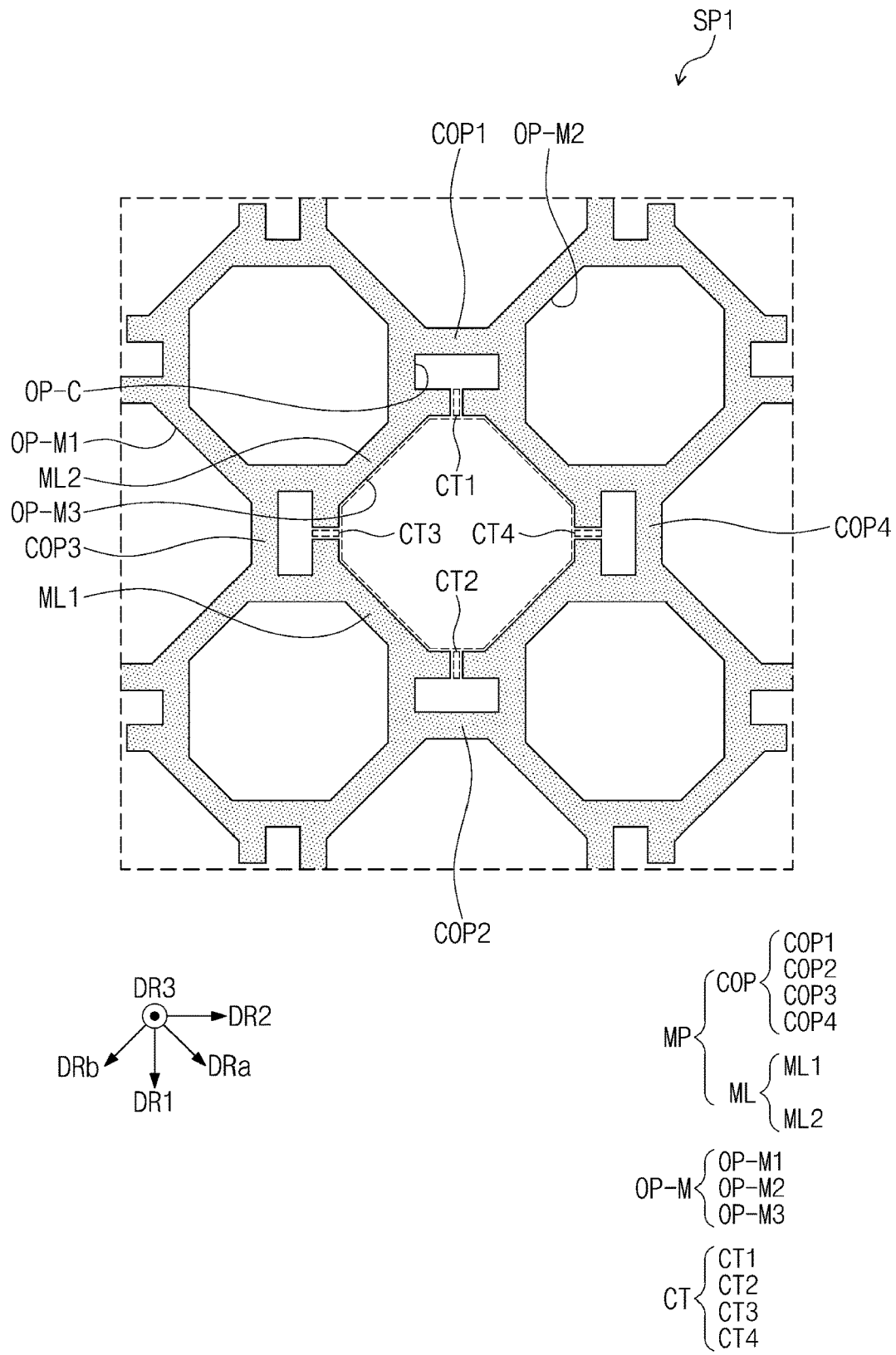
Figure 11C:
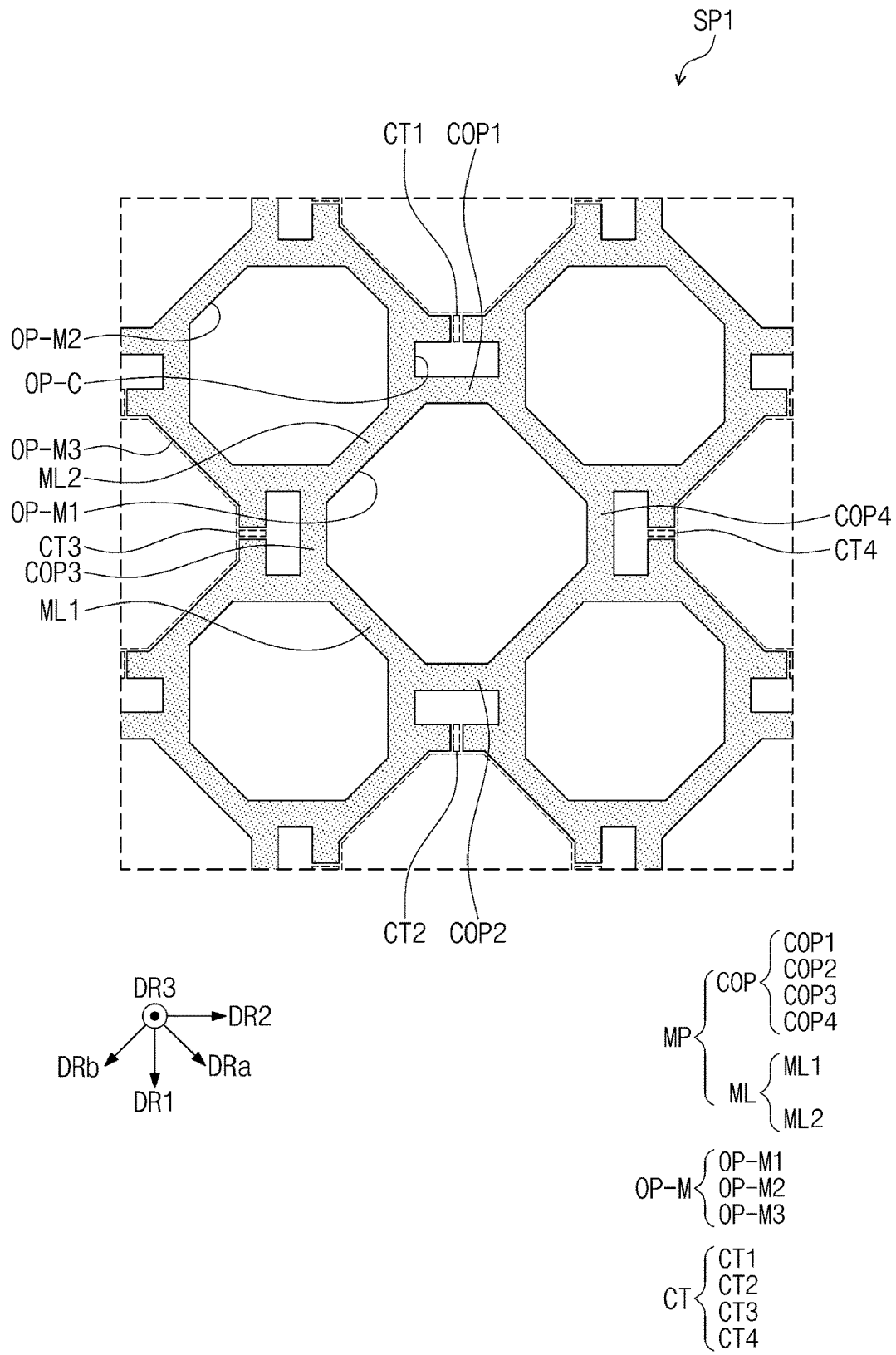

FIGS. 11A to 11C are enlarged plan views of the first sensor portion SP1 of an area CC of FIG. 10C according to an embodiment of the present disclosure. FIG. 11A is centered on one second mesh opening OP-M2 of the first sensor portion SP1, shown in FIG. 10C. FIG. 11B is centered on one third mesh opening OP-M3 of the first sensor portion SP1, shown in FIG. 10C, and FIG. 11C is centered on one first mesh opening OP-M1 of the first sensor portion SP1, shown in FIG. 10C.

Referring to FIG. 11A, in an embodiment, the second mesh opening OP-M2 corresponds to the center opening. The first mesh openings OP-M1 are arranged along the first cross direction DRa with respect to the second mesh opening OP-M2. The third mesh openings OP-M3 are arranged along the second cross direction DRb with respect to the second mesh opening OP-M2.

The first to fourth conductive patterns COP1 to COP4 and the first and second mesh lines ML1 and ML2 are disposed along an edge of the second mesh opening OP-M2. The cut-away portions CT1 to CT4 are formed in the first to fourth conductive patterns COP1 to COP4, respectively.

Each of the first to fourth conductive patterns COP1 to COP4 includes lines that extend in different directions from the extension direction of the mesh lines ML. In this regard, the descriptions of the first to fourth conductive patterns COP1 to COP4 will be based on the first conductive pattern COP1 and the fourth conductive pattern COP4.

The first conductive pattern COP1 includes a first line LL1, a second line LL2, and a third line LL3, that extend in the first direction DR1. One end of the first line LL1 of the first conductive pattern COP1 is connected to the first mesh line ML1 and is connected to another conductive pattern by the first mesh line ML1. The other end of the first line LL1 of the first conductive pattern COP1 is connected to the second mesh line ML2 and is connected to another conductive pattern, such as the third conductive pattern COP3, by the second mesh line ML2. The one end of the first line LL1 of the first conductive pattern COP1 is also connected to one end of the second line LL2 of the first conductive pattern COP1, and the other end of the first line LL1 of the first conductive pattern COP1 is also connected to one end of the third line LL3 of the first conductive pattern COP1.

The one end of the second line LL2 of the first conductive pattern COP1 is connected to the second mesh line ML2, and thus is connected to another conductive pattern. However, the other end of the second line LL2 is spaced apart from the mesh line ML by the cut-away portion CT1. The one end of the third line LL3 of the first conductive pattern COP1 is connected to the first mesh line ML1 and is connected to another conductive pattern, such as the fourth conductive pattern COP4, by the first mesh line ML1. However, the other end of the third line LL3 is spaced apart from the mesh line ML by the cut-away portion CT1.

The other end of the second line LL2 of the first conductive pattern COP1 and the other end of the third line LL3 of the first conductive pattern COP1 are spaced apart from each other in the first direction DR1 with the cut-away portion CT1 interposed therebetween. The reflectance of light increases at the other ends of the second line LL2 and the third line LL3, and thus, a boundary between the sensing electrodes is prevented from being viewed.

The extension direction of the lines of the fourth conductive pattern COP4 that are spaced apart from each other with the cut-away portion CT4 interposed therebetween, differs from the extension direction of the lines of the first conductive pattern COP1 that are spaced apart from each other with the cut-away portion CT1 interposed therebetween. The fourth conductive pattern COP4 includes a first line LL1, a second line LL2, and a third line LL3 that extend in the second direction DR2. One end of the first line LL1 of the fourth conductive pattern COP4 is connected to the second mesh line ML2 and is connected to another conductive pattern, such as the second conductive pattern COP2, by the second mesh line ML2. The other end of the first line LL1 of the second conductive pattern COP2 is connected to the first mesh line ML1 and is connected to another conductive pattern by the first mesh line ML1. The one end of the first line LL1 of the fourth conductive pattern COP4 is also connected to one end of the second line LL2 of the fourth conductive pattern COP4, and the other end of the first line LL1 of the fourth conductive pattern COP4 is also connected to one end of the third line LL3 of the fourth conductive pattern COP4.

One end of the second line LL2 of the fourth conductive pattern COP4 is connected to the first mesh line ML1 and is connected to another conductive pattern, such as the first conductive pattern COP1. However, the other end of the second line LL2 is spaced apart from the mesh line ML by the cut-away portion CT4. The one end of the third line LL3 of the fourth conductive pattern COP4 is connected to the second mesh line ML2 and is connected to another conductive pattern by the second mesh line ML2. However, the other end of the third line LL3 is spaced apart from the mesh line ML by the cut-away portion CT4.

The other end of the second line LL2 of the fourth conductive pattern COP4 and the other end of the third line LL3 of the fourth conductive pattern COP4 are spaced apart from each other in the second direction DR2 with the cut-away portion CT4 interposed therebetween. The reflectance of the light increases at the other ends of the second line LL2 and the third line LL3, and thus, a boundary between the sensing electrodes is prevented from being viewed.

The details of the conductive patterns COP have been described with reference to the first conductive pattern COP1 and the fourth conductive pattern COP4, however, the descriptions of the first and fourth conductive patterns COP1 and COP4 are applicable to the other conductive patterns COP. In addition, the number of the lines included in the conductive patterns COP is not particularly limited as long as at least one cut-away portion CT is formed.

Some of the cut-away portions CT1 to CT4 of the first to fourth conductive patterns COP1 to COP4 open toward the same mesh opening. For example, the cut-away portion CT1 of the first conductive pattern COP1 and the cut-away portion CT4 of the fourth conductive pattern COP4 open toward the same third mesh opening OP-M3 as shown in FIG. 11A.

Some of the cut-away portions CT1 to CT4 of the first to fourth conductive patterns COP1 to COP4 open toward different mesh openings from each other. For example, the cut-away portion CT1 of the first conductive pattern COP1 and the cut-away portion CT3 of the third conductive pattern COP3 open toward different third mesh openings OP-M3, as shown in FIG. 11A.

The cut-away portion CT1 of the first conductive pattern COP1 and the cut-away portion CT2 of the second conductive pattern COP2 open toward different mesh openings. For example, the cut-away portion CT1 of the first conductive pattern COP1 and the cut-away portion CT2 of the second conductive pattern COP2 open in opposite directions. Similarly, the cut-away portion CT3 of the third conductive pattern COP3 and the cut-away portion CT4 of the fourth conductive pattern COP4 open in opposite directions.

The shape of the cut-away portions CT1 to CT4 of the first to fourth conductive patterns COP1 to COP4 may vary depending on which mesh opening corresponds to the center opening and is not particularly limited.

Referring to FIG. 11B, in an embodiment, the third mesh opening OP-M3 corresponds to the center opening. The second mesh openings OP-M2 are arranged in the first cross direction DRa and the second cross direction DRb with respect to the third mesh opening OP-M3. The second mesh openings OP-M2 are symmetrically arranged around the third mesh opening OP-M3.

The first to fourth conductive patterns COP1 to COP4 and the first and second mesh lines ML1 and ML2 are arranged along the edge of the third mesh opening OP-M3. The cut-away portions CT1 to CT4 are formed in the first to fourth conductive patterns COP1 to COP4, respectively.

The cut-away portion CT1 of the first conductive pattern COP1 and the cut-away portion CT2 of the second conductive pattern COP2 open toward the same mesh opening. For example, the cut-away portion CT1 of the first conductive pattern COP1 and the cut-away portion CT2 of the second conductive pattern COP2 face each other. Similarly, the cut-away portion CT3 of the third conductive pattern COP3 and the cut-away portion CT4 of the fourth conductive pattern COP4 face each other.

The cut-away portions CT1 to CT4 of the first to fourth conductive patterns COP1 to COP4 open toward the same mesh opening. As shown in FIG. 11B, the cut-away portions CT1 to CT4 of the first to fourth conductive patterns COP1 to COP4 open toward the same third mesh opening OP-M3, which corresponds to the center opening.

Referring to FIG. 11C, the first mesh opening OP-M1 corresponds to the center opening. The second mesh openings OP-M2 are arranged along the first cross direction DRa and the second cross direction DRb with respect to the first mesh opening OP-M1. The second mesh openings OP-M2 are symmetrically arranged around the first mesh opening OP-M1.

The first to fourth conductive patterns COP1 to COP4 and the first and second mesh lines ML1 and ML2 are arranged along the edge of the first mesh opening OP-M1. The cut-away portions CT1 to CT4 are formed in the first to fourth conductive patterns COP1 to COP4, respectively.

The cut-away portion CT1 of the first conductive pattern COP1 and the cut-away portion CT2 of the second conductive pattern COP2 open toward different mesh openings. Similarly, the cut-away portion CT3 of the third conductive pattern COP3 and the cut-away portion CT4 of the fourth conductive pattern COP4 open toward different mesh openings.

The cut-away portions CT1 to CT4 of the first to fourth conductive patterns COP1 to COP4 open toward different mesh openings. The cut-away portion CT1 of the first conductive pattern COP1 and the cut-away portion CT2 of the second conductive pattern COP2 open in opposite directions, and the cut-away portion CT3 of the third conductive pattern COP3 and the cut-away portion CT4 of the fourth conductive pattern COP4 opened in opposite directions.

The cut-away portions CT1 to CT4 of the first to fourth conductive patterns COP1 to COP4 open toward directions opposite to each other with respect to the first mesh opening OP-M1. The cut-away portions CT1 to CT4 of the first to fourth conductive patterns COP1 to COP4 do not opened toward the first mesh opening OP-M1, which corresponds to the center opening.

Since the cut-away portion CT is formed in the conductive patterns COP, the boundary between the first sensing electrode and the second sensing electrode is prevented from being viewed. Light reflectance is high at the boundary between the first sensing electrode and the second sensing electrode, and thus, the boundary between the first sensing electrode and the second sensing electrode can be viewed from the outside. However, since the cut-away portion CT is formed in each of the conductive patterns COP, light reflectance of the areas in which the cut-away portions CT are formed increases, and thus, light reflectance differences between the boundary of the first sensing electrode and the second sensing electrode and an inner portion of the first sensing electrode, or an inner portion of the second sensing electrode, is reduced. Accordingly, the visibility of the input sensor is reduced.

Since the conductive patterns COP include cut-away portions CT formed therein and are integrally connected to each other, the resistance of the conductive patterns COP is prevented from increasing even though the conductive patterns are partially cut. Accordingly, the mesh pattern MP reduces the visibility of the input sensor without increasing the resistance of the input sensor.

However, the first sensor portion SP1 shown in FIGS. 11A to 11C are merely examples, and the shape of the first to fourth conductive patterns COP1 to COP4 and the shape of the cut-away portions CT1 to CT4 can vary according to embodiments. Hereinafter, various embodiments of the first sensor portion SP1 will be described in detail with reference to drawings.

Figure 12A:
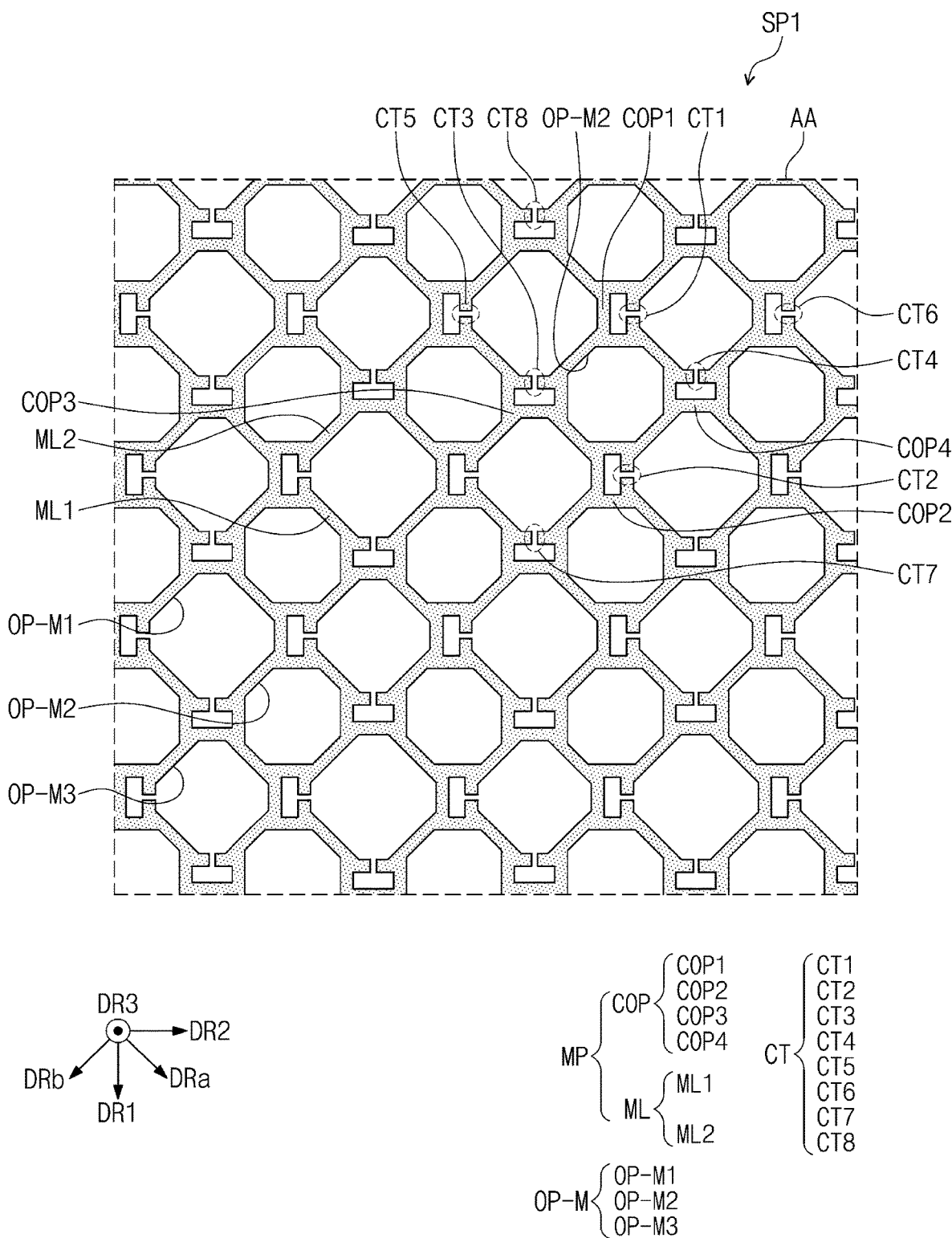
FIGS. 12A, 12B, and 12C are enlarged plan views of a sensor portion that corresponds to an area AA of FIG. 8 according to embodiments of the present disclosure.
Figure 12B:
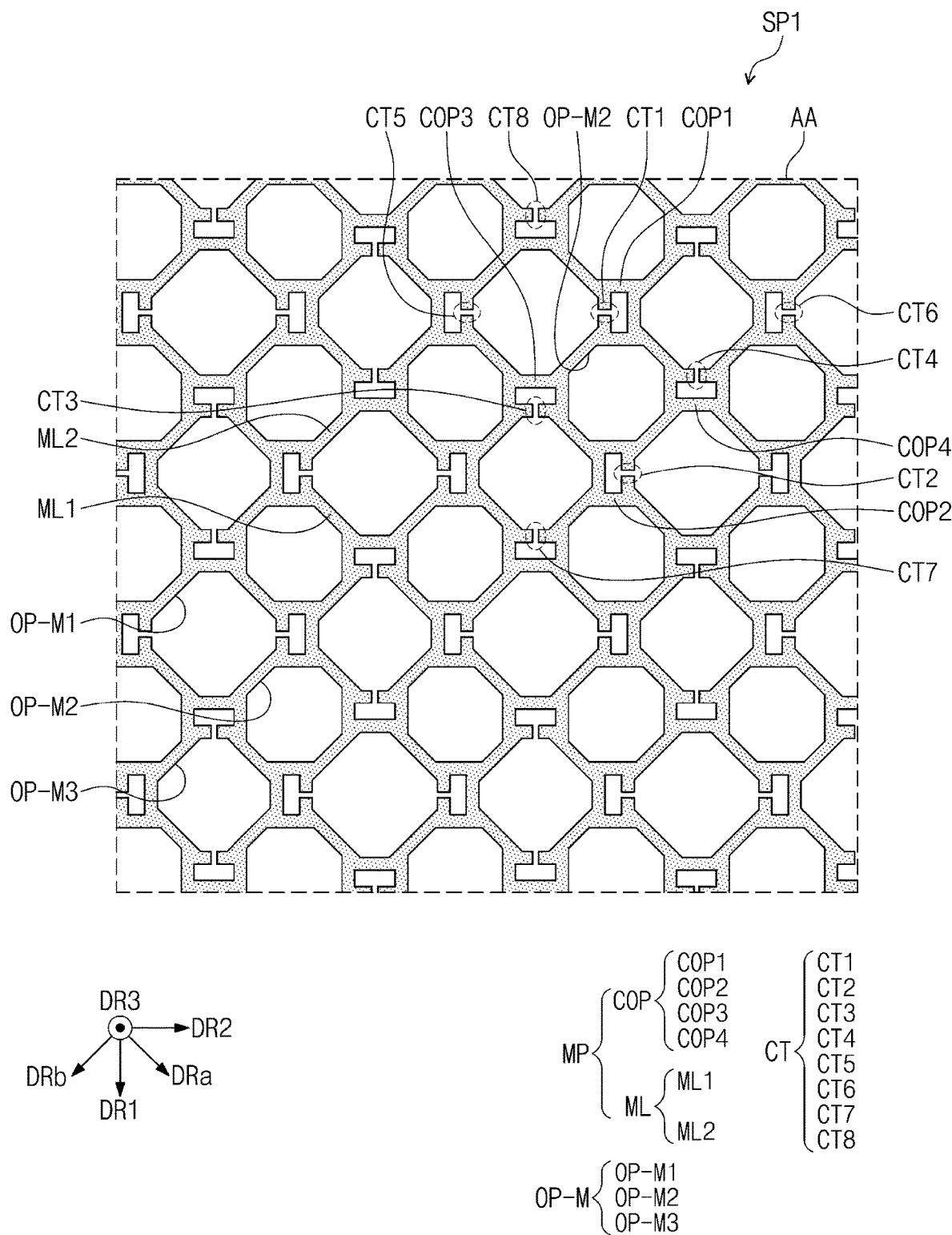
Figure 12C:
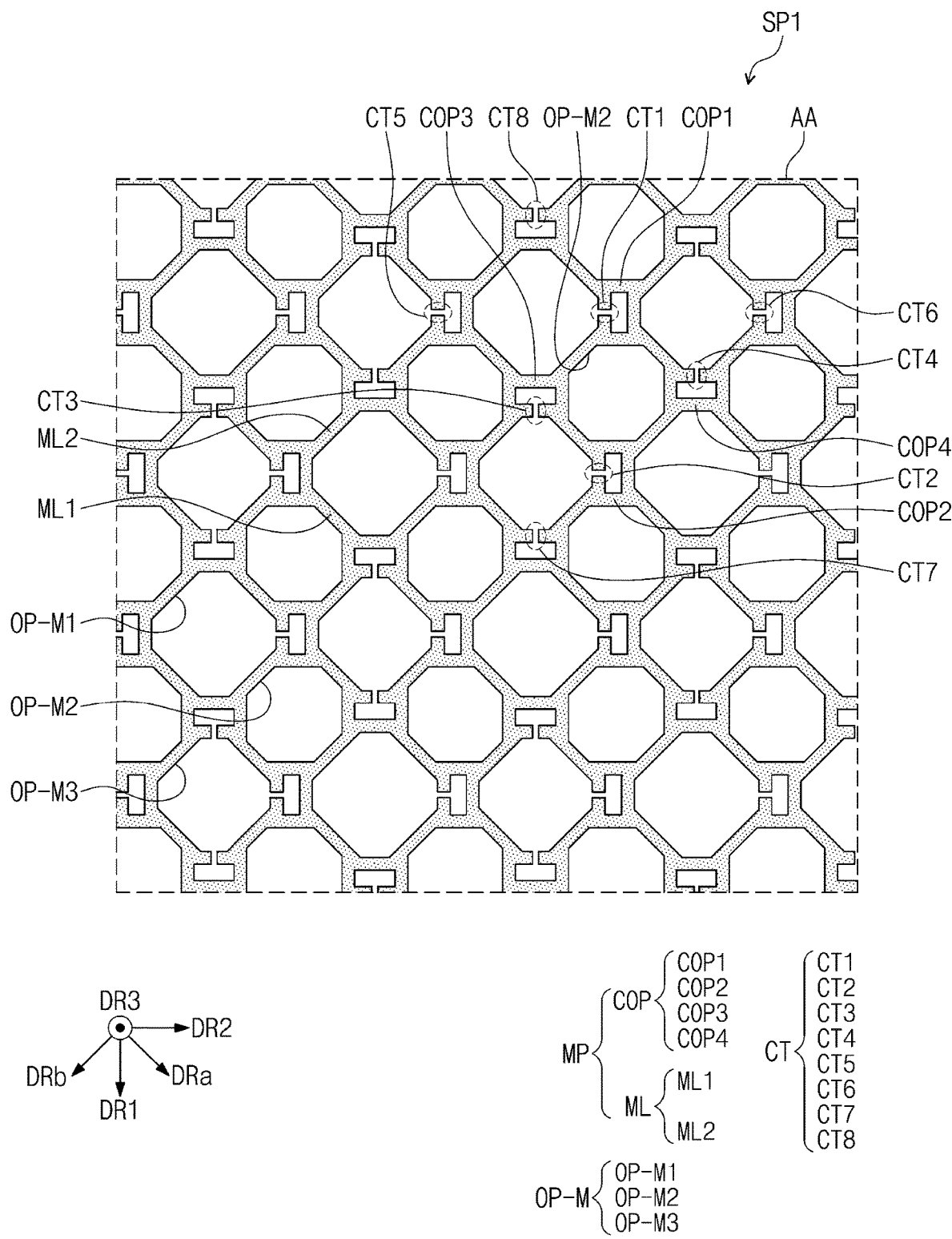

FIGS. 12A to 12C are enlarged plan views of first sensor portions SP1 that correspond to an area AA of FIG. 8 according to embodiments of the present disclosure. The first sensor portions SP1 shown in FIGS. 12A to 12C include substantially the same configurations as those of the first sensor portions SP1 shown in FIGS. 10A to 10C and 11A to 11C except for a position of the cut-away portions CT. In FIGS. 12A to 12C, the same reference numerals denote the same elements in FIGS. 10A to 10C and 11A to 11C, and thus, detailed descriptions of the same elements will be omitted.

For the convenience of description, in FIGS. 12A to 12C, one of the second mesh openings OP-M2 will be described as a representative example of a center opening, and reference numerals of components are indicated based on the center opening.

Referring to FIG. 12A, in an embodiment, a cut-away portion CT1 of a first conductive pattern COP1 and a cut-away portion CT2 of a second conductive pattern COP2, which are arranged along the first direction DR1, open toward the same direction. For example, the cut-away portions CT1 of each of the first conductive patterns COP and the cut-away portions CT2 of each of the second conductive patterns COP2 face right and open toward a mesh opening disposed at a right side thereof.

A cut-away portion CT3 of a third conductive pattern COP3 and a cut-away portion CT4 of a fourth conductive pattern COP4, which are arranged along the second direction DR2, open toward the same direction. For example, the cut-away portions CT3 of each of the third conductive patterns COP3 and the cut-away portions CT4 of each of the fourth conductive patterns COP4 face upward and open toward a mesh opening disposed at an upper side thereof.

The cut-away portion CT1 of the first conductive pattern COP1 opens toward the direction that crosses a facing direction of each of the cut-away portions CT3 of the third conductive patterns COP3 and the cut-away portions CT4 of the fourth conductive patterns COP4. For example, the cut-away portion CT1 of the first conductive pattern COP1 open toward the second direction DR2, and the cut-away portion CT3 of the third conductive pattern COP3 open toward the first direction DR1.

The cut-away portion CT1 of the first conductive pattern COP1 and the cut-away portion CT3 of the third conductive pattern COP3 open toward different mesh openings, and the cut-away portions CT1 of the first conductive pattern COP1 and the cut-away portions CT4 of the fourth conductive patterns COP4 open toward the same mesh opening.

The cut-away portions CT5 and CT6 of the conductive patterns, which are arranged along the second direction DR2 with respect to the first conductive pattern COP1, open toward the same direction as the cut-away portion CT1 of the first conductive pattern COP1. For example, the cut-away portion CT5 of the conductive pattern disposed at a left side of the first conductive pattern COP1 and the cut-away portion CT6 of the conductive pattern disposed at a right side of the first conductive pattern COP1 each open toward the second direction DR2 and toward a mesh opening disposed at a right side thereof.

Cut-away portions CT7 and CT8 of conductive patterns, which are arranged along the first direction DR1 with respect to the third conductive pattern COP3, open toward the same direction as the cut-away portion CT3 of the first conductive pattern COP3. For example, the cut-away portion CT7 of the conductive pattern disposed at a lower side of the third conductive pattern COP3 and the cut-away portion CT8 of the conductive pattern disposed at an upper side of the third conductive pattern COP3 each open toward the first direction DR1 and toward a mesh opening disposed at the upper side thereof.

Referring to FIG. 12B, in an embodiment, a cut-away portion CT1 of a first conductive pattern COP1 and a cut-away portion CT2 of a second conductive pattern COP2, which are arranged along the first direction DR1, open respectively toward opposite directions. For example, the cut-away portion CT1 of the first conductive pattern COP1 opens leftward toward a mesh opening disposed at a left side of the first conductive pattern COP1, and the cut-away portion CT2 of the second conductive pattern COP2 opens rightward toward a mesh opening disposed at a right side of the second conductive pattern COP2.

A cut-away portion CT3 of a third conductive pattern COP3 and a cut-away portion CT4 of a fourth conductive pattern COP4, which are arranged along the second direction DR2, open respectively toward opposite directions. For example, the cut-away portion CT3 of the third conductive pattern COP3 opens downward toward a mesh opening disposed at a lower side of the third conductive pattern COP3, and the cut-away portion CT4 of the fourth conductive pattern COP4 opens upward toward a mesh opening disposed at an upper side of the fourth conductive pattern COP4. However, the directions toward which the cut-away portions CT1, CT2, CT3, and CT4 open and the shapes of the cut-away portions CT1, CT2, CT3, and CT4 can change depending on which mesh opening is used as the center opening.

The cut-away portion CT1 of the first conductive pattern COP1 opens toward a different mesh opening from the mesh openings toward which each of the cut-away portions CT2, CT3, and CT4 of the second, third, and fourth conductive patterns COP2, COP3, and COP4 opens. The cut-away portions CT1, CT2, CT3 and CT4 of the first, second, third and fourth conductive patterns COP1, COP2, COP3 and COP4, respectively, each face a different mesh opening.

Among the cut-away portions CT5 and CT6 of the conductive patterns arranged in the second direction DR2 with the first conductive pattern COP1, one cut-away portion opens in a same direction as the cut-away portion CT1 of the first conductive pattern COP1, and the other cut-away portion opens in a direction opposite to that of the cut-away portion CT of the first conductive pattern COP1. For example, the cut-away portion CT5 of the conductive pattern disposed at a left side of the first conductive pattern COP1 faces the cut-away portion CT1 of the first conductive pattern COP1 and opens in an opposite direction toward the same mesh opening as the cut-away portion CT1 of the first conductive pattern COP1. The cut-away portion CT6 of the conductive pattern disposed at a right side of the first conductive pattern COP1 faces away from the cut-away portion CT1 of the first conductive pattern COP1 and opens in a same direction as the cut-away portion CT1 and toward the mesh opening disposed at the right side thereof.

Among cut-away portions CT7 and CT8 of conductive patterns arranged along the first direction DR1 with the third conductive pattern COP3, one cut-away portion opens toward a same direction as the cut-away portion CT3 of the third conductive pattern COP3, and the other cut-away portion opens in a direction opposite to that of the cut-away portion CT3 of the third conductive pattern COP3. For example, the cut-away portion CT7 of the conductive pattern disposed at a lower side of the third conductive pattern COP3 faces the cut-away portion CT3 of the third conductive pattern COP3 and opens in an opposite direction toward the same mesh opening as the cut-away portion CT3 of the third conductive pattern COP3. The cut-away portion CT8 of the conductive pattern disposed at an upper side of the third conductive pattern COP3 faces away from the cut-away portion CT3 of the third conductive pattern COP3 and in a same direction as the cut-away portion CT3 toward the mesh opening disposed at the upper side thereof.

Referring to FIG. 12C, in an embodiment, a cut-away portion CT1 of a first conductive pattern COP1 and a cut-away portion CT2 of a second conductive pattern COP2, which are arranged along the first direction DR1, open toward the same direction. For example, each of the cut-away portion CT1 of the first conductive pattern COP1 and the cut-away portion CT2 of the second conductive pattern COP2 opens leftward toward a mesh opening disposed at a left side thereof.

A cut-away portion CT3 of a third conductive pattern COP3 and a cut-away portion CT4 of a fourth conductive pattern COP4, which are arranged along the second direction DR2, open respectively toward opposite directions. For example, the cut-away portion CT3 of the third conductive pattern COP3 opens downward toward a mesh opening disposed at a lower side of the third conductive pattern COP3, and the cut-away portion CT4 of the fourth conductive pattern COP4 opens upward toward a mesh opening disposed at an upper side of the fourth conductive pattern COP4, or vice versa. However, the directions toward which the cut-away portions CT1, CT2, CT3, and CT4 open and the shapes of the cut-away portions CT1, CT2, CT3, and CT4 can changed depending on which mesh opening is used as the center opening.

Each of the cut-away portions CT5 and CT6 of the conductive patterns arranged along the second direction DR2 with the first conductive pattern COP1 opens toward the same direction as the cut-away portion CT1 of the first conductive pattern COP1. For example, each of the cut-away portions CT5 and CT6 of the conductive patterns respectively disposed at left and right sides of the first conductive pattern COP1 opens leftward toward a mesh opening disposed at a left side thereof.

Among cut-away portions CT7 and CT8 of conductive patterns arranged along the first direction DR1 with the third conductive pattern COP3, one cut-away portion opens toward a same direction as the cut-away portion CT3 of the third conductive pattern COP3, and the other cut-away portion opens toward a opposite direction to the cut-away portion CT3 of the third conductive pattern COP3.

However, the first sensor portions SP1 shown in FIGS. 12A to 12C are merely examples, and embodiments are not limited thereto. The mesh pattern MP of embodiments of the present disclosure are not particularly limited as long as the mesh pattern MP includes the integrally connected conductive patterns COP, the cut-away portions CT respectively formed therein, and the mesh lines ML that connect the conductive patterns COP.

FIGS. 13A to 13E are enlarged plan views of first sensor portions SP1 that correspond to an area AA of FIG. 8 according to embodiments of the present disclosure. The first sensor portions SP1 shown in FIGS. 13A to 13E include substantially the same configurations as those of embodiments described above except for a shape of conductive patterns COP. In FIGS. 13A to 13E, the same reference numerals denote the same elements described above, and thus, detailed descriptions of the same elements will be omitted.

For the convenience of description, in FIGS. 13A to 13E, one of the second mesh openings OP-M2 will be described as a representative example of a center opening, and reference numerals of components are indicated based on the center opening.

As shown in FIG. 10C, in an embodiment, one cut-away portion CT is formed in each of the conductive patterns COP, however, embodiments are not limited thereto. According to an embodiment, at least one of the conductive patterns COP includes two or more cut-away portions formed therein. This will be described in detail with reference to FIGS. 13A to 13E.

Figure 13A:
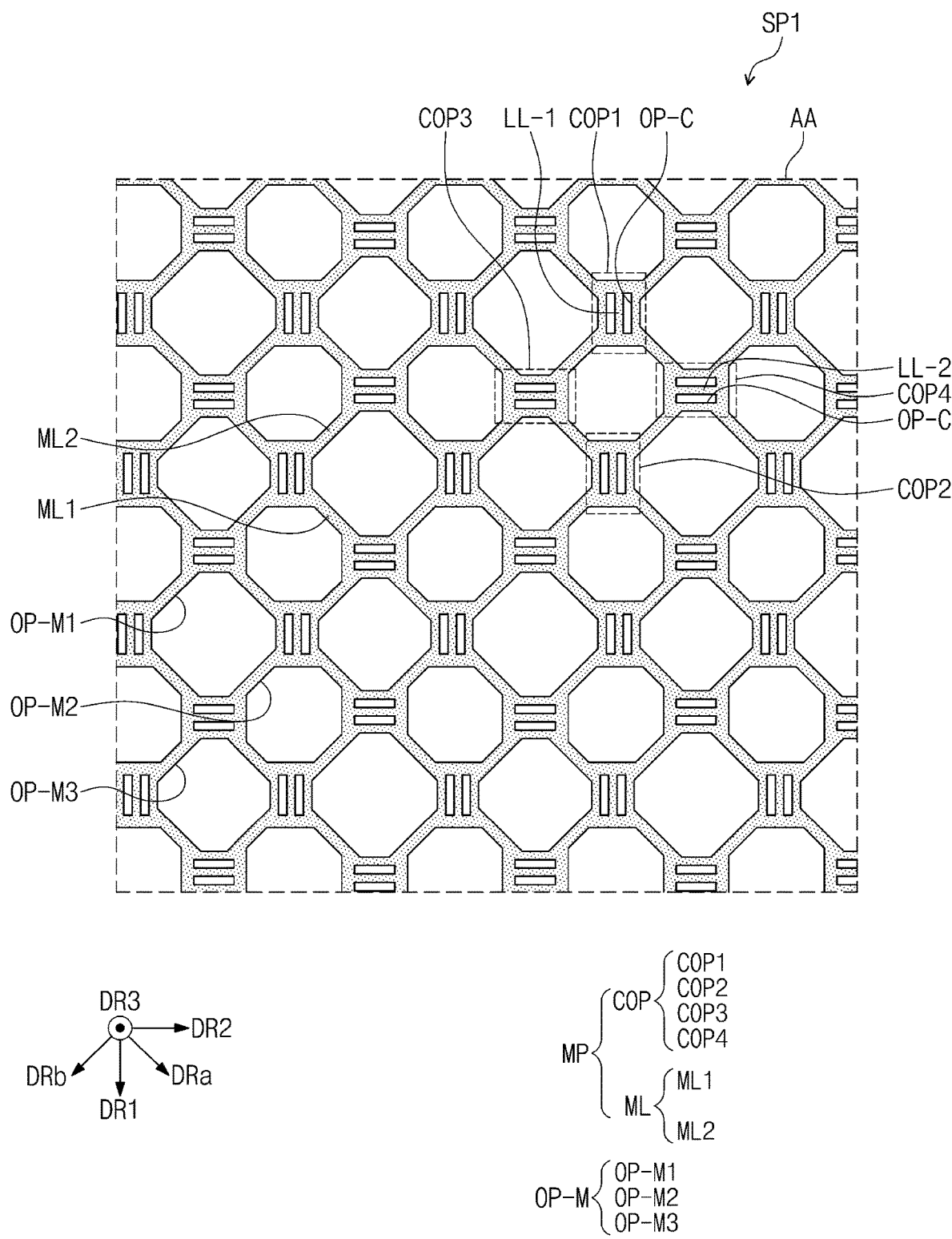
FIGS. 13A, 13B, 13C, 13D and 13E are enlarged plan views of a sensor portion that corresponds to an area AA of FIG. 8 according to embodiments of the present disclosure.

FIG. 13A shows conductive patterns COP in which no cut-away portion CT is formed. Referring to FIG. 13A, in an embodiment, each of the conductive patterns COP in which no cut-away portion CT is formed includes a plurality of lines that form a plurality of closed lines when viewed in a plan view. FIG. 13A shows the conductive patterns COP as including three lines that extend in the same direction as a representative example. However, the number of the lines in the conductive patterns COP is not limited thereto, and may be less than or greater than three.

Referring to FIG. 13A, in an embodiment, each of a first conductive pattern COP1 and a second conductive pattern COP2 includes three lines LL-1, hereinafter referred to as fourth lines, that extend in the second direction DR2. Each of a third conductive pattern COP3 and a fourth conductive pattern COP4 includes three lines LL-2, hereinafter referred to as fifth lines, that extend in the first direction DR1.

Referring to FIG. 13A, a plurality of cross openings OP-C are formed in one conductive pattern COP. The above descriptions on the cross opening OP-C are applicable to the cross openings OP-C in FIG. 13A. The cross openings OP-C in the first conductive pattern COP1 are spaced apart from each other in the second direction DR2 with the fourth line LL-1 interposed therebetween. The cross openings OP-C in the third conductive pattern COP3 are spaced apart from each other in the first direction DR1 with the fifth line LL-2 interposed therebetween.

Figure 13B:
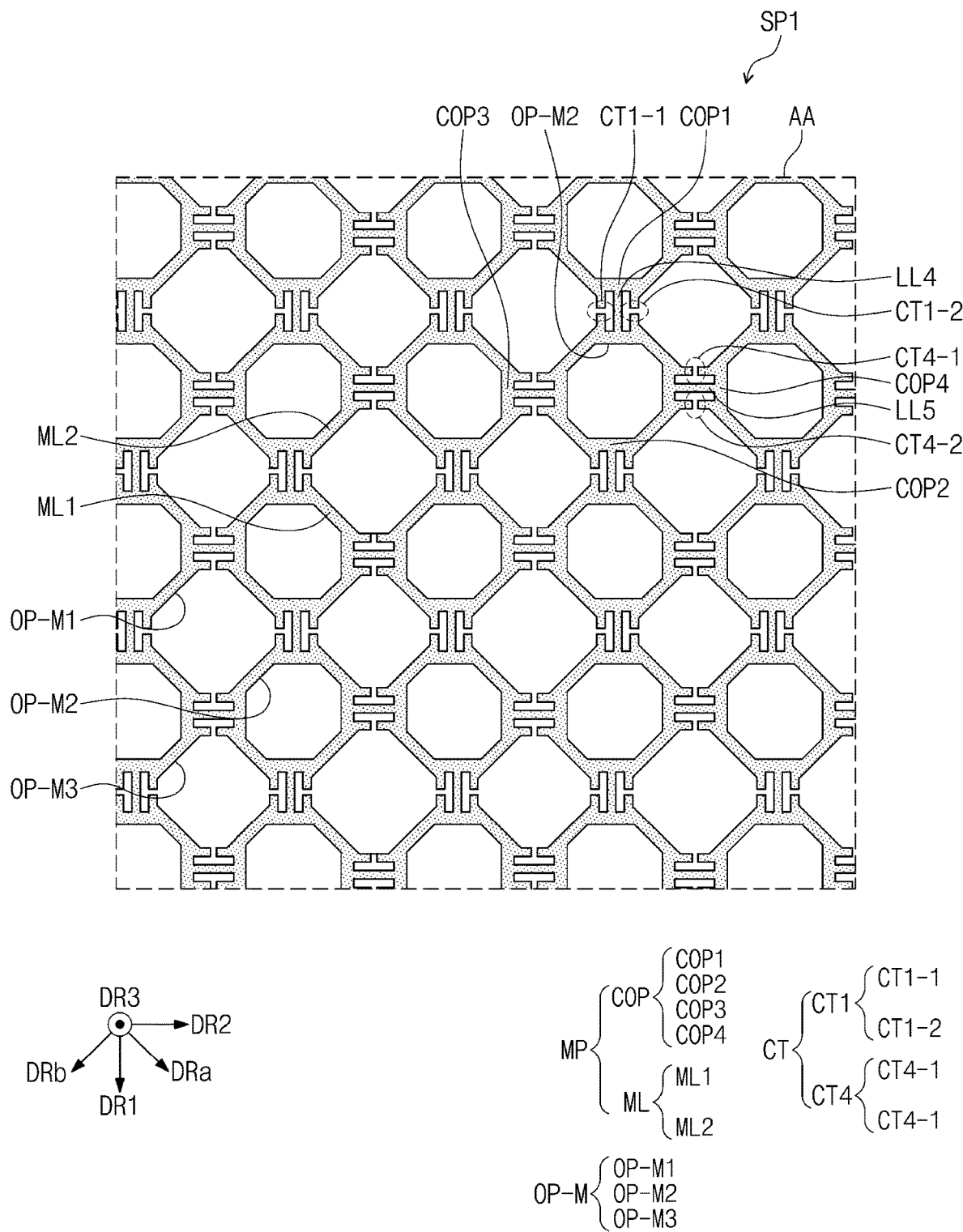
Figure 13C:
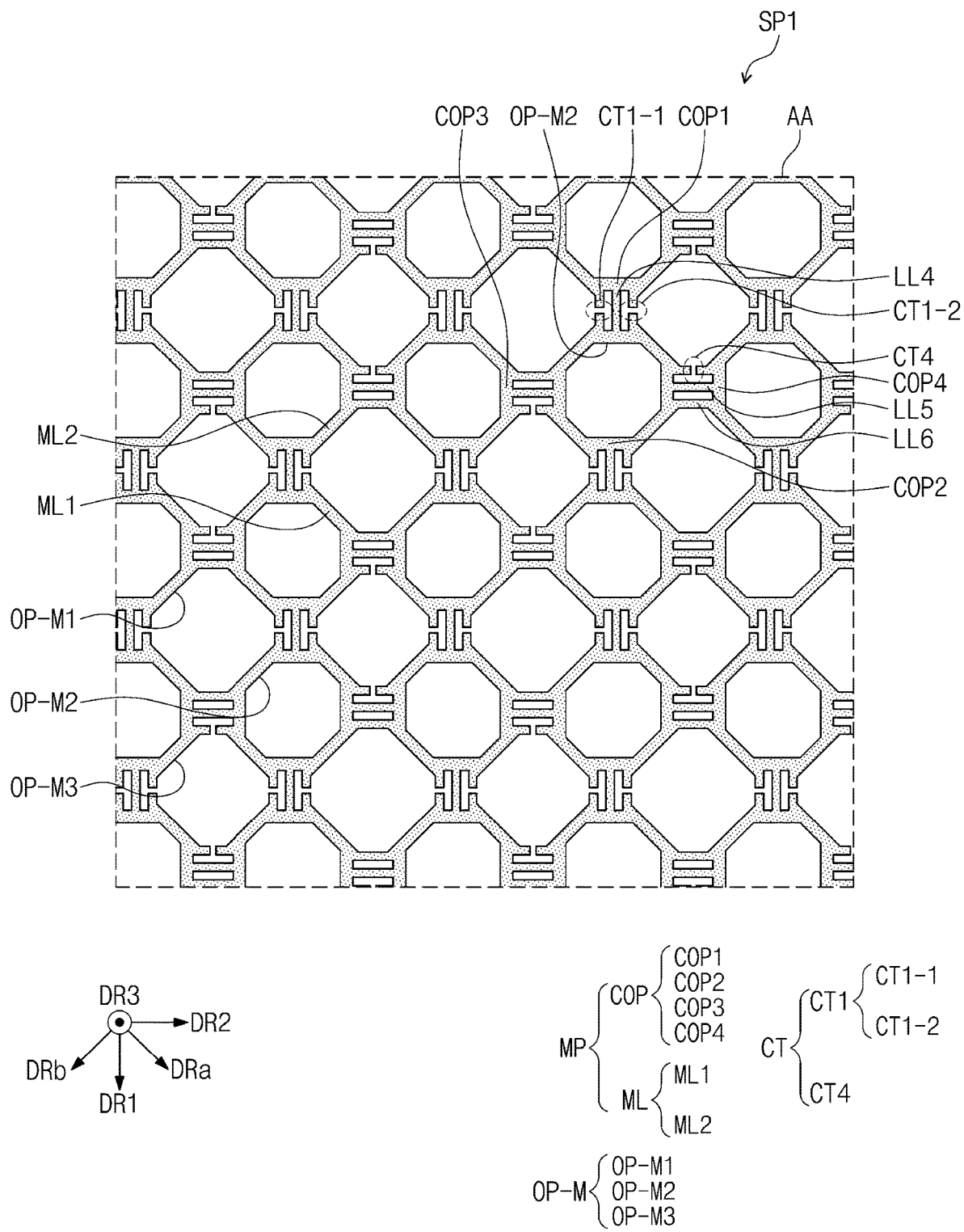
Figure 13D:
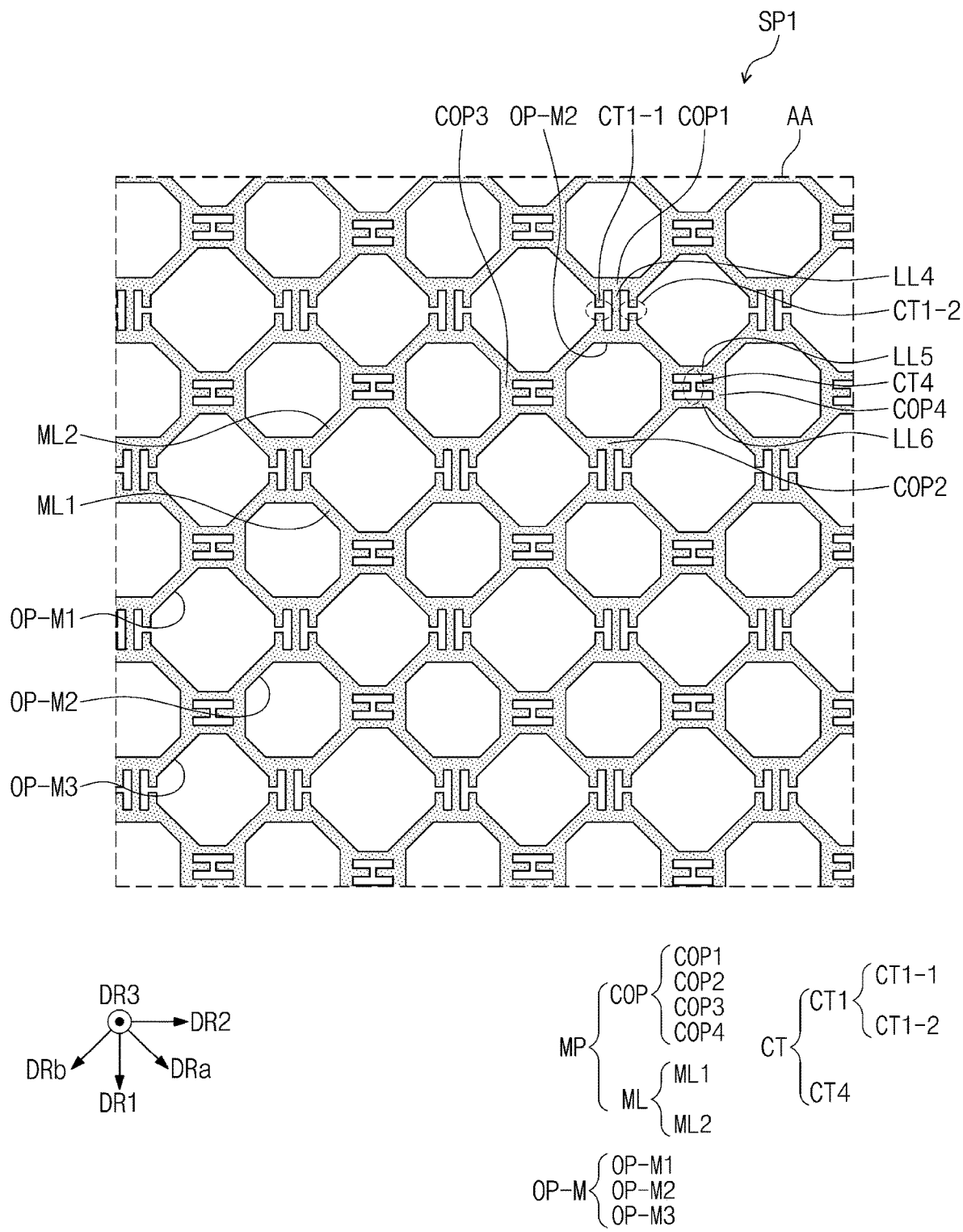

FIGS. 13B to 13D are plan views that show the first sensor portions SP1 after the cut-away portion CT is formed in a mesh pattern MP of FIG. 13A and show various embodiments according to a position at which the cut-away portion CT is formed. FIG. 13B shows conductive patterns COP each in which two cut-away portions CT are formed that open toward different mesh openings. FIGS. 13C and 13D show the first sensor portions SP1 in which two cut-away portions CT are formed in some of the conductive patterns COP.

Referring to FIG. 13B, in an embodiment, each of first, second, third, and fourth conductive patterns COP1, COP2, COP3, and COP4 includes a plurality of cut-away portions CT formed therein.

A plurality of cut-away portions CT1 of the first conductive pattern COP1 include a first cut-away portion CT1-1 and a second cut-away portion CT1-2. The first cut-away portion CT1-1 and the second cut-away portion CT1-2 of the first conductive pattern COP1 face opposite directions and open toward different mesh openings. The first cut-away portion CT1-1 of the first conductive pattern COP1 open leftward toward the mesh opening disposed at a left side of the first conductive pattern COP1, and the second cut-away portion CT1-2 of the first conductive pattern COP1 open rightward toward the mesh opening disposed at a right side of the first conductive pattern COP1. At least one fourth line LL-1 remains in the first conductive pattern COP1.

A plurality of cut-away portions CT4 of the fourth conductive pattern COP4 include a first cut-away portion CT4-1 and a second cut-away portion CT4-2 that face opposite directions and open toward different mesh openings. The first cut-away portion CT4-1 of the fourth conductive pattern COP4 opens upward toward the mesh opening disposed at an upper side of the fourth conductive pattern COP4, and the second cut-away portion CT4-2 of the fourth conductive pattern COP4 opens downward toward the mesh opening disposed at a lower side of the fourth conductive pattern COP4. At least one fifth line LL-2 remains in the fourth conductive pattern COP4.

The first cut-away portion CT1-1 of the first conductive pattern COP1 and one of the cut-away portions of the third conductive pattern COP3 open toward the same mesh opening, and the second cut-away portion CT1-2 of the first conductive pattern COP1 and the first cut-away portion CT4-1 of the fourth conductive pattern COP4 open toward the same mesh opening. The second cut-away portion CT4-2 of the fourth conductive pattern COP4 and one of the cut-away portions of the second conductive pattern COP2 open toward the same mesh opening. The other cut-away portion of the second conductive pattern COP2 and the other cut-away portion of the third conductive pattern COP3 open toward the same mesh opening.

The first cut-away portion CT1-1 of the first conductive pattern COP1 is formed in a leftmost line of the fourth lines LL-1, and the second cut-away portion CT1-2 of the first conductive pattern COP1 is formed in a rightmost line of the fourth lines LL-1. No cut-away portion is formed in a centermost fourth line LL4 of the fourth lines LL-1.

The centermost fourth line LL4 in which no cut-away portion CT1 is formed is connected to first mesh lines ML1 and second mesh lines ML2. The first cut-away portion CT1-1 and the second cut-away portion CT1-2 of the first conductive pattern COP1 are spaced apart in the second direction DR2 from each other with the centermost fourth line LL4 interposed therebetween.

Similarly, the first cut-away portion CT4-1 of the fourth conductive pattern COP4 is formed in an uppermost line of the fifth lines LL-2, and the second cut-away portion CT4-2 of the fourth conductive pattern COP4 is formed in a lowermost line of the fifth lines LL-2. No cut-away portion is formed in a centermost fifth line LL5 of the fifth lines LL-2.

The centermost fifth line LL5 in which no cut-away portion CT4 is formed is connected to the first mesh lines ML1 and the second mesh lines ML2. The first cut-away portion CT4-1 and the second cut-away portion CT4-2 of the fourth conductive pattern COP4 are spaced apart in the first direction DR1 from each other with the centermost fifth line LL5 interposed therebetween.

However, embodiments are not limited thereto. For example, according to other embodiment, the cut-away portions CT formed in one conductive pattern COP open toward same mesh openings. For example, with respect to the first conductive pattern COP1, the first cut-away portion CT1-1 of the first conductive pattern COP1 is formed in the leftmost line of the fourth lines LL-1, and the second cut-away portion CT1-2 of the first conductive pattern COP1 is formed in the centermost line of the fourth lines LL-1. Accordingly, the first cut-away portion CT1-1 and the second cut-away portion CT1-2 of the first conductive pattern COP1 respectively open toward the mesh opening disposed at the left side of the first conductive pattern COP1.

Referring to FIGS. 13C and 13D, in an embodiment, a first conductive pattern COP1 includes a plurality of cut-away portions CT1, i.e., CT1-1 and CT1-2. Details of the cut-away portions CT1 described with reference to FIG. 13B are applicable to the cut-away portions CT1, i.e., CT1-1 and CT1-2 of the first conductive pattern COP1 shown in FIG. 13C. A second conductive pattern COP2, which is arranged along the first direction DR1 with the first conductive pattern COP1, also includes a plurality of cut-away portions formed therein, similar to those of the first conductive pattern COP1, however, embodiments are not limited thereto. According to an embodiment, one cut-away portion is formed in each of the first conductive pattern COP1 and the second conductive pattern COP2.

A fourth conductive pattern COP4 includes one cut-away portion CT4 formed therein. A third conductive pattern COP3, which is arranged along the second direction DR2 with the fourth conductive pattern COP4, includes one cut-away portion formed therein, however, embodiments are not limited thereto. According to an embodiment, the third conductive pattern COP3 includes a plurality of cut-away portions formed therein.

Referring to FIG. 13C, in an embodiment, a second cut-away portion CT1-2 of the first conductive pattern COP1 and a cut-away portion CT4 of a fourth conductive pattern COP4 open toward the same mesh opening. One cut-away portion is formed in the third conductive pattern COP3, and the cut-away portion of the third conductive pattern COP3 and the first cut-away portion CT1-1 of the first conductive pattern COP1 open toward different mesh openings. The cut-away portion CT4 of a fourth conductive pattern COP4 and the cut-away portion of the third conductive pattern COP3 open in opposite directions. However, embodiments are not limited thereto.

The conductive patterns COP are not limited to embodiments shown in FIG. 13C. According to an embodiment, each of the conductive patterns COP includes one cut-away portion formed therein. That is, each of the third and fourth conductive patterns COP3 and COP4 includes one cut-away portion as shown in FIG. 13C or FIG. 13D.

Referring to FIG. 13D, in an embodiment, some of cut-away portions CT of conductive patterns COP connect a plurality of cross openings OP-C, shown in FIG. 13A, in one conductive pattern COP. For example, a cut-away portion CT4 of a fourth conductive pattern COP4 separates a centermost fifth line LL2 and opens toward the cross openings OP-C, and the cross openings OP-C connected to each other by the cut-away portion CT4 form an integral cross opening.

The cut-away portion CT4 of the fourth conductive pattern COP4 is formed in one of the fifth lines LL-2. As shown in FIG. 13C, the cut-away portion CT4 of the fourth conductive pattern COP4 is formed in the uppermost line and opens toward the mesh opening disposed at the upper side of the fourth conductive pattern COP4, however, embodiments are not limited thereto. According to an embodiment, the cut-away portion CT4 of the fourth conductive pattern COP4 is formed in the lowermost line and opens toward the mesh opening disposed at the lower side of the fourth conductive pattern COP4. In addition, as shown in FIG. 13D, the cut-away portion CT4 of the fourth conductive pattern COP4 is formed in the centermost fifth line LL-2 and forms an integral cross opening OP-C.

Referring to FIG. 13D, in an embodiment, fifth lines LL5 and LL6 in which no cut-away portion CT4 is formed are connected to first mesh lines ML1 and second mesh lines ML2. The fifth lines LL5 and LL6 are connected to each other to form a closed line.

Figure 13E:
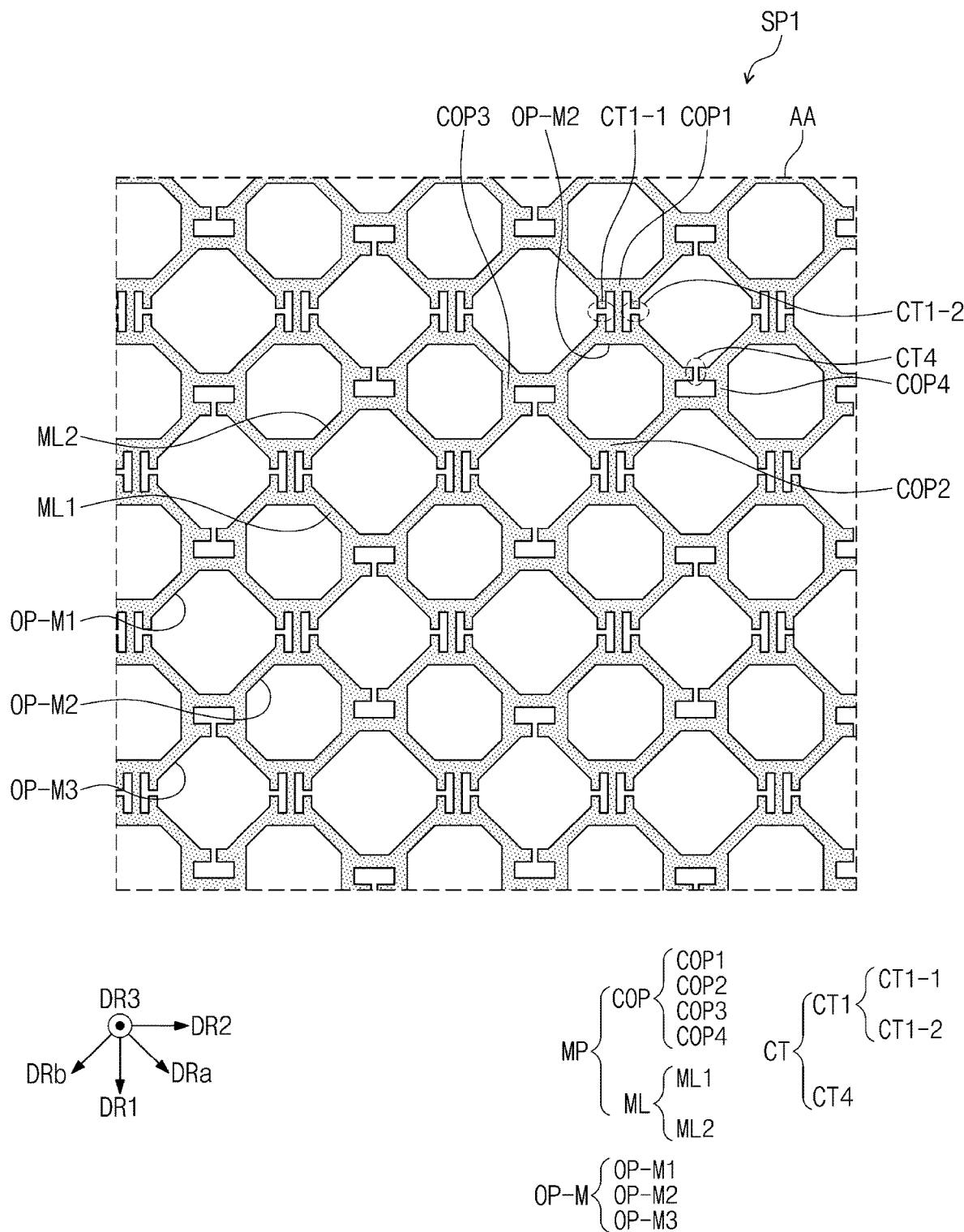

Referring to FIG. 13E, in an embodiment, some of conductive patterns COP include one cut-away portion that opens toward one mesh opening, and other conductive patterns COP include a plurality of cut-away portions that open toward different mesh openings. First and second conductive patterns COP1 and COP2 of FIG. 13E are substantially the same as those of FIG. 13B, and third and fourth conductive patterns COP3 and COP4 of FIG. 13E are substantially the same as those of FIG. 10C.

Although the conductive patterns include one cut-away portion that opens toward one mesh opening, the conductive patterns may have a variety of shapes. For example, each of the fourth conductive pattern COP4 of FIG. 13E and the fourth conductive pattern COP4 of FIG. 13C includes one cut-away portion CT4 formed therein, however, the fourth conductive pattern COP4 of FIG. 13E and the fourth conductive pattern COP4 of FIG. 13C have different shapes. The number of lines in the fourth conductive pattern COP4 of FIG. 13E in which no cut-away portion CT4 is formed differs from the number of the lines in the fourth conductive pattern COP4 of FIG. 13C in which no cut-away portion CT4 is formed.

As described with reference to FIGS. 13A to 13E, the shape of the conductive patterns COP in the mesh pattern MP may have various forms as long as the cut-away portion CT can be formed without insulating the mesh pattern MP and embodiments are not limited to embodiments shown in the figures.

Figure 14:
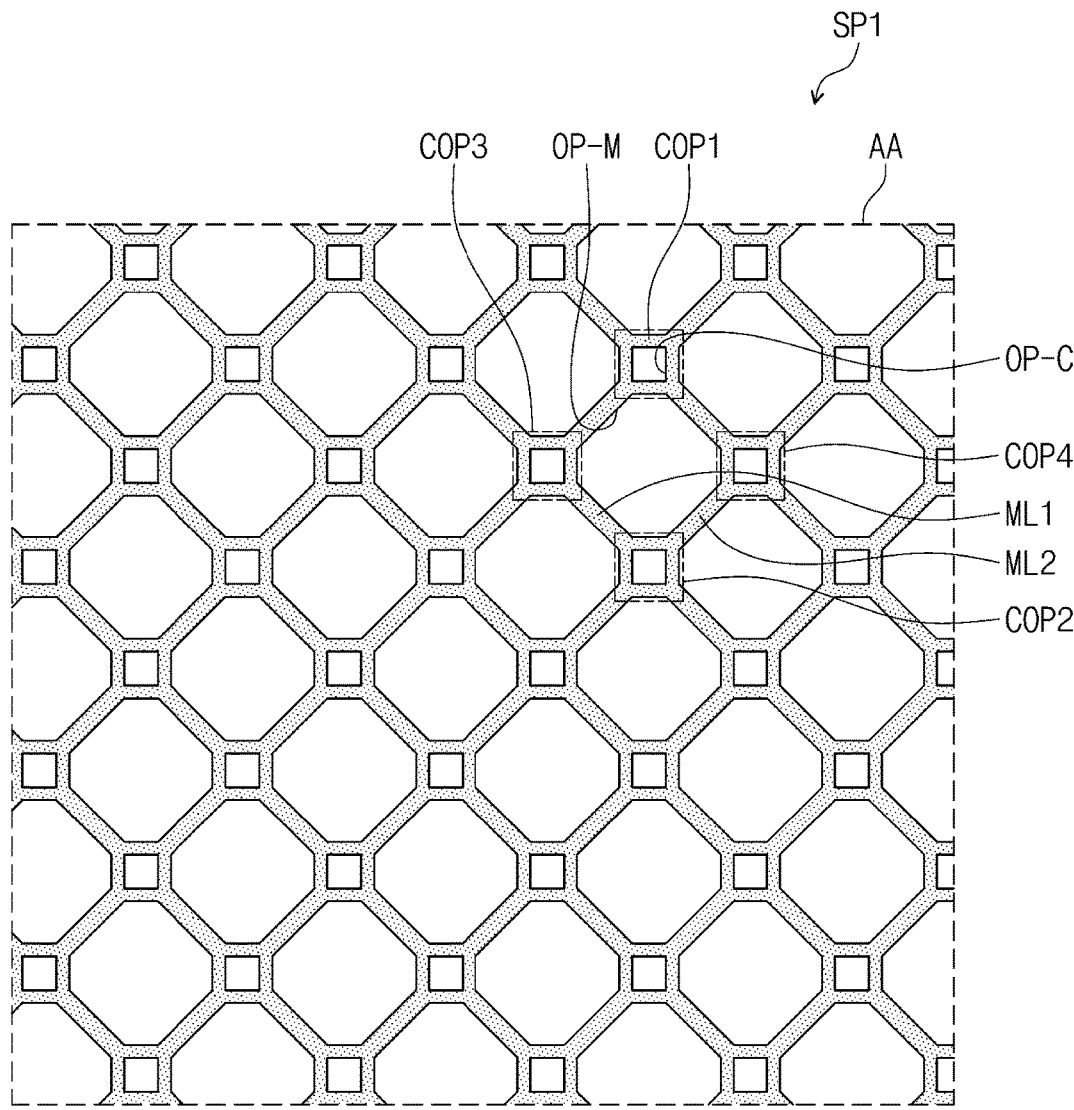
FIG. 14 is an enlarged plan view of a sensor portion that corresponds to an area AA of FIG. 8 according to an embodiment of the present disclosure.
Figure 15A:
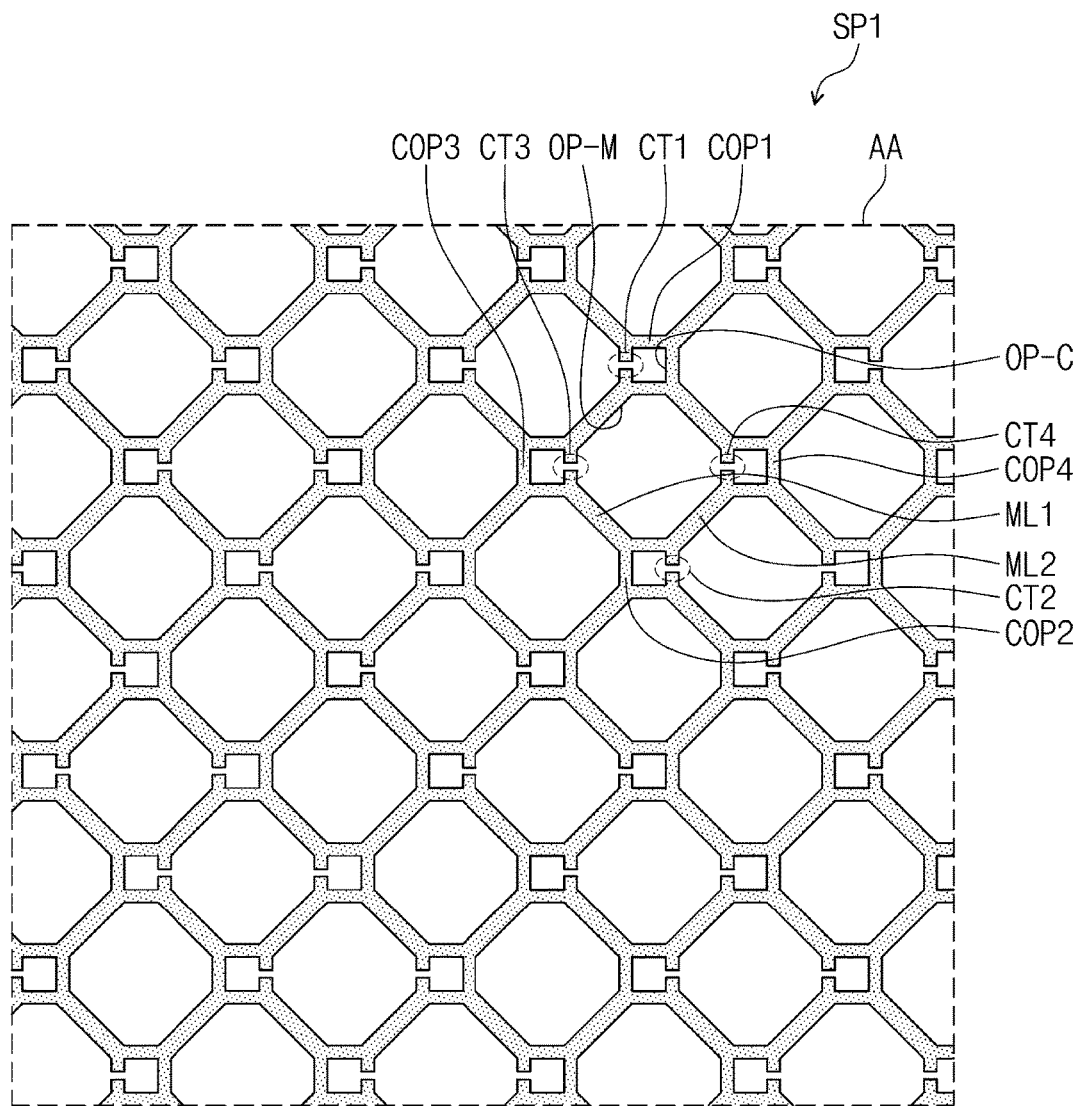
FIGS. 15A, 15B, and 15C are enlarged plan views of a sensor portion that corresponds to an area AA of FIG. 8 according to an embodiment of the present disclosure.
Figure 15B:
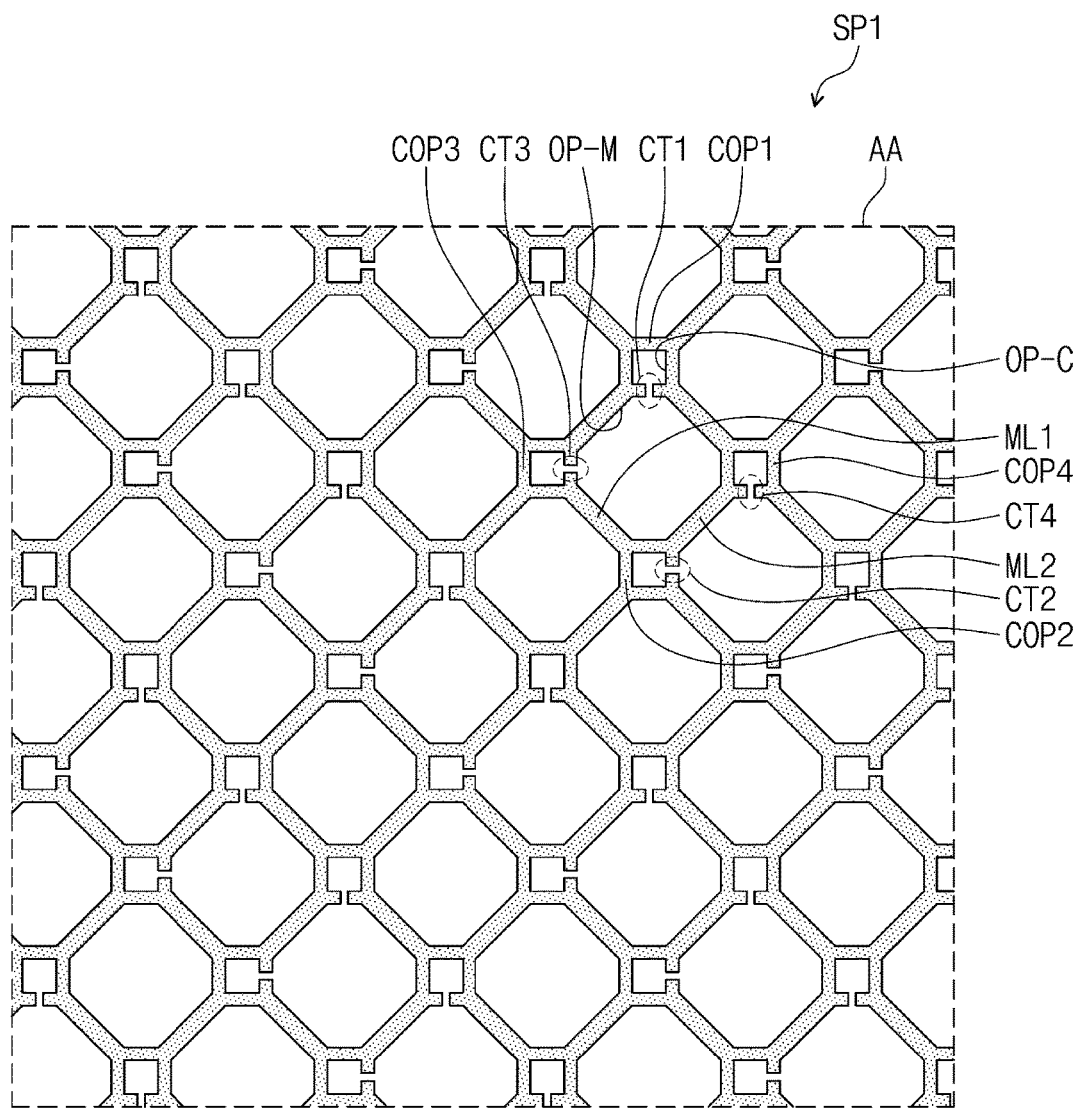
Figure 15C:
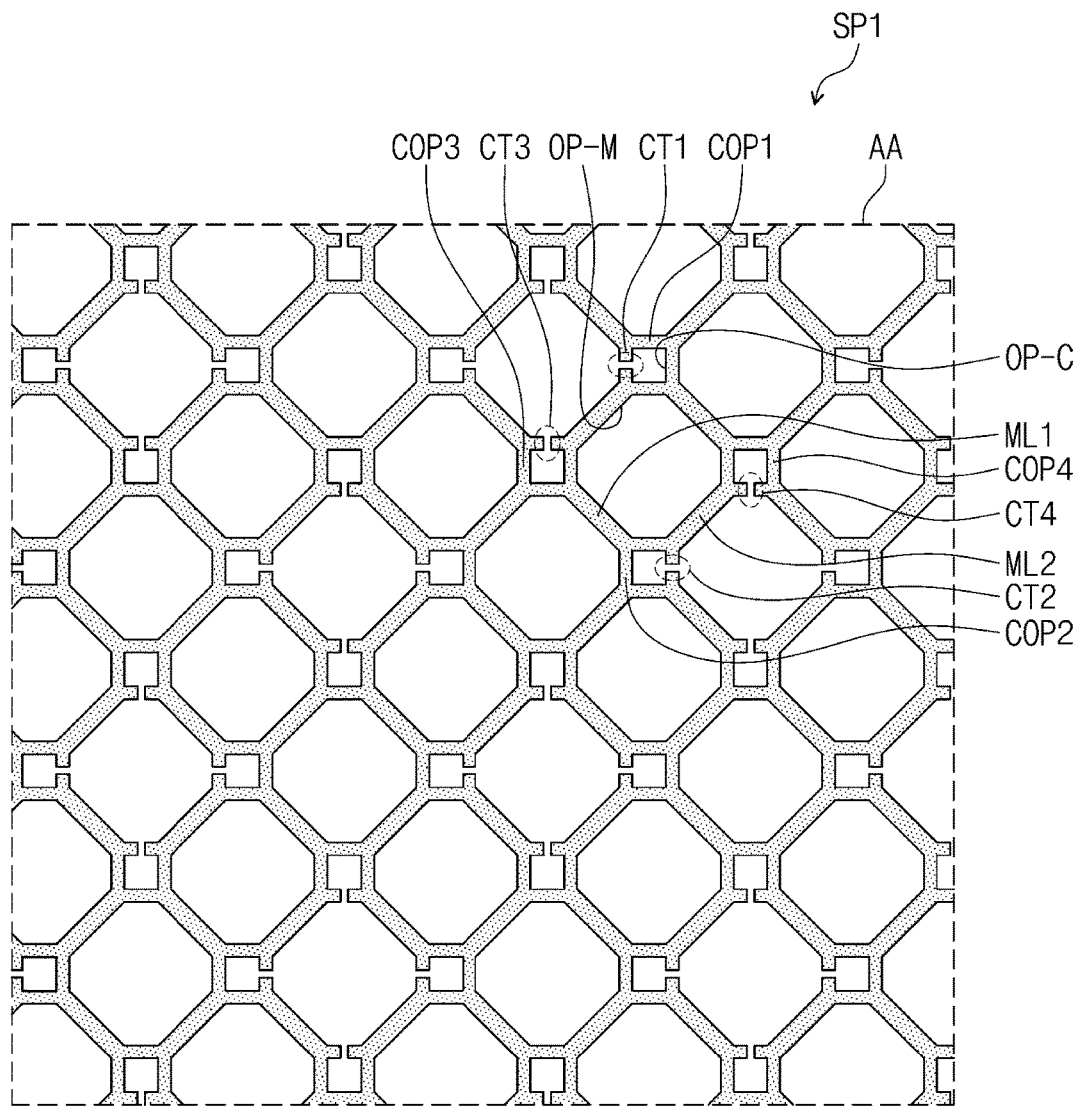

FIGS. 14 and 15A to 15C are enlarged plan views of first sensor portions SP1 that correspond to an area AA of FIG. 8 according to embodiments of the present disclosure. FIG. 14 is a plan view of a mesh pattern MP in which no cut-away portion CT is formed. FIGS. 15A to 15C are plan views that show the mesh pattern MP of FIG. 14 in which the cut-away portion CT is formed. The mesh pattern MP shown in FIG. 14 includes substantially the same configurations as those of an embodiment described with reference to FIG. 10A except for a shape of the mesh pattern MP. In FIG. 14, the same reference numerals denote the same elements in as described above, and thus, detailed descriptions of the same elements will be omitted.

Referring to FIG. 14, in an embodiment, mesh openings OP-M formed in the mesh pattern MP have substantially the same size. Before the cut-away portion CT, shown in FIG. 15A, is formed, cross openings OP-C that are respectively formed in conductive patterns COP have substantially the same size as each other.

Each of the cross openings OP-C includes a first side that extends in the first direction DR1 and a second side that extends in the second direction DR2. The first and second sides in each of the cross openings OP-C have substantially the same length. In addition, the lengths of the first sides of the cross openings OP-C are the same, and the lengths of the second sides of the cross openings OP-C are the same.

FIGS. 15A to 15C show various embodiments of the mesh pattern MP of FIG. 14 after the cut-away portion CT is formed in the mesh pattern MP. The embodiments shown in FIGS. 15A to 15C differ from those described above in positions at which the cut-away portions CT are formed. For convenience of description, in FIGS. 15A to 15C, one of the mesh openings OP-M will be described as a representative example of a center opening, and reference numerals of components are indicated based on the center opening.

Referring to FIG. 15A, in an embodiment, cut-away portions CT1, CT2, CT3, and CT4 of first, second, third, and fourth conductive patterns COP1, COP2, COP3, and COP4, respectively, open toward a direction substantially parallel to the second direction DR2, however, embodiments are should not limited thereto. In an embodiment, the cut-away portions CT1 to CT4 of the first to fourth conductive patterns COP1 to COP4 open toward a direction substantially parallel to the first direction DR1.

The cut-away portion CT1 of the first conductive pattern COP1 and the cut-away portion CT2 of the second conductive pattern COP2, which are arranged in the first direction DR1, open respectively toward opposite directions. For example, the cut-away portion CT1 of the first conductive pattern COP1 opens leftward toward a left mesh opening of the first conductive pattern COP1, and the cut-away portion CT2 of the second conductive pattern COP2 open rightward toward a right mesh opening of the second conductive pattern COP2.

The cut-away portion CT3 of the third conductive pattern COP3 and the cut-away portion CT4 of the fourth conductive pattern COP4, which are arranged in the second direction DR2, open respectively toward directions that either face each other or are opposite to each other. The cut-away portion CT3 of the third conductive pattern COP3 and the cut-away portion CT4 of the fourth conductive pattern COP4 open toward the same mesh opening, however, embodiments are not limited thereto. According to an embodiment, the cut-away portion CT3 of the third conductive pattern COP3 and the cut-away portion CT4 of the fourth conductive pattern COP4 open toward different mesh openings.

Referring to FIG. 15B, in an embodiment, a cut-away portion CT1 of a first conductive pattern COP1 and a cut-away portion CT4 of a fourth conductive pattern COP4 open toward the same direction, and the cut-away portion CT1 of the first conductive pattern COP1 opens toward a direction that crosses an opening direction of each of a cut-away portion CT2 of a second conductive pattern COP2 and a cut-away portion CT3 of a third conductive pattern COP3. For example, the cut-away portions CT1 and CT4 of the first and fourth conductive patterns COP1 and COP4 open toward the first direction DR1, and the cut-away portions CT2 and CT3 of the second and third conductive patterns COP2 and COP3 open toward the second direction DR2.

The cut-away portion CT1 of the first conductive pattern COP1 and the cut-away portion CT4 of the fourth conductive pattern COP4 open toward the same direction. For example, the cut-away portion CT1 of the first conductive pattern COP1 opens downward toward a mesh opening disposed at a lower side of the first conductive pattern COP1, and the cut-away portion CT4 of the fourth conductive pattern COP4 opens downward toward a mesh opening disposed at a lower side of the fourth conductive pattern COP4.

The cut-away portion CT2 of the second conductive pattern COP2 and the cut-away portion CT3 of the third conductive pattern COP3 open toward the same direction. For example, the cut-away portion CT2 of the second conductive pattern COP2 opens rightward toward a mesh opening disposed at a right side of the second conductive pattern COP2, and the cut-away portion CT3 of the third conductive pattern COP3 opens rightward toward a mesh opening disposed at a right side of the third conductive pattern COP3.

Referring to FIG. 15C, in an embodiment, a cut-away portion CT1 of a first conductive pattern COP and a cut-away portion CT2 of a second conductive pattern COP2 open toward opposite directions, and the cut-away portion CT1 of the first conductive pattern COP1 opens toward a direction that crosses an opening direction of each of a cut-away portion CT3 of a third conductive pattern COP3 and a cut-away portion CT4 of a fourth conductive pattern COP4.

For example, the cut-away portions CT1 and CT2 of the first and second conductive patterns COP1 and COP2 open respectively toward directions substantially parallel to the second direction DR2, and the cut-away portions CT3 and CT4 of the third and fourth conductive patterns COP3 and COP4 open respectively toward directions substantially parallel to the first direction DR1. In addition, the opening direction of cut-away portion CT1 is opposite to that of cut-away portion CT2, and the opening direction cut-away portion CT3 is opposite to that of cut-away portion CT4.

The cut-away portion CT1 of the first conductive pattern COP1 and the cut-away portion CT3 of the third conductive pattern COP3 open toward the same mesh opening, and the cut-away portion CT2 of the second conductive pattern COP2 and the cut-away portion CT4 of the fourth conductive pattern COP4 open toward the same mesh opening. Accordingly, some mesh openings are faced by four cut-away portions, and other mesh openings have no facing cut-away portions.

The cut-away portions CT1 to CT4 of the first to fourth conductive patterns COP1 to COP4, respectively, open toward the same mesh opening as each other, however, embodiments are not limited thereto. According to an embodiment, the cut-away portions CT1 to CT4 of the first to fourth conductive patterns COP1 to COP4 open toward different mesh openings.

The embodiments shown in FIGS. 15A to 15C are merely examples and are not particularly limited as long as the mesh pattern MP include the conductive patterns COP with cut-away portions CT that open toward the mesh opening OP-M and mesh lines ML that connect the conductive patterns COP.

Figure 16:
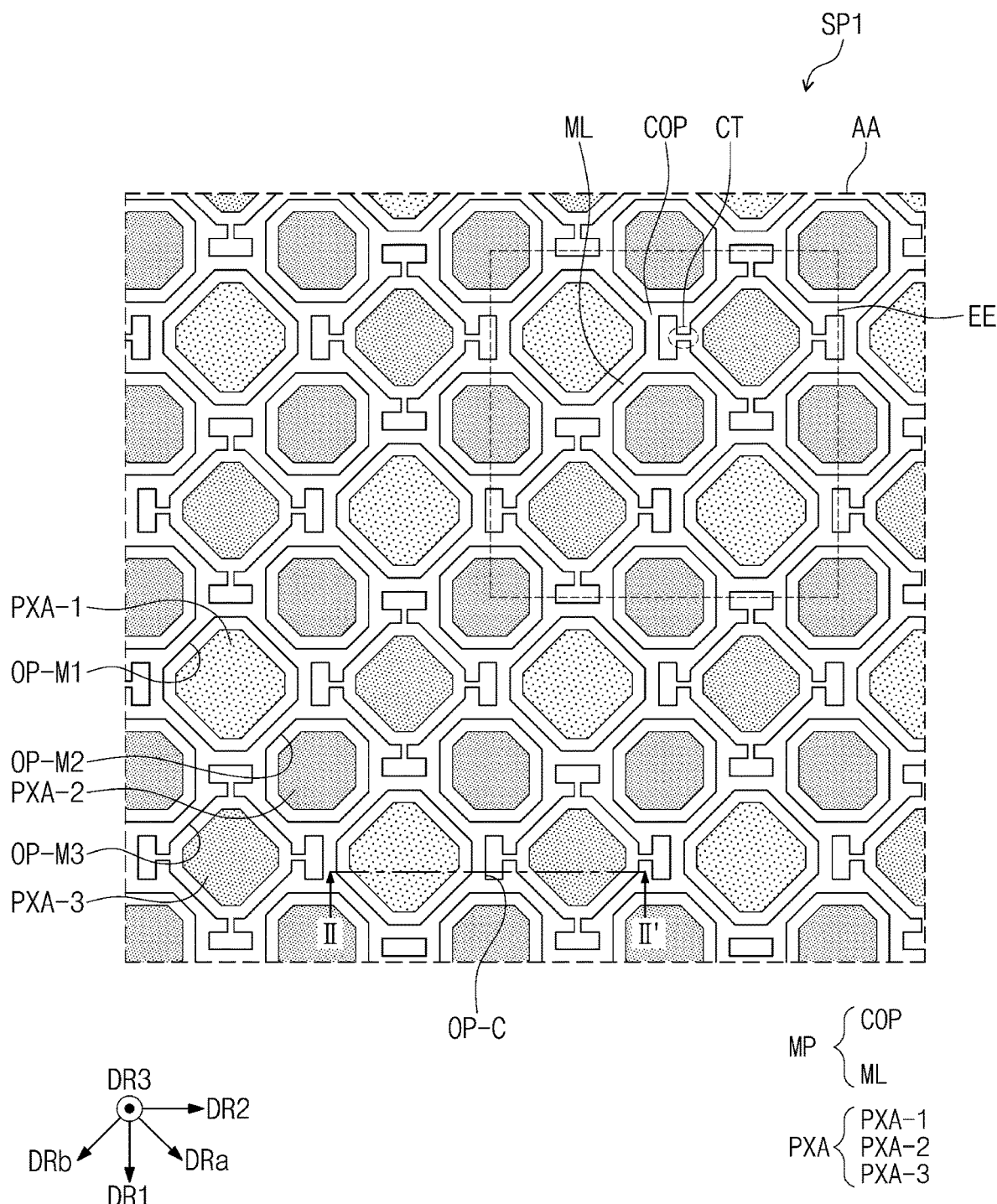
FIG. 16 is an enlarged plan view of a sensor portion that corresponds to an area AA of FIG. 8 according to an embodiment of the present disclosure.
Figure 17:
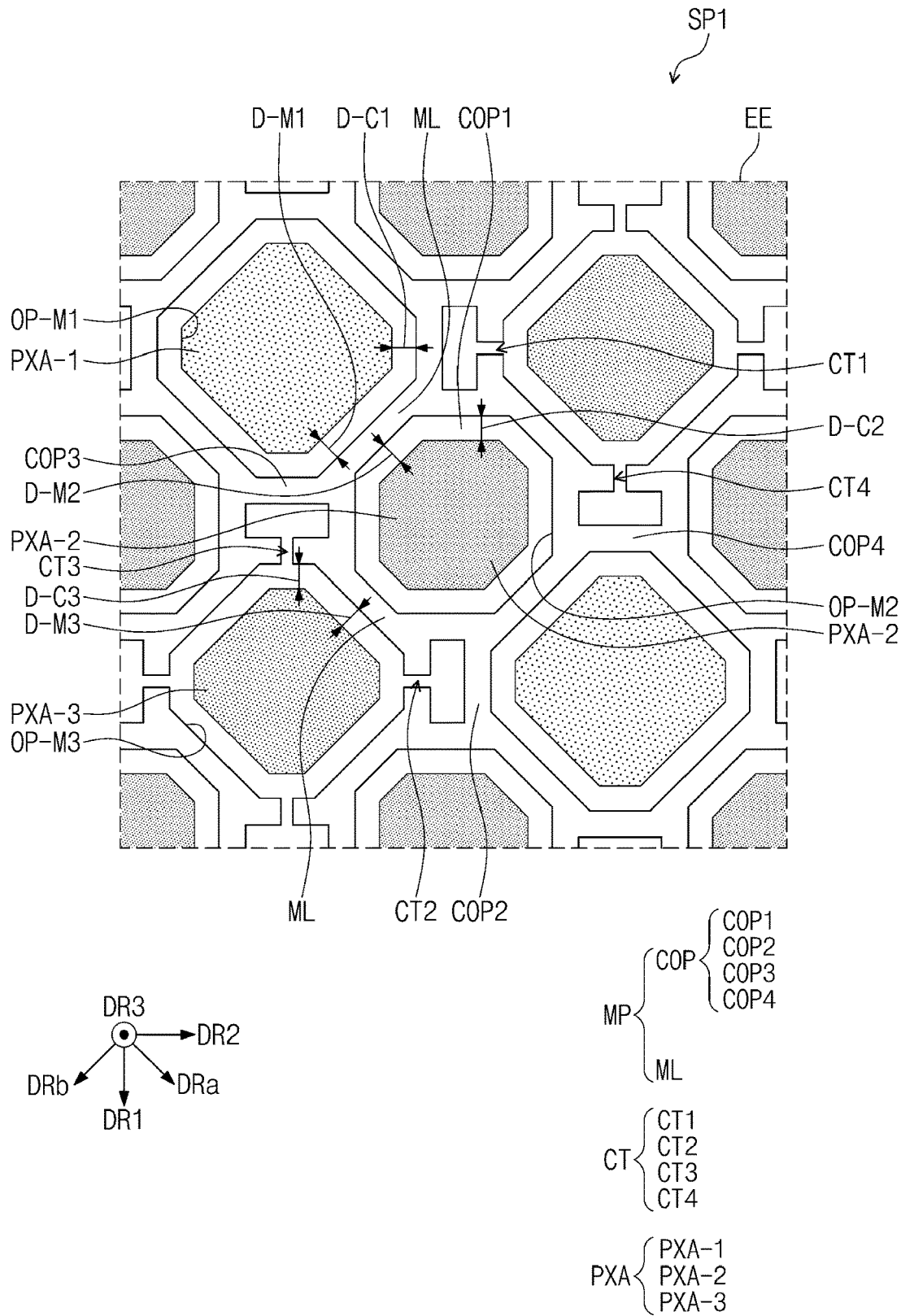
FIG. 17 is an enlarged plan view of a sensor portion that corresponds to an area EE of FIG. 16 according to an embodiment of the present disclosure.
Figure 18:
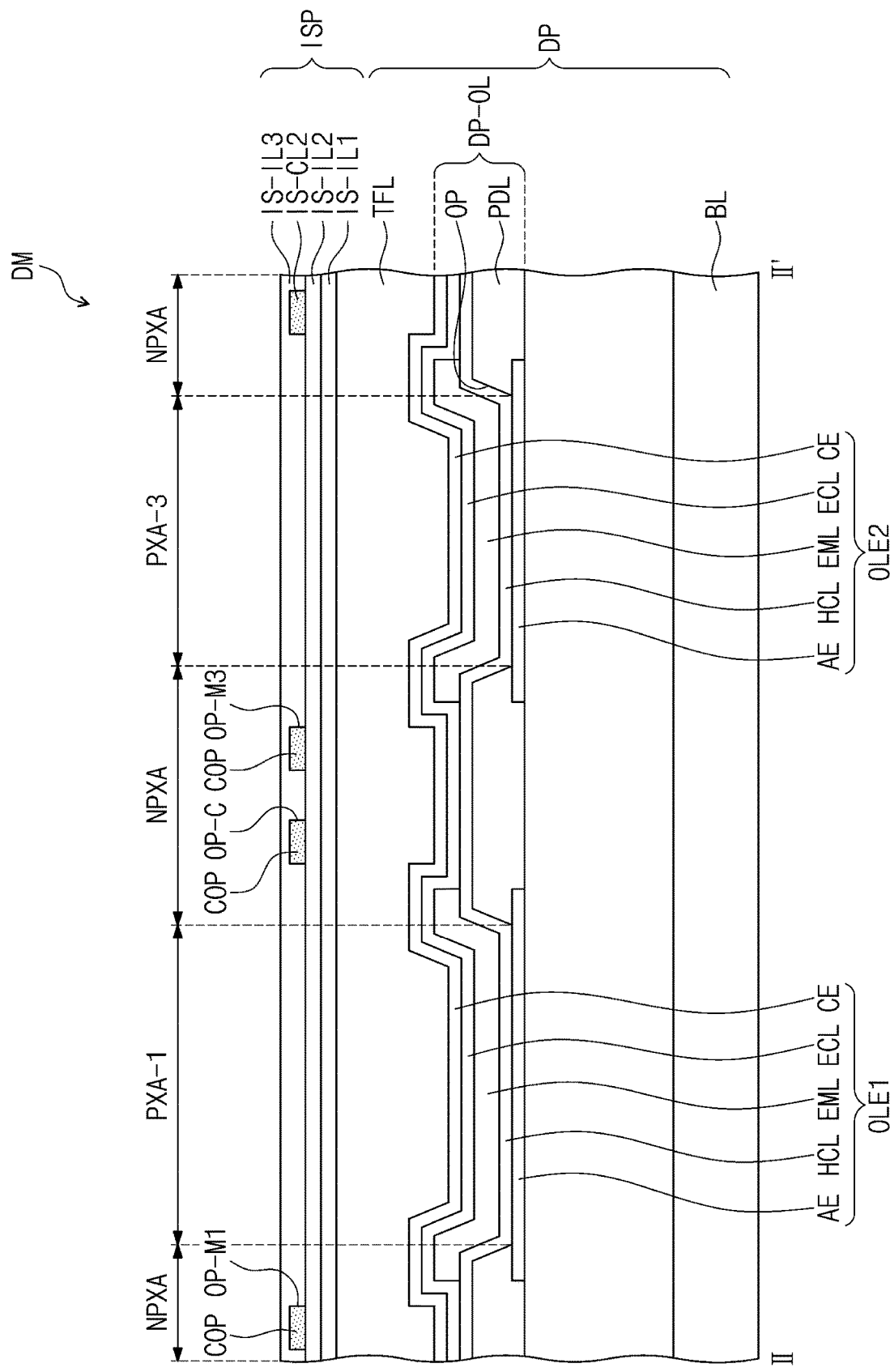
FIG. 18 is a cross-sectional view taken along a line II-II' of FIG. 16 to show a display module according to an embodiment of the present disclosure.

FIG. 16 is an enlarged plan view of a first sensor portion SP1 that corresponds to an area AA of FIG. 8 according to an embodiment of the present disclosure. FIG. 17 is an enlarged plan view of the first sensor portion SP1 that corresponds to an area EE of FIG. 16 according to an embodiment of the present disclosure. FIG. 18 is a cross-sectional view taken along a line II-II' of FIG. 16 to show a display module according to an embodiment of the present disclosure.

According to an embodiment, FIG. 16 shows a plurality of light emitting areas PXA that overlap mesh openings OP-M. The display panel DP includes light emitting areas PXA that respectively correspond to the light emitting elements OLE. As described above in FIG. 4B the light emitting areas PXA correspond to portions of first electrodes AE of the light emitting elements OLE that are exposed through the light emitting openings OP of the pixel definition layer PDL.

Referring to FIG. 16, in an embodiment, the light emitting areas PXA include a first light emitting area PXA-1, a second light emitting area PXA-2, and a third light emitting area PXA-3, which are distinguished from each other according to the color of light generated by the light emitting elements OLE. The first light emitting area PXA-1, the second light emitting area PXA-2, and the third light emitting area PXA-3 have different sizes from each other depending on the color of light emitted therefrom. As shown in FIG. 16, of the light emitting areas PXA, the first light emitting area PXA-1 has the largest size, and the second light emitting area PXA-2 has the smallest size when viewed in a plan view, however, embodiments are not limited thereto. In an embodiment, the sizes of the first light emitting area PXA-1, the second light emitting area PXA-2, and the third light emitting area PXA-3 are the same as each other.

The first light emitting area PXA-1 is an area from which a first color light is emitted, the second light emitting area PXA-2 is an area from which a second color light is emitted, and the third light emitting area PXA-3 is an area from which a third color light is emitted. For example, each of the first, second, and third color light is one of blue, green, or red light.

The mesh openings OP-M overlap the light emitting areas PXA. For example, one mesh opening OP-M overlaps one light emitting area PXA. When viewed in a plan view, a first mesh opening OP-M1 overlaps the first light emitting area PXA-1, a second mesh opening OP-M2 overlaps the second light emitting area PXA-2, and a third mesh opening OP-M3 overlaps the third light emitting area PXA-3.

When viewed in a plan view, the mesh openings OP-M are greater in size than the light emitting areas PXA that overlap therewith. For example, the size of the first mesh opening OP-M1 that overlaps the first light emitting area PXA-1 is greater than the size of the first light emitting area PXA-1.

When viewed in a plan view, each of the mesh openings OP-M has a shape that corresponds to the shape of the overlapping light emitting area PXA. For example, the mesh opening OP-M that overlaps a light emitting area PXA that has a lozenge shape in a plane will have a lozenge shape.

The light emitting areas PXA are arranged in the first cross direction DRa and the second cross direction DRb. The first light emitting area PXA-1 alternate with the second light emitting area PXA-2 in the first cross direction DRa and the second cross direction DRb, and the third light emitting area PXA-3 alternate with the second light emitting area PXA-2 in the first cross direction DRa and the second cross direction DRb. The first light emitting area PXA-1 and the third light emitting area PXA-3 alternately arranged with each other in the first direction DR1 and the second direction DR2.

FIG. 17 is an enlarged plan view of the first sensor portion SP1 based on one second mesh opening OP-M2 shown in FIG. 16. In FIG. 17, the second mesh opening OP-M2 will be described as a representative example of a center opening, and reference numerals of components are indicated based on the center opening for the convenience of description.

Referring to FIG. 17, in an embodiment, the first mesh openings OP-M1 are spaced apart from each other in the first cross direction DRa with the second mesh opening OP-M2 interposed therebetween. The third mesh openings OP-M3 are spaced apart from each other in the second cross direction DRb with the second mesh opening OP-M2 interposed therebetween.

The first conductive pattern COP1 and the second conductive pattern COP2 are arranged in the first direction DR1 with the second mesh opening OP-M2 interposed therebetween, and the third conductive pattern COP3 and the fourth conductive pattern COP4 are arranged in the second direction DR2 with the second mesh opening OP-M2 interposed therebetween.

Each of the first conductive pattern COP1 and the second conductive pattern COP2 is disposed between the first mesh opening OP-M1 and the third mesh opening OP-M3 in the second direction DR2. Each of the third conductive pattern COP3 and the fourth conductive pattern COP4 is disposed between the first mesh opening OP-M1 and the third mesh opening OP-M3 in the first direction DR1.

Each of the mesh lines ML extends in the first cross direction DRa or the second cross direction DRb and connects the conductive patterns COP. One of the mesh lines ML that extends in the first cross direction DRa connects the first conductive pattern COP1 to the fourth conductive pattern COP4, and the other of the mesh lines ML connects the second conductive pattern COP2 to the third conductive pattern COP3. Of the mesh lines ML that extend in the second cross direction DRb, one mesh line connects the first conductive pattern COP1 to the third conductive pattern COP3, and the other mesh line connects the second conductive pattern COP2 to the fourth conductive pattern COP4.

The cut-away portions CT1 to CT4 are formed in the first to fourth conductive patterns COP1 to COP4, respectively. Each of the cut-away portions CT1 to CT4 of the first to fourth conductive patterns COP1 to COP4 opens toward the third mesh opening OP-M3. For example, the cut-away portion CT1 of the first conductive pattern COP1 and the cut-away portion CT4 of the fourth conductive pattern COP4 open toward the same third mesh opening OP-M3. The cut-away portion CT1 of the first conductive pattern COP1 and the cut-away portion CT3 of the third conductive pattern COP3 open toward different third mesh openings OP-M3.

When the third mesh opening OP-M3 corresponds to the center opening, the cut-away portions CT of the conductive patterns COP arranged with the third mesh opening OP-M3 interposed therebetween open toward the same third mesh opening OP-M3 that corresponds to the center opening.

The light emitted from the first light emitting area PXA-1 has a wavelength shorter than a wavelength of the light emitted from the second light emitting area PXA-2. The light emitted from the third light emitting area PXA-3 has a wavelength longer than the wavelength of the light emitted from the second light emitting area PXA-2. For example, the first color light is blue, the second color light is green, and the third color light is red, however, embodiments are not limited thereto.

A reflectance of light at a point where the cut-away portion CT is formed changes depending on the wavelength of light emitted from the light emitting area PXA that overlaps the mesh opening OP-M. The light reflectance is controlled according to where the cut-away portion CT is formed, and thus, the visibility of the input sensor ISP is efficiently reduced.

A center of the mesh openings OP-M corresponds to a center of the overlapping light emitting area PXA. When viewed in a plan view, a separation interval between the light emitting area PXA and the mesh pattern MP is uniform. For example, a shortest separation distance between the light emitting area PXA and the mesh lines ML is substantially the same as a shortest separation distance between the light emitting area PXA and the conductive patterns COP.

Referring to FIG. 17, in an embodiment, a shortest separation interval D-C1 between the first light emitting area PXA-1 that overlaps the first mesh opening OP-M1 and the first conductive pattern COP1 is substantially the same as a shortest separation interval D-M1 between the first light emitting area PXA-1 and the mesh line ML. A shortest separation interval D-C2 between the second light emitting area PXA-2 that overlaps the second mesh opening OP-M2 and the first conductive pattern COP1 is substantially the same as a shortest separation interval D-M2 between the second light emitting area PXA-2 and the mesh line ML. A shortest separation interval D-C3 between the third light emitting area PXA-3 that overlaps the third mesh opening OP-M3 and the third conductive pattern COP3 is substantially the same as a shortest separation interval D-M3 between the third light emitting area PXA-3 and the mesh line ML.

When light emitted from the light emitting area PXA that overlaps the mesh opening OP-M is reflected by the mesh pattern MP, the reflected light influences color change characteristics according to a viewing angle, such as a white angle difference (WAD). According to an embodiment, as the shortest separation distance between the light emitting area PXA and the mesh lines ML is substantially the same as the shortest separation distance between the light emitting area PXA and the conductive patterns COP, a reflection difference of the light according to display area is reduced. Accordingly, a difference in color change characteristics according to the viewing angle is reduced, and a color difference of the emitted light caused by the viewing angle is reduced.

FIG. 18 is a cross-section of the display module DM corresponding to the first light emitting area PXA-1 and the third light emitting area PXA-3. Details of the same components described above are applicable to components shown in FIG. 18.

Referring to FIG. 18, in an embodiment, light emitting elements OLE1 and OLE2 overlap light emitting openings OP of the pixel definition layer PDL, respectively. As shown in FIG. 18, a first electrode AE of a first light emitting element OLE1 exposed through the light emitting opening OP of the pixel definition layer PDL corresponds to the first light emitting area PXA-1, and a first electrode AE of a second light emitting element OLE2 exposed through the light emitting opening OP of the pixel definition layer PDL corresponds to the third light emitting area PXA-3. The first light emitting element OLE1 and the second light emitting element OLE2 emit different color light, however, embodiments are not limited thereto. According to an embodiment, the first light emitting element OLE1 and the second light emitting element OLE2 emit the same color light.

The first sensor portion SP1 of FIG. 16 is formed in a second conductive layer IS-CL2, and the cross-section of FIG. 18 is shown based on this. However, according to an embodiment, the first sensor portion SP1 is formed in the first conductive layer IS-CL1, shown in FIG. 6.

Each of the conductive patterns COP overlaps a non-light-emitting area NPXA. The mesh opening OP-M is formed between the conductive pattern COP and another conductive pattern COP. As shown in FIG. 18, the first mesh opening OP-M1 disposed between the conductive patterns COP overlaps the first light emitting area PXA-1, and the third mesh opening OP-M3 overlaps the third light emitting area PXA-3.

The cross opening OP-C is formed in the conductive pattern COP. The cross opening OP-C of the conductive pattern COP overlaps the non-light-emitting area NPXA. The cut-away portion CT formed in the conductive pattern COP connects the cross opening OP-C to a mesh opening OP-M adjacent to the conductive pattern COP.

Figure 19:
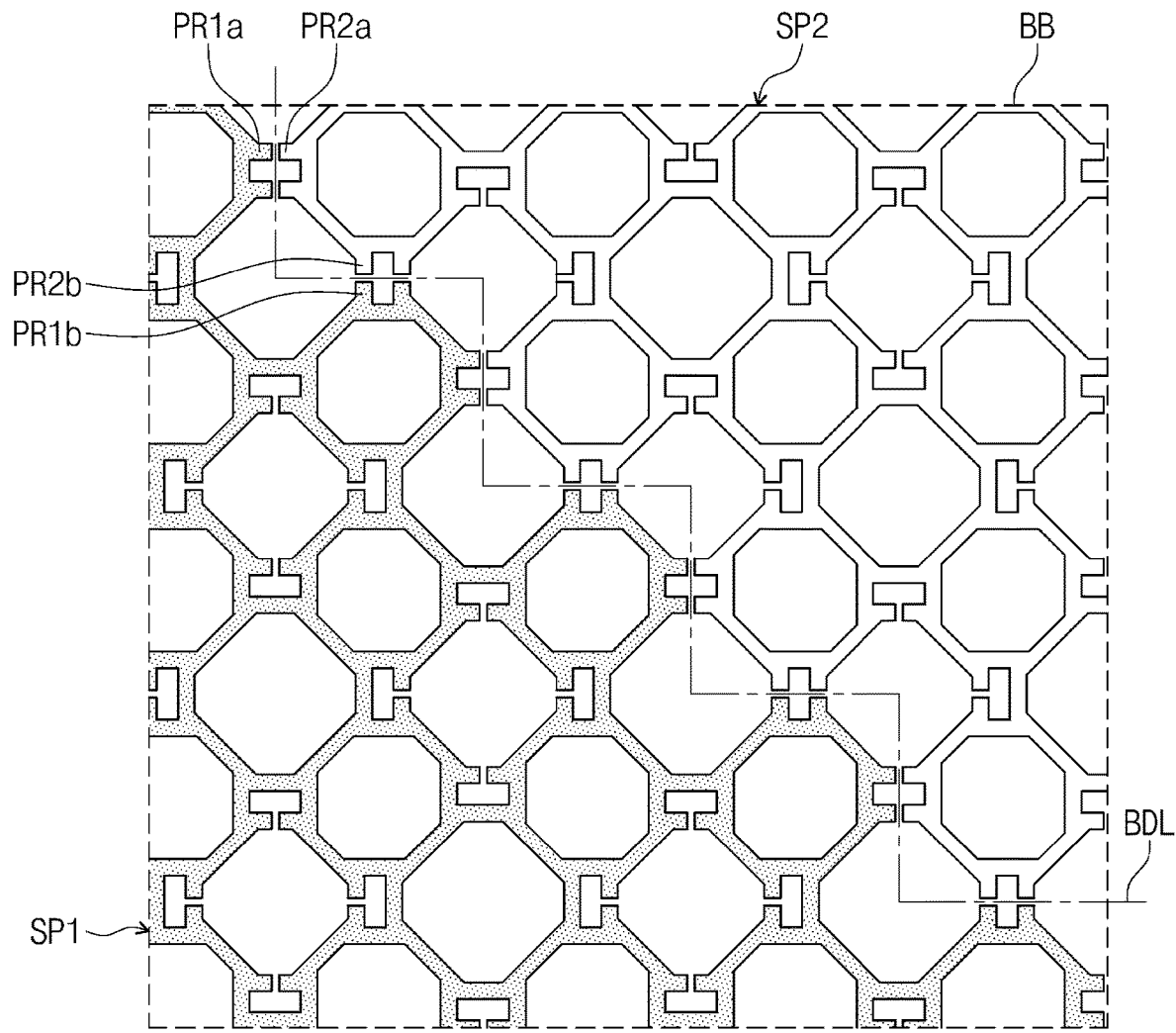
FIG. 19 is an enlarged plan view of a sensor portion that corresponds to an area BB of FIG. 16 according to an embodiment of the present disclosure.

FIG. 19 is an enlarged plan view of sensor portions that correspond to an area BB of FIG. 8 according to an embodiment of the present disclosure. The area BB shown in FIG. 19 corresponds to a boundary area between the first sensor portion SP1 and the second sensor portion SP2. FIG. 19 shows an imaginary boundary line BDL, hereinafter referred to as a boundary line BDL, that determines a boundary between the first sensor portion SP1 and the second sensor portion SP2.

Each of the first sensor portion SP1 and the second sensor portion SP2 include the mesh pattern MP. Details of the mesh pattern MP are described with reference to the area AA of FIG. 8, which corresponds to an inner area of the first sensor portion SP1, and the descriptions thereof are applicable to the second sensor portion SP2.

The mesh pattern MP in the first sensor portion SP1 includes a plurality of protrusion portions PR1 adjacent to the boundary line BDL. The protrusion portions PR1 in the first sensor portion SP1 may be defined as first protrusion portions PR1.

The mesh pattern MP in the second sensor portion SP2 may include a plurality of protrusion portions PR2 adjacent to the boundary line BDL. The protrusion portions PR2 in the second sensor portion SP2 may be defined as second protrusion portions PR2.

The first protrusion portions PR1 are integrally formed with the conductive patterns COP and the mesh lines ML, which are disposed on the same layer. Similarly, the second protrusion portions PR2 are integrally formed with the conductive patterns COP and the mesh line ML, which are included in the mesh pattern MP of the second sensor portion SP2 on the same layer.

The first protrusion portions PR1 are spaced apart from the second protrusion portions PR2 such that the boundary line BDL is formed therebetween. Accordingly, the first sensor portion SP1 and the second sensor portion SP2 are electrically insulated from each other.

The first protrusion portions PR1 and the second protrusion portions PR2 protrude toward each other with the boundary line BDL formed therebetween.

The first protrusion portions PR1 includes a first protrusion PR1*a* that protrudes in the second direction DR2 and a second protrusion PR1*b* that protrudes in the first direction DR1. The second protrusion portions PR2 include a first protrusion PR2*a* that protrudes in the second direction DR2 and a second protrusion PR2*b* that protrudes in the first direction DR1.

The first protrusion PR1*a* of the first protrusion portions PR1 and the first protrusion PR2*a* of the second protrusion portions PR2 protrude toward each other in the second direction DR2. The second protrusion PR1*b* of the first protrusion portions PR1 and the second protrusion PR2*b* of the second protrusion portions PR2 protrude toward each other in the first direction DR1.

A direction in which the boundary line BDL extends changes depending on in which portion of the first sensor portion SP1 and the second sensor portion SP2 the boundary line BDL is defined. FIG. 19 shows the boundary line BDL as extending in the first cross direction DRa and having a zigzag shape as a representative example, however, embodiments are not limited thereto. According to an embodiment, the boundary line BDL may extend in the first cross direction DRa or the second cross direction DRb and has a straight line shape.

According to an embodiment, a mesh pattern includes conductive patterns and mesh lines that are disposed on the same layer and connected to each other to form openings. The conductive patterns are integrally connected with the mesh lines, respectively, and the cut-away portions that open toward a mesh opening are formed in the conductive patterns. Accordingly, a resistance of an input sensor that includes the mesh pattern does not increase, and the mesh pattern of the input sensor is prevented from being viewed. According to an embodiment, the mesh pattern are formed such that the distance between the light emitting area and the mesh pattern becomes uniform, and thus, differences in color change characteristics according to the viewing angle are reduced.

Although embodiments of the present disclosure have been described, it is understood that embodiments of the present disclosure should not be limited to these embodiments but various changes and modifications can be made by one ordinary skilled in the art within the spirit and scope as hereinafter claimed. Therefore, the disclosed subject matter should not be limited to any single embodiment described herein, and the scope of embodiments of the present inventive concept shall be determined according to the attached claims.

What is claimed is:

1. An electronic device, comprising:
a display panel that includes a plurality of light emitting areas and emitting area adjacent to the plurality of light emitting areas; and
an input sensor disposed on the display panel and that includes a mesh pattern, wherein the mesh pattern comprises:
a plurality of mesh openings formed therein and that overlap the plurality of light emitting areas, respectively; and
a cross opening formed therein and that overlap the non-light emitting area and does not overlap the plurality of light emitting areas;
wherein the mesh pattern includes a cut-away portion that connects the cross opening with a mesh opening adjacent to the cross opening among the plurality of mesh openings.

2. The electronic device of claim 1,
wherein the plurality of mesh openings are arranged along a first direction and a second direction intersecting each other,
the cross opening is provided in plurality, and the plurality of the cross openings are spaced apart from each other in a third direction crossing the first and second directions and a fourth direction crossing the first to third directions with a center opening of the plurality of mesh openings disposed therebetween.

3. The electronic device of claim 2,
wherein the mesh pattern comprises:
a plurality of constructive patterns including the plurality of cross openings formed therein, respectively; and
a plurality of mesh lines disposed along an edge of the center opening and connected to the plurality of conductive patterns.

4. The electronic device of claim 3,
wherein the plurality of conductive patterns comprise:
first and second conductive patterns spaced apart from each other in the third direction wherein the center opening is disposed therebetween; and
third and fourth conductive patterns spaced apart from each other in the fourth direction wherein the center opening is disposed therebetween,
wherein the plurality of mesh lines comprise:
first mesh lines that extend in the first direction and connect the first conductive pattern to the third conductive pattern or connect the second conductive pattern to the fourth conductive pattern; and
second mesh lines that extend in the second direction and connect the first conductive pattern to the fourth conductive pattern or connect the second conductive pattern to the third conductive pattern, and
each of the first to fourth conductive patterns includes the cut-away portion.

5. The electronic device of claim 4, wherein each of the first conductive pattern and the second conductive pattern includes the cut-away portion that opens toward the center opening.

6. The electronic device of claim 5, wherein at least one of the cut-away portion of the third conductive pattern or the cut-away portion of the fourth conductive pattern opens toward the center opening.

7. The electronic device of claim 5, wherein the cut-away portion of the third conductive pattern and the cut-away portion of the fourth conductive pattern open toward mesh openings different from the center opening, and different from each other.

8. The electronic device of claim 4, wherein the cut-away portion of the first conductive pattern and the cut-away portion of the second conductive pattern open toward different openings.

9. The electronic device of claim 3, wherein the plurality of mesh openings include two or more openings that have different sizes, when viewed in a plan view, and
the plurality of mesh openings comprise:
first and second openings that are spaced apart from each other in the first direction wherein the center opening is disposed therebetween; and
third and fourth openings that are spaced apart from each other in the second direction wherein the center opening is disposed therebetween.

10. The electronic device of claim 9, wherein a color of light emitted from a light emitting area that overlaps the center opening is different from a color of light emitted from light emitting areas that overlap the first to fourth openings.

11. The electronic device of claim 9, wherein a same color light is emitted from a light emitting area that overlaps the first opening and a light emitting area that overlaps the second opening.

12. The electronic device of claim 9; wherein cut-away portions of the first to fourth conductive patterns open toward the first opening or the second opening, and a light emitted from a light emitting area that overlaps the center opening has a wavelength shorter than a Wavelength of a light emitted Irwin a emitting area that overlaps the first opening.

13. The electronic device of claim 12, wherein a color of light emitted from the light emitting areas that overlap the third and fourth Openings, respectively, is different from a color of light emitted from light emitting areas that overlap the first and second openings, respectively.

14. The electronic device of claim 9, wherein cut-away portions of the first to fourth conductive patterns open toward the first opening or the second opening, and a size of the center opening is less than a size of the first opening and a size of the second opening, when viewed in a plan view.

15. The electronic device of claim 14, wherein each of a size of the third opening and a size of the fourth opening is greater than the size of the first opening.

16. The electronic device of claim 3, wherein the center opening overlaps one of the plurality of light emitting areas, a shortest separation distance between the one light emitting area and the conductive patterns is equal to a shortest separation distance between the one light emitting area and the mesh lines, when viewed in a plan view.

17. The electronic device of claim 4, wherein at least one of the plurality of conductive patterns includes a plurality of cut-away portions that open toward different mesh openings.

18. The electronic device of claim 4, wherein the plurality of conductive patterns comprise:
at least one first line that extends in the third direction; and
at least one second line and at least one third hue that are substantially parallel to the first line and spaced apart from each other wherein the cut-away portion is formed therebetween in the third direction.

19. The electronic device of claim 2, wherein the mesh pattern includes a plurality of conductive patterns, the plurality of conductive patterns are spaced apart from each other in the third direction and the fourth direction with a center opening of the plurality of mesh openings disposed therebetween, and
two cross openings are thrilled in each of the plurality of conductive patterns.

20. The electronic device of claim 19, wherein the cut-away portion is provided in plurality, each of the plurality of conductive patterns includes at least one cut-away portion, and at least one of the two cross openings formed in each of the plurality of conductive patterns is connected to an adjacent mesh opening through the at least one cut-away portion, or the two cross openings formed in each of the plurality of conductive patterns are connected to each other through the at least one cut-away portion.

21. The electronic device of claim 1, wherein the display panel comprises:

a display element layer including a plurality of light emitting elements that correspond to the plurality of light emitting areas; and a thin film encapsulation layer disposed on the display element layer, and the input sensor disposed directly on the thin film encapsulation layer.

22. An electronic device, comprising:

a display panel that includes a plurality of light emitting areas; and an input sensor disposed on the display panel and that includes a mesh pattern, wherein the mesh pattern comprises:

first mesh lines that extend in a first direction;

second mesh lines that extend in a second direction crossing the first direction;

a conductive pattern connected to some of the first and second mesh lines, and wherein the conductive pattern comprises:

a first line extending in a third direction crossing the first and second direction; and a second line and a third line facing the first line in a fourth direction crossing the first to third directions, spaced apart from each other in the third direction, and each extending in the third direction wherein the first to third lines are disposed between two light emitting areas adjacent to each other in the third direction or the fourth direction among the plurality of light emitting areas, when viewed in a plan view.

23. The electronic device of claim 22, wherein one end of the first line is connected to any one of the first mesh lines, and the other end of the first line is connected to any one of the second mesh lines, one end of the second line and one end of the third line face each other, and the other end of the second line is connected to another one of the first mesh lines, and the other end of the third line is connected to another one of the second mesh lines.

24. The electronic device of claim 22, wherein the conductive pattern further comprising fourth and fifth lines spaced apart from the second and third lines with the first line interposed therebetween, and each of the fourth and fifth lines faces the first line in the fourth direction and extends in the third direction, and the fourth and fifth lines are spaced apart from each other in the third direction.

25. The electronic device of claim 22, wherein the conductive pattern further comprising a fourth line spaced apart from the second and third fines with the first line interposed therebetween, and the fourth line faces the first line in the Ritual direction and extends in the third direction.

26. The electronic device of claim 22, wherein the conductive pattern further comprising a fourth line spaced apart from the first line with the second and third lines interposed therebetween, and the fourth line faces the second and third lines in the fourth direction and extends in the third direction.

27. The electronic device of claim 22, wherein the mesh pattern further comprises a plurality of mesh openings formed therein, and the plurality of mesh openings overlap the plurality of the light emitting areas, respectively, and are spaced from each other in the first direction and the second direction.

28. The electronic device of claim 27, wherein the mesh pattern further comprises a cross opening formed in the conductive pattern, and a cut-away portion defining a separation space between the second line and the third line connects the cross opening with a mesh opening adjacent to the cross opening among the plurality of mesh openings.

29. The electronic device acclaim 27, wherein the conductive pattern is provided in plurality, and the plurality of the conductive patterns comprises:

first and second conductive patterns spaced apart from each other in the third direction wherein a center opening of the plurality of mesh openings is disposed therebetween; and third and fourth conductive patterns spaced apart from each other in the fourth direction wherein the center opening is disposed therebetween.

30. The electronic device of claim 29, wherein the first mesh lines connect the first conductive pattern to the third conductive pattern or connect the second conductive pattern to the fourth conductive pattern, and the second mesh lines connect the first conductive pattern to the fourth conductive pattern or connect the second conductive pattern to the third conductive pattern.

* * * * *